United States Patent [19]

Tomlinson et al.

[11] 4,034,191
[45] July 5, 1977

[54] SPECTROMETER MEANS EMPLOYING LINEAR SYNTHESIZED RF EXCITATION

[75] Inventors: Barrett L. Tomlinson, Palo Alto; Howard D. W. Hill, Cupertino, both of Calif.

[73] Assignee: Varian Associates, Inc. Palo Alto, Calif.

[22] Filed: June 19, 1975

[21] Appl. No.: 588,264

Related U.S. Application Data

[63] Continuation-in-part of Ser. No. 494,802, Aug. 5, 1974, abandoned, which is a continuation-in-part of Ser. No. 350,457, April 12, 1973, abandoned.

[52] U.S. Cl. .................... 235/151.3; 324/0.5 A; 324/0.5 AC
[51] Int. Cl.² ................ G01N 27/78; G01R 33/08
[58] Field of Search ............ 235/151, 151.3; 444/1; 324/0.5 A, 0.5 AC, 77 B; 356/77, 98

[56] References Cited

UNITED STATES PATENTS

| 3,475,680 | 10/1969 | Anderson et al. | 324/0.5 A |
| 3,581,191 | 5/1971 | Anderson | 324/0.5 AC |
| 3,609,317 | 9/1971 | Siebert, Jr. | 235/151.3 |
| 3,674,998 | 7/1972 | Benz | 235/151.3 |
| 3,681,680 | 8/1972 | Ernst | 324/0.5 A |
| 3,720,816 | 3/1973 | Keller et al. | 235/151.3 |
| 3,786,341 | 1/1974 | Anderson et al. | 324/0.5 AC |
| 3,795,856 | 3/1974 | Keller | 324/0.5 A X |

Primary Examiner—Jerry Smith
Attorney, Agent, or Firm—Stanley Z. Cole; Gerald M. Fisher

[57] ABSTRACT

Broadband RF excitation for a Fourier transform spectrometer is obtained by synthesizing the time domain excitation from the desired frequency spectrum of RF excitation. Means are provided to Fourier transform the desired spectral data from the frequency domain into the time domain to obtain a modulation output for modulating an RF carrier signal to generate the desired sideband of RF excitation. In a preferred embodiment, the desired frequency domain data, as tabled in the computer, has a pseudorandom phase shift added to each component for scrambling the phases of the RF excitation. The excited RF resonance signals in the time domain are detected, time-averaged, Fourier transformed to the frequency domain and, in the case of phase scrambling, unscrambled by the pseudorandom phase angle sequence, and displayed.

26 Claims, 18 Drawing Figures

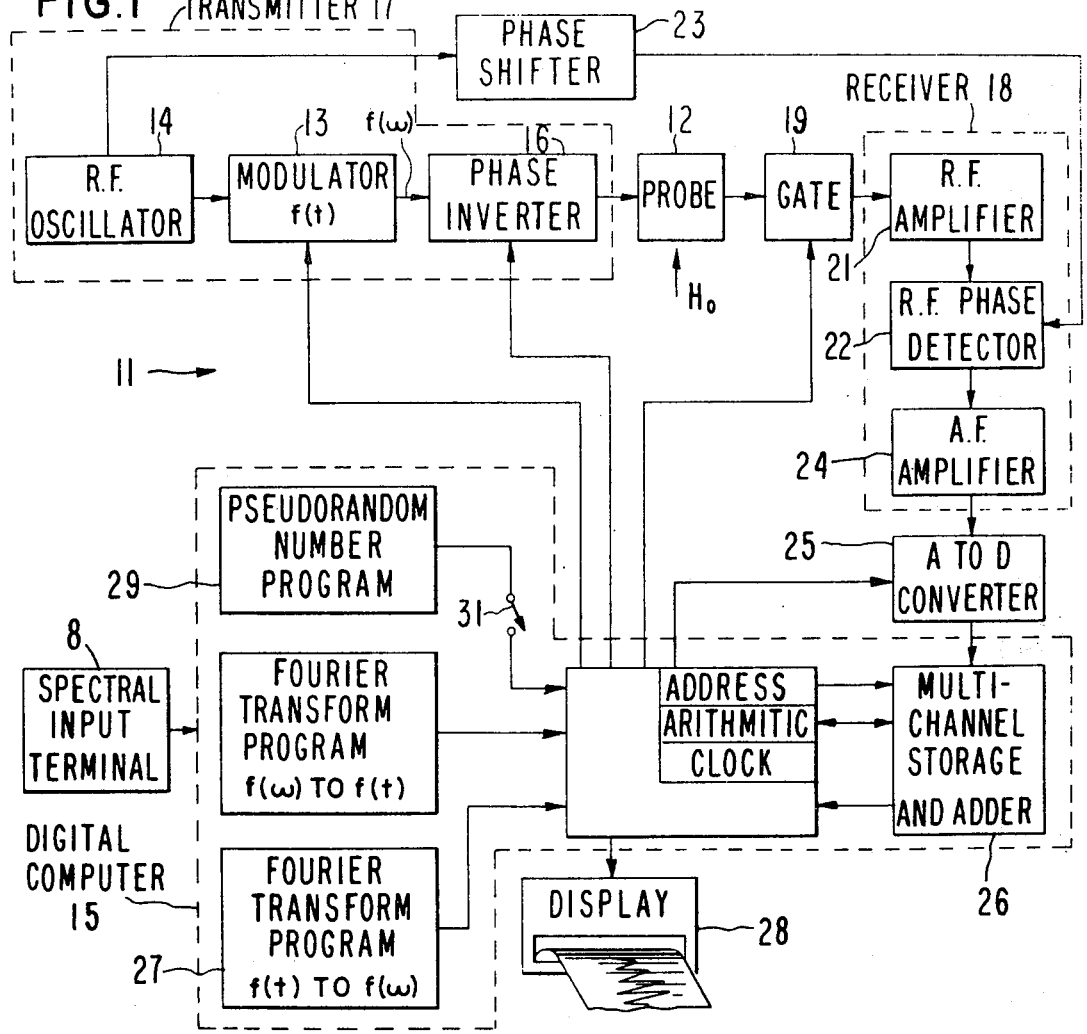
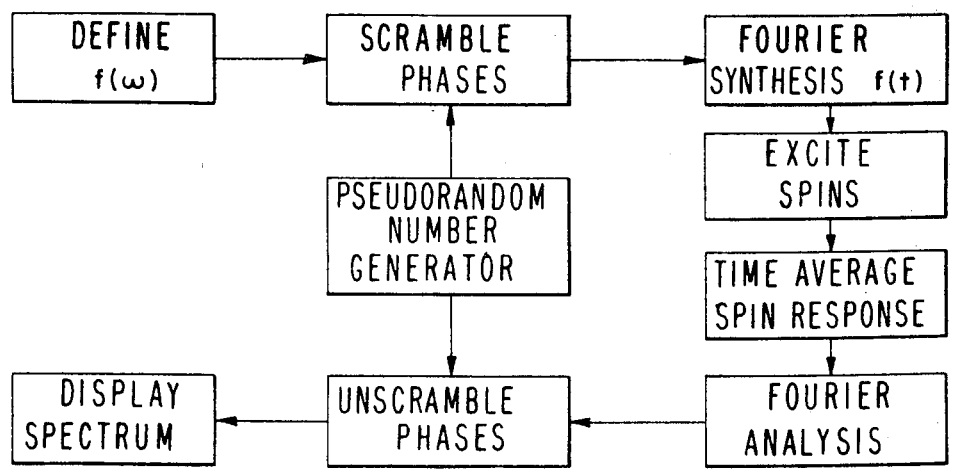

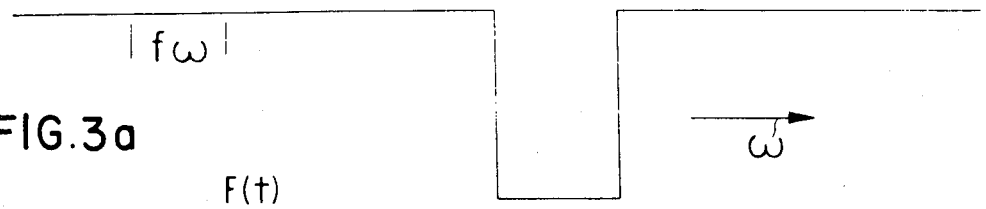
FIG.3a
FIG.3b  F(t) INCOHERENT PHASE
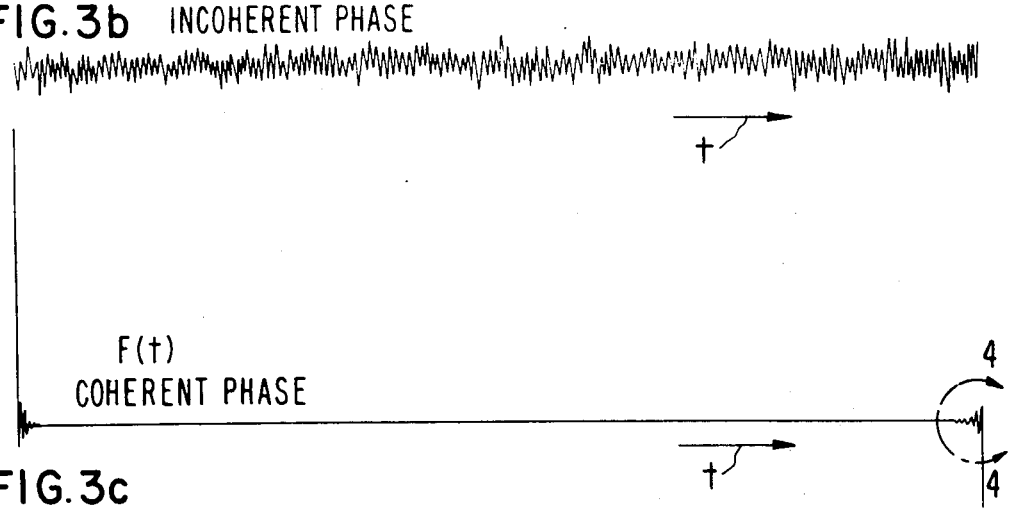
F(t) COHERENT PHASE
FIG.3c
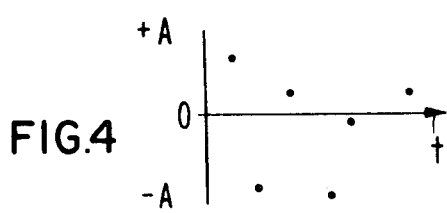
FIG.4
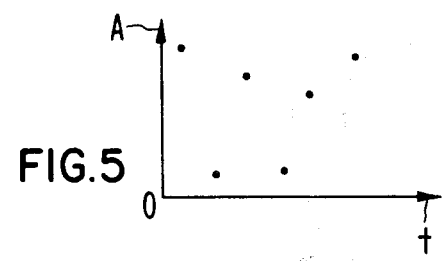
FIG.5
FIG.6a
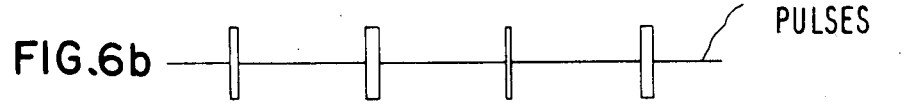
FIG.6b
TRANSMITTER PULSES
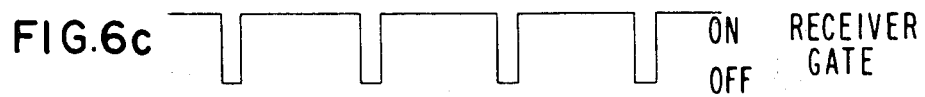
FIG.6c  ON OFF  RECEIVER GATE
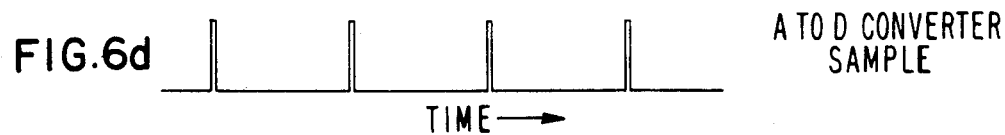
FIG.6d  A TO D CONVERTER SAMPLE
TIME →

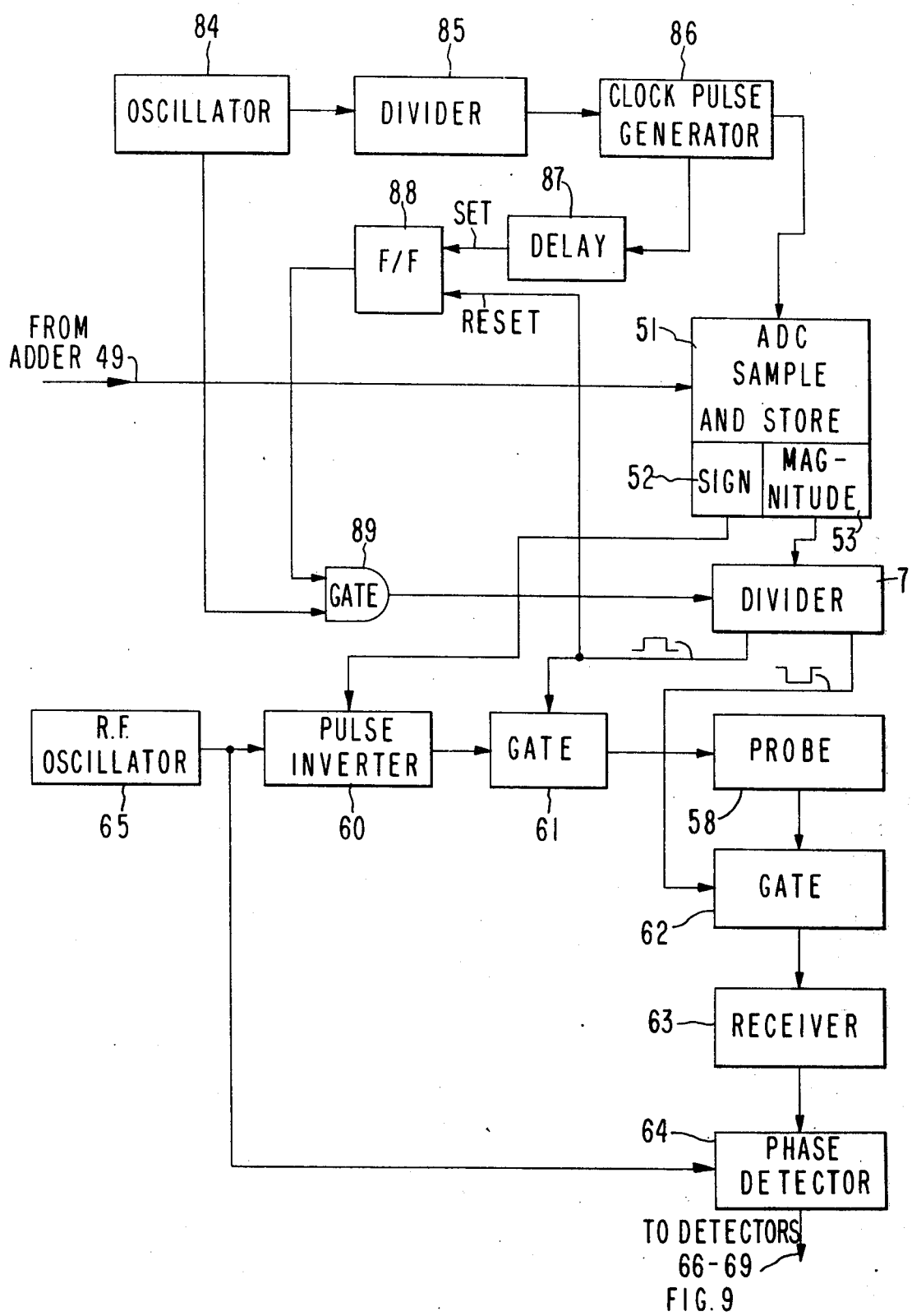

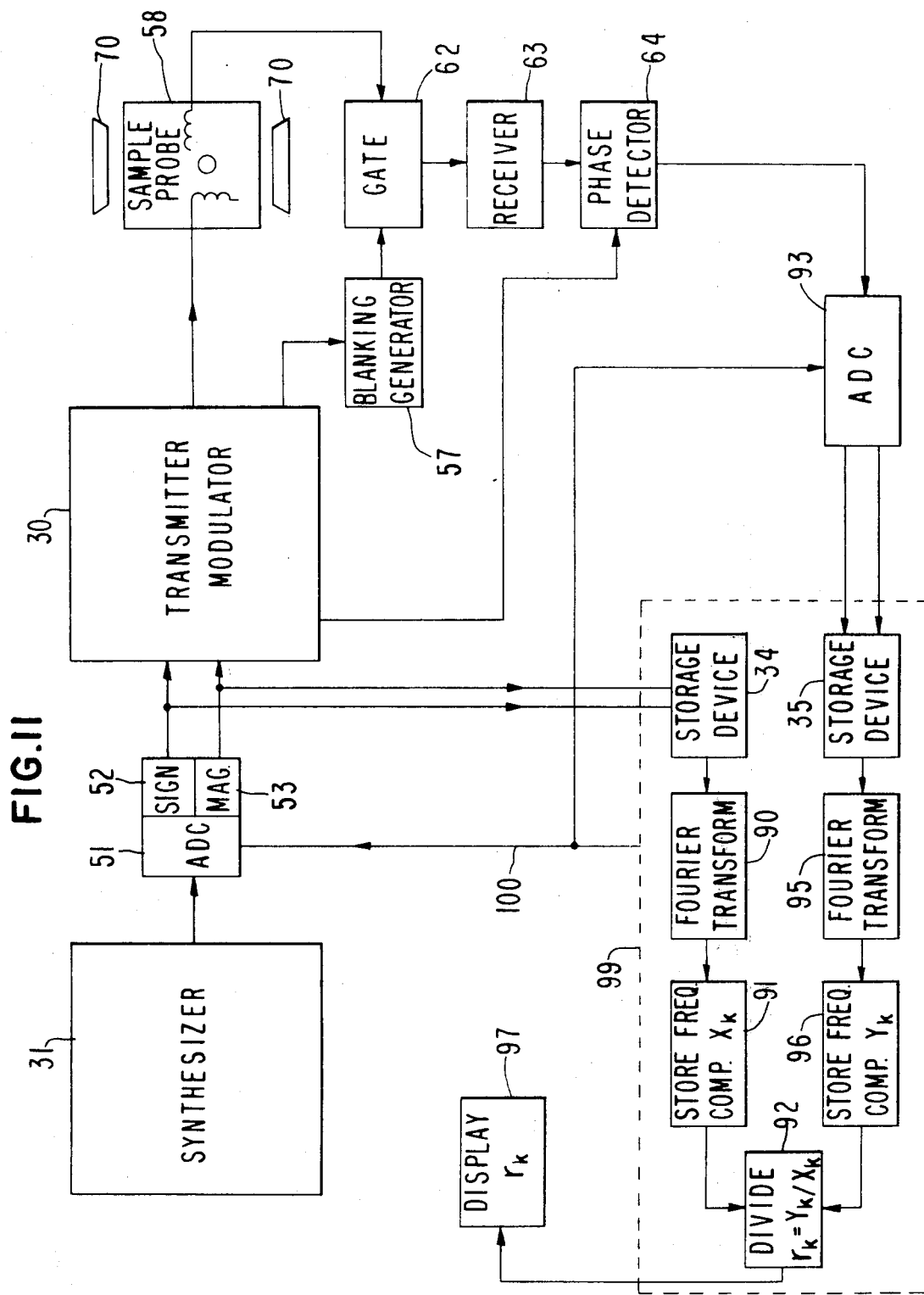

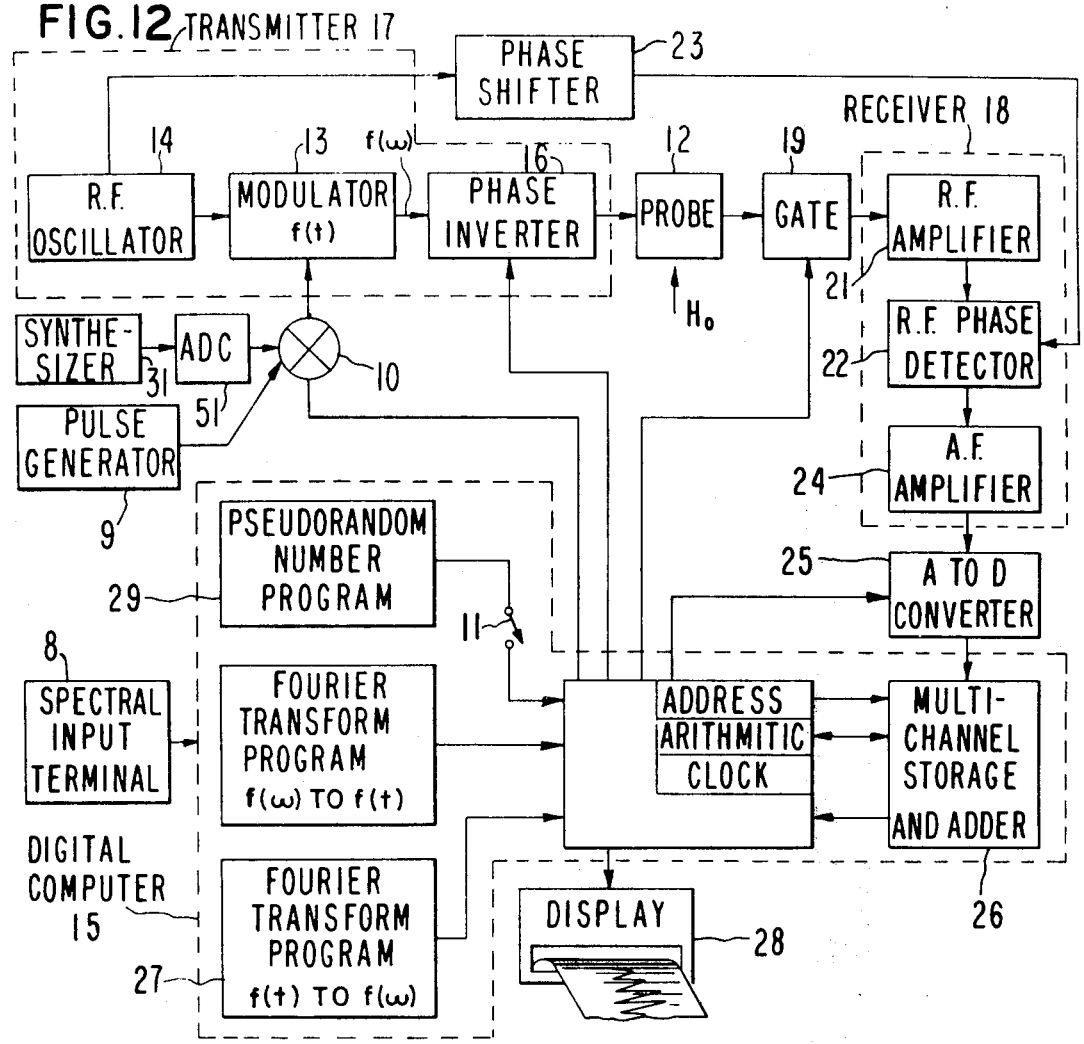

SPECTROMETER MEANS EMPLOYING LINEAR SYNTHESIZED RF EXCITATION

RELATED CASES

The present case is a continuation-in-part application of copending U.S. Pat. Ser. No. 494,802, filed Aug. 5, 1974 which application is a continuation-in-part of application Ser. No. 350,457 filed Apr. 12, 1973 now both abandoned.

BACKGROUND OF THE INVENTION

The present invention relates in general to spectrometers employing broadband RF excitation and more particularly to an improved method and apparatus for generating the broadband RF excitation by use of linear synthesis.

DESCRIPTION OF THE PRIOR ART

Heretofore, broadband RF excitation has been employed for exciting RF resonance of a plurality of spectral lines simultaneously. The simultaneously excited resonance spectral lines are detected to produce a composite resonance signal. The composite resonance signal is sampled at time displaced intervals in the time domain, converted to digital data, stored in a multichannel storage or memory and time-averaged to improve signal-to-noise ratio. The time-averaged data is read out of the storage, Fourier transformed from the time domain to the frequency domain to reconstitute a resonance spectrum of the sample under analysis. The reconstituted resonance spectrum is then displayed. Such a radio frequency spectrometer is disclosed and claimed in U.S. Pat. No. 3,475,680 issued Oct. 28, 1969.

The broadband (i.e., about 1000 Hz at 100 MHz) RF excitation has been obtained in a number of ways. In a first method, an RF carrier is pulse modulated with relatively short pulses, i.e., about 100μs, at relatively low pulse repetition rates as of 1 Hz to produce phase coherent Fourier components in the sidebands of the carrier at 1 Hz spacings over a bandwidth, as of 1000 Hz, on opposite sides of the carrier.

It is also known that the peak power requirements of the transmitter used to generate the RF excitation can be greatly reduced by modulating the phase or pulse amplitude of the carrier or of the field modulation in accordance with a pseudorandom sequence. Such spectrometers are disclosed and claimed in U.S. Pat. Nos. 3,588,678 issued June 28, 1971, 3,581,191 issued May 25, 1971 and 3,681,680 issued Aug. 1, 1972.

Phase correlation of the detected resonance, as excited by a pseudorandom noise generator, has been achieved by synchronizing the pseudorandom sequence with the time displaced sampling points of the composite resonance signals. Such a spectrometer is disclosed and claimed in U.S. Pat. Nos. 3,581,191 issued May 25, 1971 and 3,681,680 issued Aug. 1, 1972.

It is also known from the prior art that broadband RF excitation for a Fourier transform spectrometer is obtainable by pulsing an RF carrier between two values to produce a train of pulses of variable phase, pulse width, or pulse spacing of the successive pulses in accordance with a pseudorandom sequence to generate a wideband RF excitation. In this system the RF receiver of the resonance detector is sequenced with the transmitter pulses to obtain time sharing such that the receiver is decoupled from the transmitter. Such a spectrometer is disclosed and claimed in copending U.S. Pat. application Ser. No. 300,929 now U.S. Pat. No. 3,786,341, filed Oct. 26, 1972 and assigned to the same assignee as that of the present invention.

A problem with the prior art Fourier transform spectrometers is the increased expense derived from the fact that certain of the associated hardware such as, pseudorandom generators, modulators, spin decoupling transmitters have been relatively complex and inflexible for performing certain different kinds of resonance experiments thereby requiring a very large investment in apparatus to obtain broad experimental capability. In addition the power spectrum of the wideband RF excitation has followed the $(\sin X/X)^2$ law such that the power density of the excitation has tended to fall off with frequency deviation from the carrier frequency resulting in complicated instrumental equipment or data processing to correct for this effect.

SUMMARY OF THE PRESENT INVENTION

An object of this invention is to provide improved method and means for rapid qualitative and quantative analysis of atoms by measuring the precessional frequency of the nuclei of atoms in a prescribed magnetic field. A principal object of the present invention is the provision of an improved Fourier transform nuclear resonance spectrometer.

A further object of the present invention is to provide desired broadband RF excitation for the spectrometer in a more flexible and less expensive manner by providing a computer to Fourier synthesize a selected excitation frequency spectrum into a modulation output in the time domain which when employed to modulate an RF carrier produces the desired RF excitation as a sideband of the modulated carrier signal.

In one feature of the present invention, a pseudorandom phase shift component is added into each of the Fourier frequency components of the desired broadband excitation, or programmed into a digital computer and the programmed randomly phase-shifted components are Fourier transformed by the Fourier synthesis program of the computer to derive the modulation output, whereby the phases of the simultaneously excited resonance spectral lines are scrambled, thereby eliminating the requirement of a separate pseudorandom sequence generator.

In another feature of the present invention, an offset value is introduced into the Fourier synthesis program for synthesizing the computer derived modulation to be applied to the RF carrier to generate the broadband RF excitation, whereby the phase of the modulated RF carrier remains of one sign.

In another feature of the present invention, either the pulse height or pulse width of the pulse modulated RF carrier is varied in accordance with the modulation output of the digital computer to generate the wideband RF excitation for the spectrometer.

In another feature of the present invention, the modulation output of the digital computer used to modulate the RF carrier to generate the wideband RF excitation comprises a complex function of time having both real and imaginary parts, whereby the sideband spectrum is separately controllable on both sides of the modulated carrier frequency.

In another feature of the present invention, the modulation output of the digital computer used to modulate the RF carrier to generate the wideband RF excitation comprises first and second modulation components, one component for generating a sideband spectrum for exciting resonance of only a selected portion of the spectrum of the sample under analysis and the second modulation component for generating a sideband spectrum for exciting resonance of another portion of the spectrum of the sample under analysis, whereby among other advantages detected resonance of strong spectral lines may be suppressed.

In another feature of the present invention, the wideband RF excitation consists of two parts, one derived by Fourier synthesis in a digital computer and one derived from a separate time varying function with a known and desirable frequency spectrum.

Other features and advantages of the present invention will become apparent upon a perusal of the following specification taken in connection with the accompanying drawings wherein:

BRIEF DESCRIPTION OF THE DRAWINGS

FIG. 1 is a schematic block diagram of a gyromagnetic resonance spectrometer incorporating features of the present invention, FIG. 2 is a functional block diagram of the spectrometer of FIG. 1, FIG. 3 is a plot of the resonance excitation functions in the frequency and time domain.

FIG. 4 is an enlarged detail view of a portion of that excitation function of FIG. 3(c) delineated by line 4—4, FIG. 5 is a view similar to that of FIG. 4 showing an alternative form of excitation, FIG. 6 is a plot of certain waveforms used in the spectrometer of FIG. 1.

FIG. 10 is a functional block diagram of the apparatus to convert the pulse amplitude modulation of FIG. 9 to a pulse width modulation synthesizer, FIG. 11 is a block diagram of the system of FIG. 9 using a digital computer for performing a Fourier transformation and unscrambling, and FIG. 12 is an alternative embodiment of the invention shown in FIG. 1.

DESCRIPTION OF THE PREFERRED EMBODIMENTS

Figure 7A:
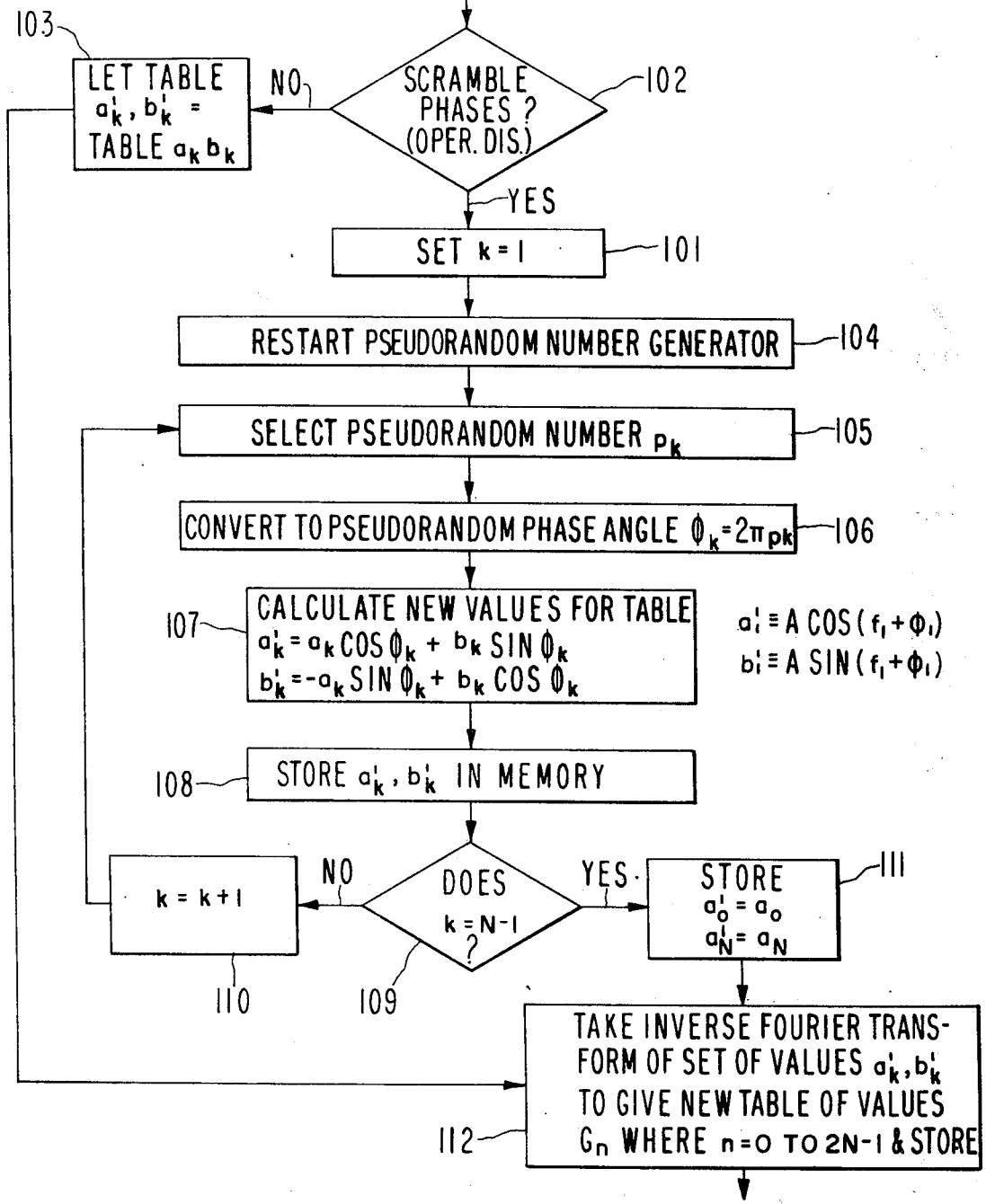
FIG. 7A and FIG. 7B are flow charts of the synthesizing and excitation steps.

Referring now to FIG. 1, there is shown a Fourier transform gyromagnetic resonance spectrometer 11 incorporating features of the present invention. The spectrometer 11 includes a probe 12 for containing a sample of matter to be analyzed and for immersing the sample in a homogeneous polarizing magnetic field $H_0$. The probe 12 contains a conventional RF coil structure for applying an RF magnetic field to the sample with the RF magnetic field vector being applied with a substantial component thereof at right angles to the direction of the polarizing magnetic field vector $H_0$ for exciting gyromagnetic resonance of the sample under analysis.

The RF energy for the coil structure and resonance of the sample is derived by modulating in modulator 13 an RF carrier signal supplied from RF oscillator 14 with a time-varying modulation function $f(t)$ derived from a computer 15, such as a model 620 $f$ digital computer commercially available from Varian Associates of Palo Alto, Cal. Modulation of the RF carrier produces sidebands on the carrier. The modulation function $f(t)$ is chosen such that the sideband energy has the desired power spectral density for exciting resonance of a plurality of spectral lines of the sample simultaneously. Although the desired power spectral density can vary greatly depending upon the sample to be investigated and the particular desired mode of operation of the spectrometer, a typical example of one type of power spectrum for the resonance exciting energy is as shown by spectral waveform (a) of FIG. 3.

More particularly, in waveform 3(a) the desired RF exciting spectrum is generally of uniform spectral density over a relatively wide bandwidth as of 1000 Hz on one side of a carrier frequency, as of 60 to 100 MHz, except for a relatively narrow portion of the spectrum over which excitation of resonance is undesired. This narrow portion of the spectrum may contain an especially intense spectral line of the sample, such as a solvent line resonance of which it is desired to suppress.

Accordingly, data is fed into the computer in the form of a Table which tells the computer the amplitude of the real and imaginary component of each frequency of a selected excitation frequency spectrum. For example, the computer 15 is provided with the desired resonance exciting spectrum in the frequency domain, i.e., waveform 3(a), by setting up a Table I, as shown below, consisting of 2N points where N is the number of discrete frequencies in the exciting spectrum. The data may be entered into a spectral input terminal 8 or edited in Table I by being read from a digital input terminal such as a card reader, a Teletype, or a typewriter, or from an analog input device such as devices employing a cathode ray tube light pen combination, a tablet, or joystick; examples of such devices are commercially available from IMLAC Corporation of Waltham, Mass., or the data in Table I may be computed or edited automatically from the data already stored in the computer.

Assuming N is 1024, Table I will contain 2048 rows, two for each frequency component of the 1024 bandwidth (except for $k=0$ and $k=N$) representing two orthogonal components of the vector for each frequency component. One row of each pair is for a digital value corresponding to $[A_k \cos f_k]$ and the other is for a digital value corresponding to $[A_k \sin f_k]$ where $A_k$ represents the amplitude to the frequency component and $f_k$ its phase value at $t=0$.

| N | TABLE I<br>AMPLITUDE OF<br>COS/SIN(f) | TABLE III<br>AMPLITUDE OF<br>COS/SIN(f) |
|---|---|---|
| 0 | $A_0 \cos(f_0)$ | $A_0 \cos(F_0)$ |
| 1 | $A_{1024} \cos(f_{N_{1024}})$ | $A_{1024} \cos(f_{1024})$ |
| 2 | $A_1 \cos(f_1)$ | $A_1 \cos(f_1+\phi_1)$ |
| 3 | $A_1 \sin(f_1)$ | $A_1 \sin(f_1+\phi_1)$ |
| 4 | $A_2 \cos(f_2)$ | $A_2 \cos(f_2+\phi_2)$ |
| 5 | $A_2 \sin(f_2)$ | $A_2 \sin(f_2+\phi_2)$ |
| 6 | . | . |
| . | . | . |
| 1100 | $0 \cos(f_{550})$ | $0 \cos(f_{550}+\phi_{550})$ |
| 1101 | $0 \sin(f_{550})$ | $0 \sin(f_{550}+\phi_{550})$ |
| 1102 | $0 \cos(f_{551})$ | . |
| 1103 | $0 \sin(f_{551})$ | . |
| 1104 | $0 \cos(f_{552})$ | $0 \cos(f_{552}+\phi_{552})$ |
| 1105 | $0 \sin(f_{552})$ | $0 \sin(f_{552}+\phi_{552})$ |
| 1106 | $A_{553} \cos(f_{553})$ | $A_{553} \cos(f_{553}+\phi_{553})$ |
| 1107 | $A_{553} \sin(f_{553})$ | $A_{553} \sin(f_{553}+\phi_{553})$ |
| . | . | . |

-continued

| | TABLE I | TABLE III |
|---|---|---|
| N | AMPLITUDE OF COS/SIN(f) | AMPLITUDE OF COS/SIN(f) |
| ⋮ | ⋮ | ⋮ |
| 2046 | $A_{1023} \cos (f_{1023})$ | $A_{1023} \cos (f_{1023}+\phi_{1023})$ |
| 2047 | $A_{1023} \sin (f_{1023}+\phi_{1023})$ | |
| $A_{1023}$ Sin $(f_{1023})$ | | |

For the example of FIG. 3 (a), the amplitude of the cosine and sine values for that portion of the spectrum which is to have zero amplitude are assigned a value of zero in Table I, see the cos and sin values for N = 1100 to 1107 while all other values $A_k$ are equal.

For coherent phase, wideband excitation, all values $f_k$ are selected to be equal and the tabled data from Table I is Fourier transformed by the computer to the time domain by means of a conventional discrete Fourier transform program using, for example, the algorithms appearing in Communications of the Association for Computing Machinery, Vol. 11, No. 10, of October 1968, pages 703 and following, see in particular equations 1-7. This Fourier transformation results in obtaining N pairs of outputs, such transformation values G(t) being tabled in the computer, such as Table II below, where $G(t)_n$ represents the amplitude of the excitation function in the time domain at the time $t_n$.

TABLE II $$\left( \Delta t = t_n - t_{n-1} = \frac{1}{2\nu_N} \right)$$

| TIME | G(t) |
|---|---|
| $t_0$ | $G_0$ |
| $t_1$ | $G_1$ |
| $t_2$ | $G_2$ |
| ⋮ | ⋮ |
| $t_n = t_0 + n \Delta t$ | $G_n$ |

The values of G(t) are read out of Table II with the time spacing as indicated in the time column to derive a modulation output function F(t) in the time domain which when employed to modulate the carrier signal in modulator 13 results in producing the desired sideband power density spectrum as previously programmed into Table I. A typical modulation output function F(t) to produce the power density spectrum of FIG. 3(a) is shown by the waveform of FIG. 3(c), and is essentially a pulse of short duration at relatively long time spacing plus some fine structure to achieve the net lack of excitation near the center of the power density spectrum.

In a preferred mode of operation, the modulator 13 pulse modulates the carrier signal with a train of pulses with a repetition rate of 1/500 μs (pulse spacing of 500 μs) and a pulse width of approximately 1/10 the pulse spacing or about 50 μs. The pulse height or pulse width is modulated in accordance with the modulation output G(t) of Table II, as shown by waveforms 6(a) and 6(b), respectively.

Since the values of G(t) from Table II can have both positive and negative sign, a gated phase inverter 16 is provided at the output of modulator 13 for changing the sign, reversing the phase of the modulated carrier energy fed to the probe 12 in accordance with the sign of the modulation component G(t) read out of Table II.

Cross coupling of RF energy from the transmitter 17 to a receiver portion 18 of the spectrometer 11, other than through the desired resonance of the sample, is avoided by providing a gate 19 between the probe 12 and RF amplifier 21 employed to amplify RF resonance signals picked up by the conventional receiver coil in the probe 12. The gate 19 is synchronized by the computer 15 with the timing of the transmitter pulses to provide time sharing as indicated by receiver gate waveform 6(c) and the corresponding transmitter pulse waveform of FIGS. 6(a) or 6(b).

The output of the RF amplifier is fed to one input of an RF phase detector 22 for phase detection against a reference phase signal derived via phase shifter 23 from the RF oscillator 14. The output of the phase detector is an audio frequency composite resonance signal consisting of the simultaneously excited resonance spectral line signals emanating from the sample under analysis. The composite audio frequency resonance signal is amplified in audio amplifier 24 and thence fed to an analog-to-digital converter 25 which samples (FIG. 6d) the composite resonance signal once for each transmitter pulse near the end of the period during which the receiver is gated on, see FIG. 6(c). The composite resonance signal is sampled near the end of the receiver on time in order that undesired transient signals associated with the receiver being gated on and off have died out. In an alternate embodiment, not shown, the modulator 13 may also be responsive to the modulation output G(t) to modulate the phase of the RF excitation.

The digitized samples from the output of the A to D converter 25 are stored in successive channels of a multichannel storage and adder portion 26 memory of the computer 15 for time averaging the composite resonance signal. The sampling sequence is synchronized with the readout times $t_0-t_n$ of the modulation output of the computer 15 as used to generate the windband RF excitation f(ν). The sampling sequence repeats with each repeat of the modulation output sequence F(t).

The time-averaged resonance data is then read out of the storage 26 and Fourier transformed via the computer 15 as programmed by a conventional Fourier transform program 27 for transforming data in the time domain f(t) into the frequency domain f(ν) to obtain a resonance spectrum of the sample under analysis. The time-averaged resonance spectrum of the sample is then fed to a display for display to the operator and/or for recording. Pure absorption mode, pure dispersion mode, or combinations of absorption and dispersion mode resonance spectral data can be obtained after correction for instrumental effects by reading out the cosine terms of the Fourier transformed data, sine terms of the Fourier transformed data or by reading out combinations of cosine and sine data. The Fourier transformed data is tabled by the computer in a table similar to that of Table I.

One disadvantage to the coherent phase wideband excitation as exemplified by waveform of FIG. 3(c) is that narrow pulses of carrier energy require a relatively high intensity although the RF excitation is a relatively low average spectral power density. This also introduces a dynamic range problem in view of limited storage and modulator precision. Accordingly, in a preferred embodiment, the phases of the desired RF wideband excitation are scrambled in accordance with a pseudorandom sequence. This is achieved by adding a phase shift value pseudorandomly selected between 0 and $2\pi$ onto each of the cosine and sine values of Table I. In a preferred embodiment the pseudorandom number sequence is provided by a suitable pseudorandom number sequence program 29 which is fed into the computer 15 via switch 31. Such a suitable pseudorandom number sequence program is to be found in an article published in Mathematics of Computations, Vol. 19, page 201, 1965 and in the same journal, Vol. 16, page 368, 1962. The program 29 takes the desired frequency domain spectrum table similar to that of Table I and performs the pseudorandom phase addition to generate a modified table as shown in Table III adjacent Table I above. This is accomplished by taking the values of $\cos f_k$ and $\sin f_k$ components for a given Fourier frequency component and performing the vector multiplication as follows $A_k \cdot \exp(if_k) \cdot \exp(i\phi_k)$, where $\phi_k$ is the pseudorandom phase shift value of phase angle. The resultant cosine and sine terms are tabled in Table III. The sequence of values tabled in Table III is then Fourier transformed to Table II and read out as previously described to generate the modulation output function $G(t)$ employed for generating the sideband RF excitation. The waveform of FIG. 3 (b) shows a typical modulation output for providing incoherent sideband RF excitation. Either pulse width, phase or pulse height of the pulsed RF oscillator or field modulation may be accomplished with $G(t)$.

FIG. 2 shows the functional block diagram for the spectrometer system 11 of FIG. 1 employing phase scrambled RF excitation. The time-averaged and Fourier transformed spectral data will be tabled by the computer 15 in a table similar to that of Table III. This data is unscrambled in phase by subtracting the pseudorandom sequence of phase angles previously added to the data of Table I to arrive at the original data of Table III. The result is a Table of time-averaged resonance spectral data similar to that of Table 1 which is read out as previously described to obtain pure absorption mode, pure dispersion mode or combinations of abosrption and dispersion mode resonance spectral data. If only a power spectrum of the sample is desired the Fourier transformed data need not be unscrambled as to phase and may be read out and displayed.

Figure 7B:
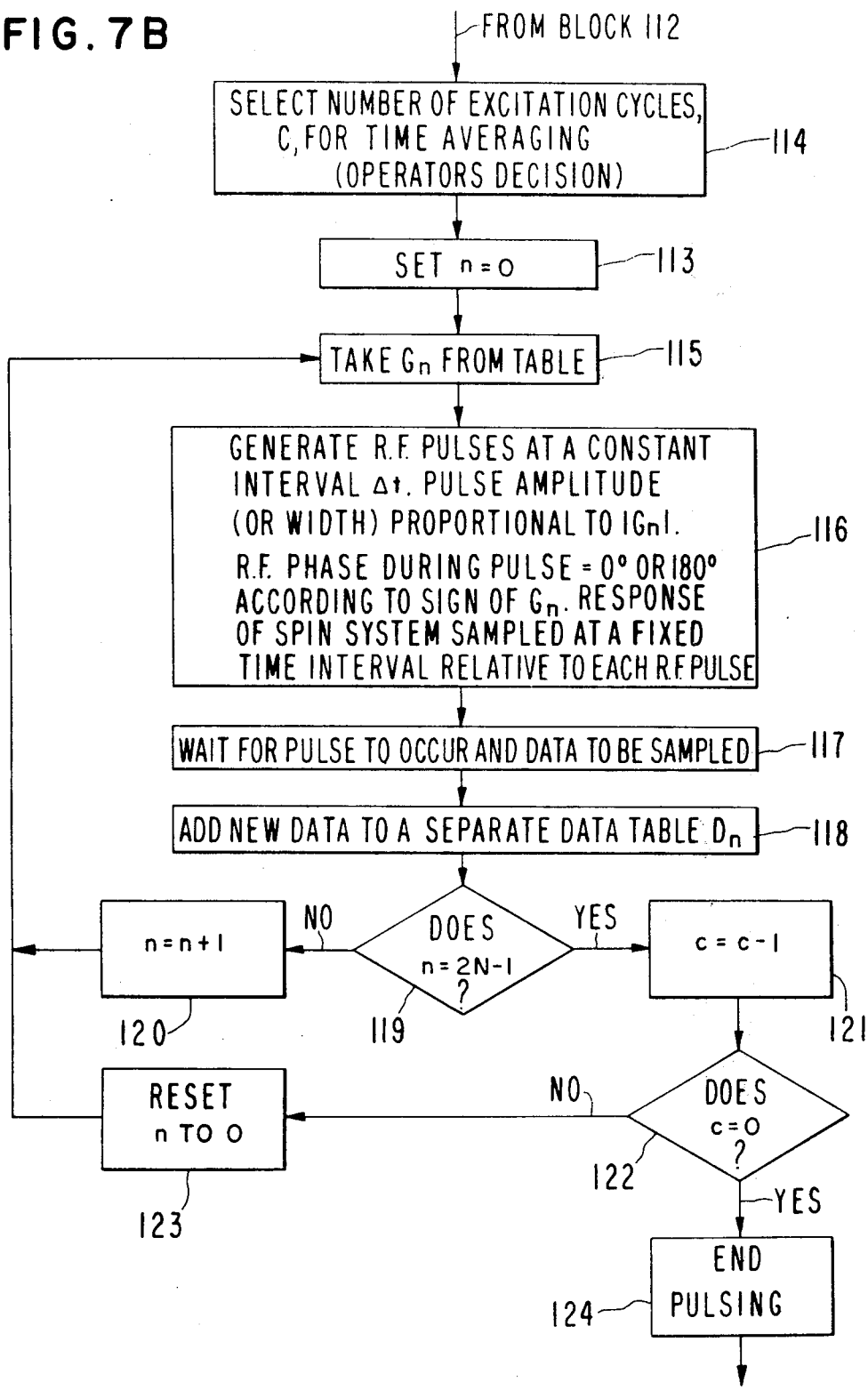

FIGS. 7A and 7B are the flow diagrams of an embodiment of the invention describing steps taken by the computer in converting the operator selected frequency domain excitation spectrum into a the desired time domain modulation, for controlling the modulation of RF excitation pulses in amplitude or width, and for sampling and storing the response of the sample spin system. The data table in block 100 is determined by the operator as described hereinbefore in reference to Table I and is entered into memory in any convenient manner. Two orthogonal values $a_k, b_k$ are defined for each of N+1 frequencies except for $a_o$ and $a_n$ which are defined at zero phase angle, hence $b_o = 0$ and $b_n = 0$.

Assuming the operator has determined in block 102 to scramble pieces for power handling considerations, each orthogonal vector $a_k, b_k$ is rotated by a pseudorandomly determined phase angle $\phi_k$ and stored in a new table 107 as $a'_k, b'_k$. The scramble decision initiates block 101 selecting $a_1, b_1$ from block 100 table and causing a pseudorandom generator 104 to start, and to select a pseudorandom number $p_k$ (where $0 \leq P_k \leq 1$), block 105, which is converted to a phase angle block 106. In block 107 the vector $a_1 b_1$ is rotated by angle $\phi_1$ and the resultant $a_1', b_1'$ is stored in memory block 108. Next, the running index k is interrogated, block 109, and if it is shown to equal less than N-1, the next value $a_k, b_k$ is taken from the Table 100 by incrementing $k=k+1$, block 110, and repeating the cycle for each $k=1, 2 \ldots N-1$. When $k=N-1$, block 109, the storage of $a_o'=a_o$ and $a_N'=a_N$ takes place, block 111, and the inverse Fourier transform of the function represented by $a'_k, b'_k$ is taken and stored, block 112.

At this point, the data is now available for modulating the RF excitation appropriately. The decision as to the number of cycles C, block 114, is noted and the modulation process is commenced, block 113, by selecting the value $G_o$ from Table $G_n$, block 115, generating the RF pulse for $t_o$ responsive to $G_o$ either in amplitude, or width, and sampling the response, block 117, and storing the received data, block 118. At the time n is set to zero, block 113, the data table $D_n$, block 118, is set to all zeros. If less than 2N-1 pulses have been applied, block 119, n is incremented, block 120, and the next value $G_n$ is taken from the table to control the modulation of the next pulse and repeat the steps of blocks 116, 117, 118 and 119 until $n=2N-1$. When the value of n reaches 2N-1, a check on the number of cycles, C, is performed, blocks 121 and 122, to see if the number of cycles run equals the amount preselected by the operation, block 114. If C=0, the process, blocks 116, 117, 118 and 119 is repeated, block 123 until C=0 at which time pulsing is stopped, block 124.

Figure 8:
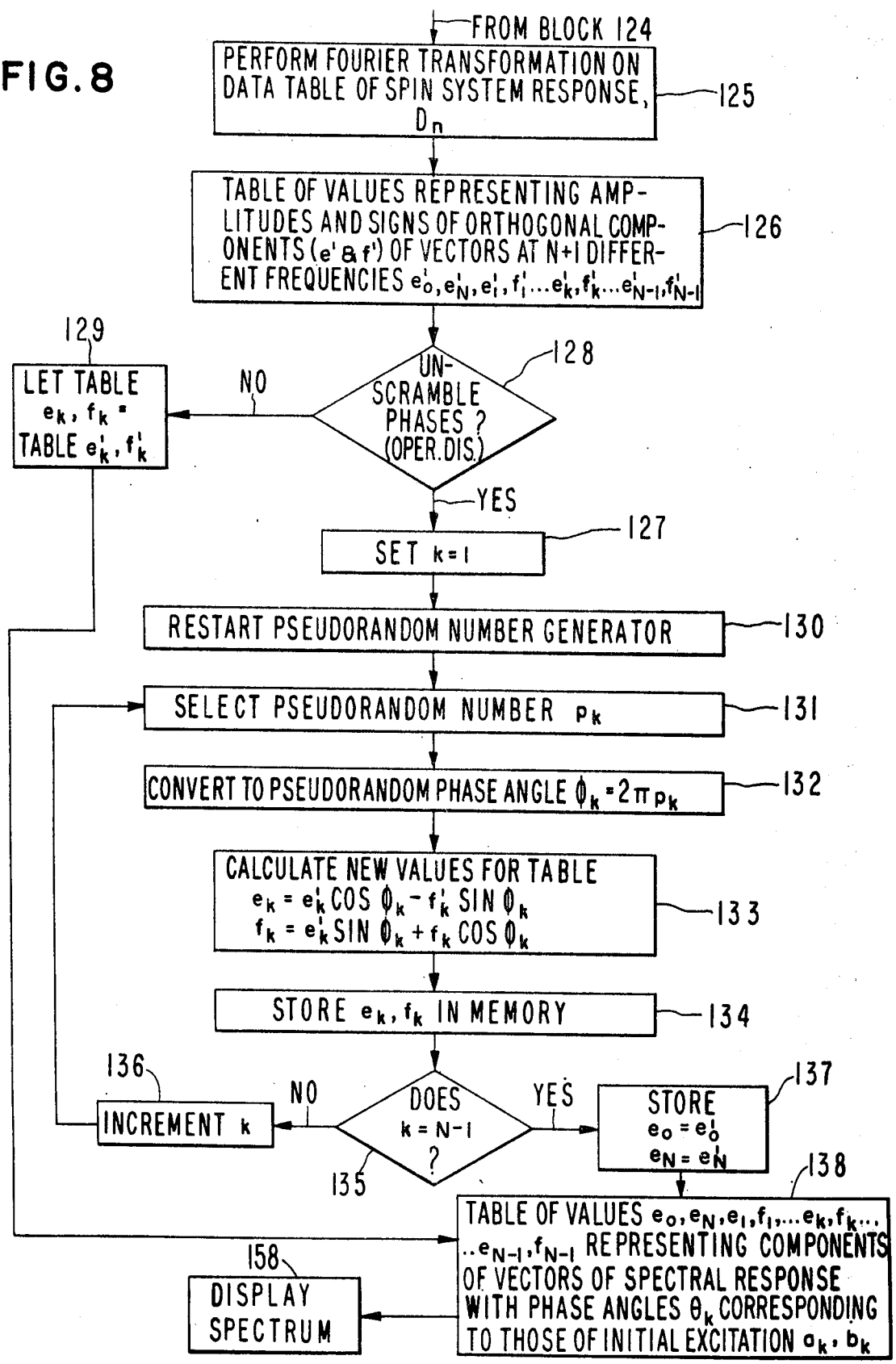
FIG. 8 is a flow chart of a spin system analysis step.

With reference to FIG. 8, the data $D_n$, Table 118, is Fourier transformed, block 125, and the orthogonal values $e'_k, f'_k$, N+1 different frequencies are calculated and stored, block 126. If the excitation was not scrambled, block 128, the Table block 126 is displayed, block 129, as the sample frequency spectrum. If the excitation was scrambled, block 128, the unscrambling process is commenced by rotating each vector $e'_k, f'_k$ through the same pseudorandom angle $\phi_k$ corresponding to that frequency as in block 107, but in the opposite sense, block 133. The unscrambled vectors $e_k, f_k$ are stored, block 134, and when all vectors have been counter-rotated, block 135, the $e_o$ and $e_N$ terms are stored, block 137, and the unscrambled spectrum is displayed, block 158.

Although the spectrometer 11 of FIG. 1 has thus far been described as employing a phase inverter 16 for inverting the phase of the modulated carrier in accordance with sign changes in the modulation output $G(t)$, this is not a requirement as an offset d.c. value of $G(t)$ can be introduced into $F(t)$, as shown in FIG. 5. Such a phase reversal of the modulated carrier signal is therefore not required. Accordingly in this embodiment, the phase inverter 16 can be eliminated. However, this offset in the d.c. value of $G(t)$ tends to increase the intensity of the carrier signal.

In the amplitude modulation system according to this invention, for uniform RF power excitation of a spin system gyromagnetic resonator it may be advantageous to increase the amplitude of the Fourier coefficients of the excitation function at higher frequencies to compensate for the reduction in effective power at the sample due to the finite width of the pulses being applied. In the prior art, using Amplitude modulated pulses of fixed width result in an amplitude of the frequency spectrum coefficients seen by a spin system being proportional to $(\sin \omega\tau)/\omega\tau$. Therefore, the frequency spectrum produced at the sample is the product in the frequency domain of the frequency spectrum $P_1$ of a single pulse and the synthesized excitation frequency spectrum $P_d$. By further shaping the synthesized excitation as a function whose frequency spectrum is proportional to ($\omega\tau$/sin $\omega\tau$), the effective frequency spectrum of the irradiation seen by the spins can be compensated for the effect of the pulse width and can be made flat over the observed bandwidth. This feature is useful for RF excitation of spectra spanning a wide frequency range.

Figure 9:
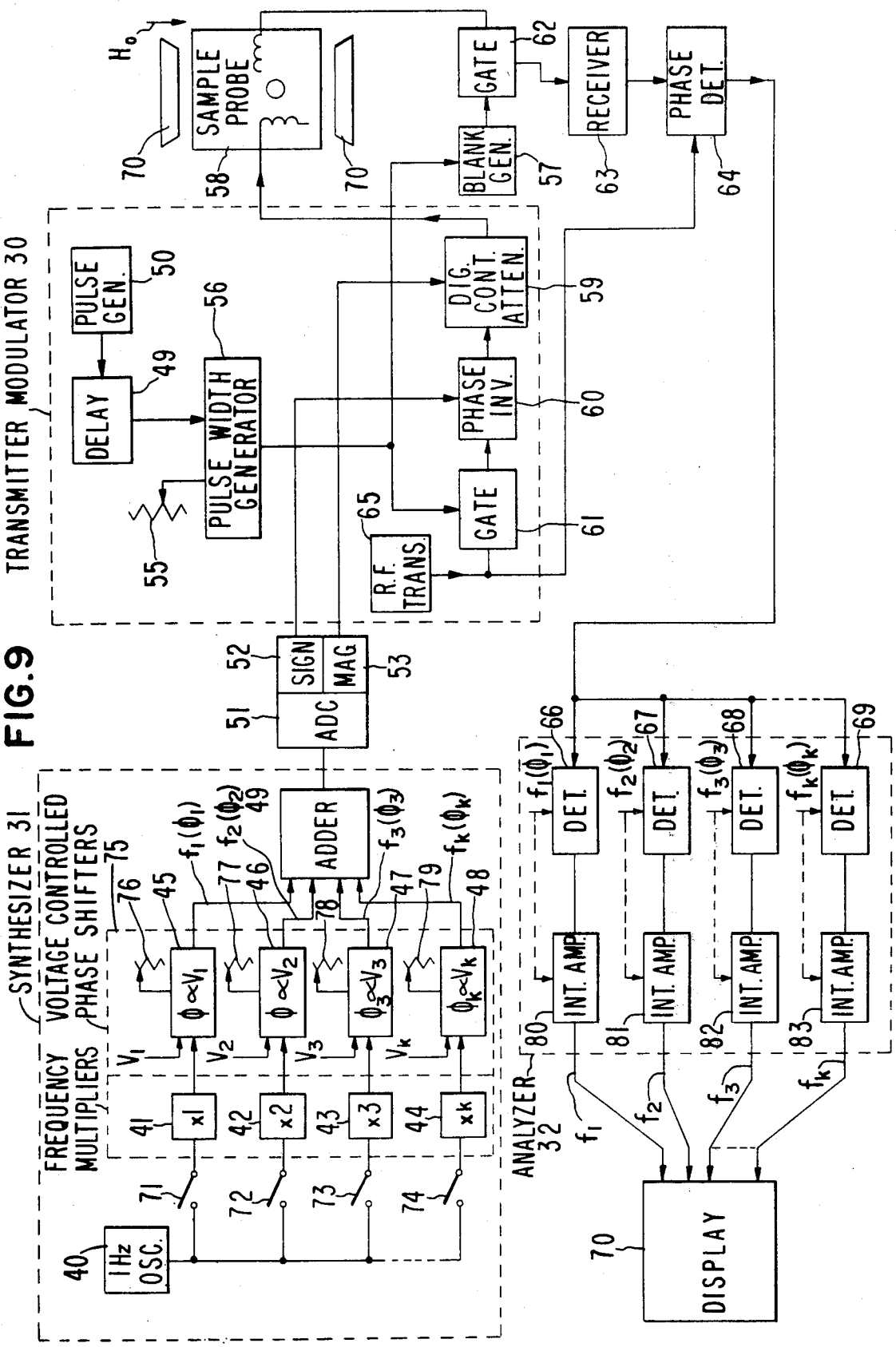
FIG. 9 is a block diagram of an analogue embodiment of the pulse amplitude modulation synthesizer and analogue Fourier transform analyzer according to this invention.

Referring now to FIG. 9, there is shown a nuclear resonance spectrometer wherein the advantages of the invention are accomplished by an embodiment utilizing analogue techniques as opposed to the digital computer technique of FIG. 1. After having selected the desired excitation spectrum for the sample i.e., the amplitude of each frequency component, in the frequency domain, the operator would energize the appropriate switches 71 through 74, to provide the basic oscillator 40 output to the appropriate multiplier 41 through 44. The outputs of the selected multipliers are each connected to a phase shifter, 75, wherein each channel has a corresponding voltage controlled phase shifter and a corresponding amplitude adjustment 76–79. In the example of FIG. 9 only four channels are shown $x1, x2, x3, xk$ but it is understood that any number of channels may be provided, one channel for each desired sideband. The phase shifters 45-48 are each provided with a voltage $V_k$ to control the phase shift angle. The voltage may be constant values for the experiment, which values are arbitrarily selected, or they may be derived from a pseudorandom number generator. For purposes of this explanation, it is assumed that they are constant. The outputs of the phase shifters of the operative channels are added together in mixer 49. The output of mixer 49 is a time domain signal synthesized from the individually selected amplitudes and frequencies selected by the operator. The phase inverter 60 and digitally controlled attenuator 59 are controlled by the ADC sample and storage 51 which samples the output of mixer 49 at fixed increments and stores a digital value representative of the polarity and magnitude of the adder 49 output at the instant of sampling. The clock 50 synchronizes the ADC 51 and through delay 54 the pulse generator 56. This permits the phase inverter 60 and attenuator 59 to set before the gate 61 is opened by the pulse from pulse generator 56. When gate 61 is opened, a pulse of RF from oscillator 65 at the carrier frequency as of 60 or 100 MHz is caused to excite the probe 58 in the phase and amplitude as controlled by the inverter 60 and attenuator 59, respectively. The sample probe 58 is located in the high value field $H_o$ of magnet 70 and induced into simultaneous resonance as determined by the sidebands generated in the carrier frequency by the amplitude modulation determined by synthesized time domain signal at the output of mixer 49. The resonance signal of the sample atoms in the probe 58 are received by gate 62 which is gated on by blanking generator 57 whenever the RF is exciting the sample. The output of gate 62 is amplified in receiver 63 and fed to a synchronous phase detector or mixer 64. The output of the detector 64 which has had the RF carrier frequency removed is now connected in parallel to a series of phase detectors 66–69 and integrating amplifiers 80–83. For example, the 1 Hz channel is fed to detector 66 which detects that portion of the output of detector 64 which has the frequency and phase $f_1(\phi_1)$. The output of phase detector 66 is then sent into integrator amplifier 80 where the gain is responsive to the amplitude of reference $f_1(\phi_1)$ and the output is sent to display 70. For example, assuming that it was desired to excite the 1 Hz sideband with a very small signal because it was known that the sample exhibits a large resonance at that frequency, the operator may have adjusted the attenuator 76 so that the $f_1(\phi_1)$ output of phase shifter 46 was very small.

Since the sample resonant signal of the sample would now exhibit a smaller resonance to 1 Hz than to another more strongly excited line, the gain of amplifier 80 could be inversely responsive to the reference $f_1(\phi_1)$ so that the 1 Hz would be returned to its appropriate amplitude for display as if it had been excited as strongly as the other lines. As was earlier explained with reference to Table I, it may be desirable that all excited lines are excited at a single excitation level and certain lines are not excited at all. In this case, all the attenuators 76–79 would be set to the same value, the switches for the non-excited channels 71–74 would be opened and the connection of the reference $f_k(\phi_k)$ to the integrator amplifiers 80–83 would be unnecessary since gain of each frequency would be treated equally.

With reference to FIG. 10, the schematic block diagram is disclosed of the control circuit to enable pulse width modulation of the RF responsive to the output of the adder 49 of FIG. 9. For each pulse from gate 89 to the divider 7, a pulse having a width determined by the magnitude of the digital signal in ADC 51 is sent from divider 7 to gate 61. The phase of the RF signal is responsive to the sign bit 52 of the ADC output. Operation of the modulator is initiated by oscillator 84 which is divided down in 85 converted to properly shaped pulses in clock pulse generator 86. Each output of clock pulse generator 86 initiates a sampling by the ADC 51 of the output of adder 49. An output of clock generator 86 also is delayed by 87 and sets the flip-flop 88 so that the next cycle of the oscillator initiates the transmission of the modulation pulse from divider 88 to gate 61. After each pulse from divider 7 the flip-flop 88 is reset so as to restart the process only upon the next pulse from clock pulse generator 86. The receipt and analysis of the signal from pulse 58 is the same as described in FIG. 9.

With reference to FIG. 11, a spectrometer having the synthesizer 31 and pulse amplitude or pulse width modulation apparatus and receiver circuitry 30 is disclosed in conjunction with a Fourier coefficient division scheme for analyzing the data received from detector 64. The outputs 53 and 52 of ADC 51 in addition to exciting the sample are connected to a digital computer 99 containing a standard Fourier transformation program as hereinbefore described wherein the frequency domain spectrum of both the synthesized excitation output of adder 49 and the sample output of phase detector 64 and ADC 93 are synchronously taken and stored upon computer command 100. The computer is further caused to divide the vector coefficients at each frequency of the sample response $y_k$ by the vector coefficient at the same frequency of the excitation $X_k$ and displaying the quotient. The division of the Fourier coefficients is the equivalent of a cross correlation in the time domain.

The use of pulse modulation apparatus as shown in FIGS. 1, 9–12 provides a convenient means to isolate the receiver from direct excitation by the transmitter. However, pulse modulation is not an essential feature of the invention. If isolation of transmitter and receiver can be achieved in an alternate fashion, for example by the use of transmitter and receiver coils which are sufficiently orthogonal, the synthesized excitation may be applied to a phase sensitive amplitude modulator or a phase modulator as a continuous signal directly from the synthesizer 31 without an intermediate ADC 51 or from the digital values in the table G(t) through a D to A converter and smoothing filter. Alternatively such continuous signals may be used to modulate the magnetic field $H_o$ such that the field modulation sidebands cause excitation of the nuclear resonance signals. With continuous excitation, the response of the spin system may also be detected as a continuous signal.

The aforedescribed technique of suppressing unwanted resonances by providing a hole in the exciting spectrum may also be applied to the prevention of aliasing. If the analog audio frequency output of the spectrometer is sampled at a frequency $\nu_s$, in accordance with well known sampling theory the maximum frequency which may be recovered unambiguously is half the sample frequency, $\nu_{max} = \nu_s/2$. Higher frequencies than $\nu_s/2$ are aliased or folded back into the frequency range 0 to $\nu_{max}$. Such aliased frequencies are normally attenuated by a low-pass filter before sampling but it is not possible to make an infinitely sharp cut-off filter, and large phase anomalies near the cut-off frequently make it inconvenient to place the cut-off frequency too close to the edge of the observed frequency range. However, an excitation function may be synthesized whose power spectrum is constant up to $\nu_{max}$ and zero from $\nu_{max}$ to $2\nu_{max}$. To double the irradiated frequency range, while keeping the sampling rate constant at $2\nu_{max}$ requires that the pulsing frequency of the transmitter be doubled to $4\nu_{max}$. In principle then, twice as much storage is required for the exciting function as for the signal. If, however, the excitation is synthesized in the form of a coherent phase power spectrum, the amplitudes decay fairly rapidly and much of the excitation may be approximated by zero for example, see FIG. 3. Alternatively, since the time function needed is of the form $(\sin \omega\tau)/\omega\tau$, it may be computed as required, eliminating the need to store an excitation function. By combining this technique with the use of the usual low-pass filter, very effective suppression of aliased frequencies is possible.

The excitation functions in the examples which have been described so far have all been real functions of time for modulation control of a carrier frequency resulting in a power spectrum which is symmetric about the carrier frequency. In general, the Fourier synthesis of a function of frequency results in a complex function of time. This time function may be represented both in phase and amplitude by a carrier frequency which is the vector sum of two components in quadrature, the amplitudes or pulse widths of which are modulated according to the real and imaginary components of the excitation function. Use of this type of modulation permits the suppression of aliasing about zero frequency, analogous to the suppression of aliasing of high frequencies previously discussed. More generally, this form of excitation can also be used to generate any desired power spectra which is asymmetric with respect to the carrier frequency. An algorithm for Fourier synthesis of a complex function of time is described in an aritcle titled "An Algorithm For Machine Calculation of Complex Fourier Series" appearing in Math. Comp., Vol. 19, p. 297 (April 1965).

For homonuclear decoupling the synthesized RF excitation technique enjoys several distinct advantages over conventional decouplers. For the incremental cost of enough information storage to hold the excitation sequence, one obtains the capability to do homonuclear decoupling as well as other experiments requiring shaped power spectra. Any number of decoupling frequencies up to the number of observed frequencies may be used, in any intensity ratio desired within the dynamic range of the modulation technique, and the conventional field frequency lock for the observing channel automatically locks the decoupling channel. Conventional prior art decouplers usually require a separate provision to lock the decoupler oscillator to the magnetic field, and can irradiate only one frequency or frequency band at a time. For heteronuclear decoupling, a separate decoupler based on the synthesized excitation technique offers much flexibility in constructing decoupling fields.

In a number of applications, the excitation function may be divided into two parts. For example, in a homonuclear decoupling experiment, one or more frequency components have large intensities for perturbing the spin system while a wideband of frequency components with low intensity are provided to observe the non-linear response of the spin system to the perturbation. In general, all nuclear spin systems are non-linear. While a good number of experiments consider these systems as linear, there are classes of experiments in which the non-linear response is very important. It is convenient to adjust the composite excitation by adjusting the amplitudes of these two parts independently. Such an addition of separate parts is indicated in FIG. 1 by the alternative embodiment in dashed lines shown by the adder 10 whose inputs are the output from the Fourier synthesized table G(t) in the computer and the output from an analog synthesizer 31 and ADC 51, or from a pulse generator 9. The wide band frequency components for observing the response of the spin system may be provided by pulses at a low repeition rate while the perturbing excitation is synthesized in the computer from the desired frequency components. This composite excitation may also be realized by adding an appropriate value to the first entry in the table G(t) following Fourier synthesis.

For suppressing unwanted lines, the aforedescribed synthesized excitation technique is conceptually equivalent to placing one or more ideal notch filters between the probe and a generator providing an output with a constant power spectral density. This technique appears to have certain advantages over other methods. It does not introduce phase anomalies in the final spectrum, as do currently available analog notch filters. Any number of lines may be suppressed without loss of sensitivity at the unsuppressed frequencies compared to the steady state pulsed Fourier transform experiment. Suppression ratios attainable are not critically dependent on spin lattice relaxation times.

The synthesized excitation technique is also useful to implement most of the line suppression methods. It may be used to do the line suppression by saturation by using a synthesized RF excitation function having a very large amplitude at the frequency of the line to be suppressed (similar to the homonuclear decoupling experiment aforedescribed). It may also be used to generate a quasi "two-pulse" experiment which has some of the advantages of both the nonirradiation synthesized excitation and the two-pulse Fourier transform techniques. Such a hybrid experiment consists of a "first pulse" which is synthesized RF excitation pulse sequence designed to apply a 180° pulse only to those frequencies to be suppressed. The "second pulse" consists of a synthesized pulse sequence designed to apply a 90° pulse to all frequencies except those to be suppressed. This kind of experiment will have much greater sensitivity than the standard two pulse experiment because unsuppressed lines are not saturated by the "first pulse" and much greater line suppression because the suppressed lines are not irradiated at all by the second pulse.

Other "multiple pulse" experiments may be devised for studying the relaxation parameters of the spin system in which some "pulses" are synthesized RF excitation pulse sequences derived from the table G(t) in the computer, while others are applied directly from a pulse generator 9 or analog synthesizer 31. For example, a first "pulse" may be a Fourier synthesized pulse sequence, or part of a Fourier synthesized pulse sequence, designed to perturb particular resonance lines in a spectrum. The second pulse, applied after some time interval, may be a 90° pulse, for the purpose of monitoring the non-equilibrium state of the spin system which results from the perturbation due to the first pulse and subsequent partial relaxation.

The synthesized excitation technique need not be used to completely suppress a line; it may also be used to compress the dynamic range of a spectrum to facilitate accurate comparison of strong and weak line intensities. A correction will have to be made, however, to account for the different degrees of saturation of the strong and weak lines due to nonuniform irradiation power spectrum.

An important advantage to use of the programmed computer for synthesizing the RF excitation to be employed for exciting resonance in an RF spectrometer is the flexibility obtained in that a large number of very different experiments can be conducted without changing the hardware. Program changes can effectuate changes in the character of the RF excitation. For example, merely by substituting one program for another, pulse Fourier transform or stochastic resonance experiments may be conducted with the same equipment. Homonuclear decoupling experiments may be conducted without employing separate RF decouplers. Moreover, the decoupling energy may be adjusted by means of the computer synthesized RF to a much higher level than the observing power level, i.e., 128 times the amplitude of the remaining position of the RF excitation, to suppress certain frequencies such as solvent lines. In addition, the computer generated RF excitation can provide a much flatter power spectrum without the requirement for special filters.

As used herein RF spectrometer is defined to include nuclear magnetic resonance spectrometers, electron spin spectrometers, quadrupole resonance spectrometers, microwave absorption spectrometers, RF mass spectrometers and other types of spectrometers employing RF excitation.

The basic program for programming the computer for practicing the present invention in assembly language is as follows:

```
PAGE 0001  07/19/74              VORTEX   IOUTIL
 COPYF,1,MT,1,640,L0,1,40
  *        T1-M    16K  620F/L
         SMRY
         SPAC
         SPAC
         SPAC
         SPAC
  *                      30319-M   T-1 RESEARCH SPECIAL
  *
  *
  *              N M R   FOURIER TRANSFORM PROGRAM
  *
         IFT      XL
  * FOR OPERATION OF F.T. CONTROL MODULE WITH XL-100 NMR SPECTROMETER
         IFT      HAD
  * FOR OPERATION OF V-4357 PULSE UNIT WITH HA-1000 NMR SPECTROMETER
         IFT      SC
  * FOR OPERATION OF V-4357 PULSE UNIT WITH HR-220/300 NMR SPECTROMETER
  *
  *
         IFT      F
  * WRITTEN FOR VDM-620F COMPUTER
         IFT      L
  * WRITTEN FOR VDM-620L COMPUTER
  *                   16K MEMORY
  *                   HARDWARE MUL/DIV
  *                   16 BIT WORD LENGTH
  *
  *      REQUIRES          620-874   10 BIT, 14 BIT DAC
  *                        620-851   13 BIT, 16 CHAN ADC
  *
  * PROGRAM WRITTEN BY N M R RESEARCH DEPT OF VARIAN ANALYTICAL
  *            INSTRUMENT DIVISION  PALO ALTO, CAL.
  * THIS PROGRAM (AS WELL AS ITS INDIVIDUAL PORTIONS)
  * IS COPYRIGHTED MATERIAL OF VARIAN ASSOCIATES,
```

```
*
        EJEC
* SET AND EQU INSTRUCTIONS FOR CONTROLLING PROGRAM ASSEMBLY
*
*    SMDV    0= SOFTWARE    1= HARDWARE MUL/DIV
NBIT    SET     16
SMDV    SET     1
F       EQU     1           VDM 620-F COMPUTER
XL      EQU     1           SPECTROMETER CONTROL                    00
XLT     EQU     1           TIMING CLOCK CONTROL
XLR     EQU     1           RECORDER CONTROL
*
*  *   *   *   *   *   *   *   *   *   *   *   *   *
*
*   INDEX REGISTER SPECIFICATION
X       EQU     1           X REGISTER
B       EQU     2           B REGISTER
*
*   SYMBOLIC NAMES TO BE USED WITH THE COMPOUND CONDITIONAL
*     INSTRUCTIONS  JIF, JMIF, JIFM, AND XIF
AN      EQU     0004        A REG NEGATIVE
AP      EQU     0002        A REG POSITIVE
AZ      EQU     0010        A REG ZERO
BZ      EQU     0020        B REG ZERO
XZ      EQU     0040        X REG ZERO
S1      EQU     0100        SENSE SW 1 SET
S2      EQU     0200        SENSE SW 2 SET
S3      EQU     0400        SENSE SW 3 SET
OJ      EQU     0001        OFLO SET
*
*   SYMBOLIC NAMES TO BE USED WITH THE REGISTER CHANGE
*    PSUEDO INSTRUCTIONS MERGE, COMPL, INCR, DECR, ZERO
AS      EQU     0010        A SOURCE REG
BS      EQU     0020        B SOURCE REG
XS      EQU     0040        X SOURCE REG
AD      EQU     0001        A DESTINATION REG
BD      EQU     0002        B DESTINATION REG
XD      EQU     0004        X DESTINATION REG
OR      EQU     0400        EXECUTE IFF OFLO SET
*   *   *   *   *   *   *   *   *   *   *   *   *   *
*
AID     EQU     036000      PROGRAM EDIT ROUTINE
LOAD    EQU     037630
DUMP    EQU     037434
TAPE    EQU     037746
OTPT    EQU     037736
PLDR    EQU     037562
FRST    EQU     037753
LST     EQU     037754
FXEC    EQU     037755
P       EQU     0400        SHIFT 8 PLACES LEFT
*
        EJEC
*   RECORDER AND SCOPE DEVICE CODES
*
OFF     EQU     0100
DAC     EQU     057         DAC ADDRESS
RECD    EQU     0157        RECORDER DAC
SWEP    EQU     057         SCOPE SWEEP DAC
WREG    EQU     050         WORD REGISTER ADDRESS
EFRQ    EQU     050         EXTERNAL STEP FREQUENCY
LLIM    EQU     0257        RECORDER LEFT LIMIT
RLIM    EQU     0357        RECORDER RIGHT LIMIT
*
*
*       F.T. PULSE CONTROL MODULE
*
LHSW    EQU     050         HI/LO FLD LOCK SWITCH       HA-100
LPOF    EQU     050         LOCAL PULSE OFF             XL-100
PUTR    EQU     0457        PULSE TRIGGER
PSEN    EQU     0150        SPECTRUM PHASE POLARITY SENSE
INTR    EQU     0250        LOCK SENSE LINE
```

```
PLON    EQU     0657            PULSE ON COMP CONT OF ACQ TIME
PLOF    EQU     0757            PULSE OFF
RFON    EQU     0457            TURN RF ON COMP PULSE WIDTH
RFOF    EQU     0557            TURN RF OFF
FTBX    EQU     0557            FT PULSE BOX ON/OFF
        SPAC    2
* VARIAN ADC DEVICE CODES
*
MUXC    EQU     061             MULTIPLIER ADDRESS FOR CHANNEL CONTROL
MUXR    EQU     0161            MULTIPLEXER IN RANDOM MODE
MUXS    EQU     0261            MULTIPLEXER IN SEQUENTIAL MODE
TIMR    EQU     060
VADC    EQU     060             VARIAN FAST ADC ADDRESS
SADC    EQU     0160            START ADC FOR PROGRAM CONTROL
EESA    EQU     0260            ENABLE EXT START FOR ADC
DESA    EQU     0360            DISABLE EXTERNAL START FOR ADC
        EJEC
*
*       SPECTROMETER DEVICE CODES
*
SPOIL   EQU     0250            SPOIL HOMOGENIETY
HOMO    EQU     0350            RESTORE HOMOGENIETY
        SPAC
* DIGITAL INPUT / OUTPUT REGISTERS ARE USED FOR RECORDER,
* COMPUTER CONTROL OF PULSE UNIT AND COMPUTER SELECTION OF FILTERS.
*
*       FUNCTION                BIT NUMBER
*
*       REC. EXT. RIGHT         00
*       REC. EXT. LEFT          01
*       REC. REM. (X AXIS)      02
*       REC. REM. (Y AXIS)      03
*       REC. PEN DOWN           04
*
*       COMP. ACQ. TIME         05
*       COMP. PULSE WIDTH       06
*       SPARE                   08
*
*        250 HZ FILTER          09
*        500 HZ FILTER          10
*       1000 HZ FILTER          11
*       2500 HZ FILTER          12
*       5000 HZ FILTER          13
*      10000 HZ FILTER          14
*          EXT. FILTER          15
        EJEC
*           N M R   FOURIER TRANSFORM PROGRAM
*
        ORG     0
        NOP
        NOP
        CALL    TELA,MSPN       PART NUMBER PRINT
GOMO    CALL    TELA,MSGM
        JMP     XOFF            SHIFT SCOPE SPOT TO LEFT
*
* GONI CLEARS ALL REGISTERS AND HALTS COMPUTER
*
GONI    ENTR
        NOP
        NOP
        ZERO    7
HLT     HLT                     HALT
        LDX     DE10
        LDA     FS
        CALL    WAIT            WAIT FOR TTY TO COME TO SPEED
        OXR
        JXZ     *+4
        JMP     *-6             TTY NOT AT SPEED
        JMP     GOMO            RESTART
        ORG     040             POWER RESTART
        HLT
        HLT
```

```
          JMP       HLT+1
          EJEC
*                        DATA TABLE
*               N M R  FOURIER TRANSFORM PROGRAM
*
* COPYRIGHT - VARIAN ASSOCIATES - 1970
*
TEMP      BSS       50              TEMPORARY WORKING STORAGE
T         EQU       TEMP
HOMT      DATA      -8              SPOIL HOMO TIMING
*
*                   ARITHMETIC CONSTANTS
*
ONE       DATA      1               DECIMAL ONE
TWO       DATA      2               DECIMAL TWO
THRE      DATA      3               DECIMAL THREE
FOUR      DATA      4               DECIMAL FOUR
FIVE      DATA      5               DECIMAL FIVE
SIX       DATA      6               DECIMAL SIX
SEVN      DATA      7               DECIMAL SEVEN
EIGH      DATA      8               DECIMAL EIGHT
NINE      DATA      9               DECIMAL NINE
DE10      DATA      10              DECIMAL TEN
DE11      DATA      11              DECIMAL 11
DE12      DATA      12              DECIMAL 12
DE13      DATA      13              DECIMAL THIRTEEN
DE14      DATA      14              DECIMAL FOURTEEN
DE15      DATA      15              DECIMAL FIFTEEN
DE16      DATA      16              DECIMAL SIXTEEN
DE20      DATA      20              DECIMAL TWENTY
DE32      DATA      32              DECIMAL 32
DE64      DATA      64              DECIMAL 64
MHUN      DATA      -100            MINUS DECIMAL ONE HUNDRED
EX06      DATA      512             2**9
EX09      DATA      1024            2**10
EX10      DATA      2048            2**11
EX11      DATA      4096            2**12
EX12      DATA      8192            2**13
EX14      DATA      040000
THOU      DATA      1000            ONE THOUSAND DECIMAL
TWOK      DATA      4096,4097       HALF DATA TABLE
FORK      DATA      8192            TOTAL DATA TABLE
SIGN      DATA      0100000         SIGN BIT
FS        DATA      077777          POS. F.S.
PIEE      DATA      062207          VALUE OF PI FOR XSIN/XCOS
PIPH      DATA      0622            VALUE OF PI FOR COEE
PARZ      DATA      06314           OCTAL TENTH FOR DECI
STOP      DATA      1791
HRPS      DATA      02222           HOURS PER SECOND SCALED
*
*                   OPERATING CONSTANTS
*
ASRA      ASRA      0               SHIFT COMMAND
ASLA      ASLA      0               SHIFT COMMAND
LASL      LASL                      LONG ARITH SHIFT LEFT
LASR      LASR                      LONG ARITH SHIFT RIGHT
ADD6      ADD       SIX
SCMD      ADD       FOUR            SCOPE COMMAND
ACDX      ADD       0,1             SET ACQUISITION TO CONVENTIONAL
SUBX      SUB       0,1             SET ACQUISITION TO ALTERNAT
ASUB      SUB       ONE-1           VSUB CONTROL FOR PMAR
ASCO      DATA      0260            ASCII ZERO
ASCP      DATA      0256            ASCII DECIMAL POINT
NEGS      DATA      0255            ASCII MINUS SIGN
DING      DATA      0207            ASCII BEL
RETU      DATA      0215            ASCII RETURN
FSS       DATA      0323            ASCII "S"
RBOT      DATA      0377            ASCII RUBOUT
VLIT      DATA      LITT            LITTLE T ADDRESSES
FREQ      DATA      12501,6251,3126,1251,626,313,0   FILTE FREQUENCIES
FMSK      DATA      0177000         FILTER MASK
SLOH      DATA      014000
```

```
GLCH    DATA    -0650           GLITCH
RCAL    DATA    052000          RECORDER CALIBRATION
        IFF     F
        GOTO    CC
        IFT     XL
ALFA    DATA    020             PHASE COMPENSATION (DEGREES/HERTZ)
        IFT     SC
        GOTO    AA
        GOTO    BB
        IFT     HA
ALFA    DATA    030             PHASE COMPENSATION (DEGREES/HERTZ)
AA      CONT
ALFA    DATA    4               PHASE COMPENSATION (DEGREES/HERTZ)
BB      CONT
CC      IFF     L
        GOTO    DD
        IFT     XL
ALFA    DATA    022             PHASE COMPENSATION (DEGREES/HERTZ)
        IFT     SC
        GOTO    AA
        GOTO    BB
        IFT     HA
ALFA    DATA    030             PHASE COMPENSATION (DEGREES/HERTZ)
AA      CONT
ALFA    DATA    04              PHASE COMPENSATION (DEGREES/HERTZ)
BB      CONT
DD      CONT
        IFT     XLT
FTIM    DATA    072,060000      TIMER CLOCK
        IFT     HAT
FTIM    DATA    017,020260      TIMER CLOCK
        IFT     F
TSEC    DATA    045006          TENTH SECOND TIMING
        IFT     L
TSEC    DATA    043637          TENTH SECOND TIMING
        IFT     F
THTM    DATA    022403          50 MILLISECOND TIMING
        IFT     L
THTM    DATA    021711          50 MILLISECOND TIMING
        IFT     F
MSTM    DATA    419             MILITEE TIMER WORD
        IFT     L
MSTM    DATA    0252            MILITEE TIMER WORD
HTWD    DATA    -8              HOMO SPOIL TIMING WORD
SLEW    DATA    0200            SLEWING SPEED
SLWP    DATA    030             SLOW PLOTTING WORD
*                       ADDRESSES
*
TABL    DATA    010000          FIRST ADDRESS DATA TABLE
FTAU    DATA    020000          TABLE CENTER
TAB1    DATA    030000          FIRST ADDRESS SIN/COS TABLE
TAB2    DATA    032000          FIRST ADDRESS ROOT TABLE
*
*                       FLAGS
*
CLFL    DATA    0               PARAMETER FLAG
LOG     DATA    0               BEFORE FT=0, AFTER FT=1
INTF    DATA    0               INTERLOCK FLAG
CT1F    DATA    0               CURRENT T 1 FLAG
T1FL    DATA    0               TEE UNE FLAG
WTON    DATA    0               WT FUNCTION ON/OFF FLAG         0 = ON
WTFL    DATA    0               SENS=0,RES=1
PHFL    DATA    0               PHASE SENSE FLAG
DRFL    DATA    0               1ST, 2ND DRIFT
BSFL    DATA    0               3RD AND UP DRIFT
ABSF    DATA    0               ABSOLUTE INTENSITY PLOT FLA
ABFL    DATA    0               ABSOLUTE VALUE PLOT FLAG
BCDF    DATA    3               BCDT FLAG =0 FOR 3 PLACE
HILO    DATA    0               LO/HI FIELD LOCK   0= LO, 1  HI,
MSFL    DATA    0               MILLISECOND FLAG
DT1F    DATA    1               DIFFERENTIAL PLOT MODE    1=ON
        EJEC
```

```
*                 VARIABLES
*
BSPW    DATA    1024        BINARY SPECTRAL WIDTH
SPWD    DATA    1024        SPECTRAL WIDTH
CSPW    DATA    1000        CURRENT SPECTRAL WIDTH
PSPW    DATA    1000        PRINTED SPECTRAL WIDTH
BRSW    DATA    1024        BINARY REAL SPECTRAL WIDTH
RSPW    DATA    1000        REAL SPECTRAL WIDTH
CACT    DATA    10          CURRENT ACQUISITION
ACTM    DATA    10          ACQ TIME SECONDS AND TENTHS
PWAF    DATA    0           PULSE 1 IN MICROSECONDS
PWAT    DATA    0           PULSE 1 TIMER WORD
PWBF    DATA    0           PULSE 2 IN MICROSECONDS
PWBT    DATA    0           PULSE 2 TIMER WORD
LITT    BSS     10          LITTLE T'S
TAVE    DATA    0           AVERAGE LITTLE TEES
EXPC    DATA    0           EXPERIMENT COUNTER
NEXP    DATA    0           NUMBER OF EXPERIMENTS
FILP    DATA    04000       FILTER POSITION
CPTS    DATA    2000        CURRENT POINTS
NPTS    DATA    2000        DATA POINTS TO ACCUMULATE
CNPL    DATA    10          CURRENT NUMBER PULSES
NPUL    DATA    10          NO OF PULSES
VPUL    DATA    0           PULSES REMAINING
WTSC    DATA    20          WEIGHT FUNCTION TIME CONSTANT
NRMC    DATA    0           NORMALIZING COUNTER
PHAI    DATA    0           INITIAL PHASE
PHAF    DATA    0           FINAL PHASE AS READ FROM KN B
SCAL    DATA    20          VERTICAL SCALE FACTOR
SVSL    DATA    20          SAVED VERT SCALE
INSC    DATA    100         INTEGRAL SCALE FACTOR
THRS    DATA    0           THRESHOLD FOR PLOT PRINT OU
HRST    DATA    0           START OF DATA FOR PLOT
SVST    DATA    0           SAVED START FOR PLOT
HREN    DATA    4096        END OF DATA FOR PLOT
SVEN    DATA    4096        SAVED END FOR PLOT
PPRY    DATA    10          MANUAL HORIZONTAL EXPANSION
PPRZ    DATA    10          AUTOMATIC EXPANSION
STPC    DATA    0           STEP COUNTER
SSTP    DATA    0           SCALED STEPS
XOFS    DATA    0
YOFS    DATA    0
XSTP    DATA    0           X OFFSET STEPS
OFFS    DATA    0           Y OFFSET
FSTP    DATA    0400        FAST PLOTTING WORD
CTIM    DATA    03530       CURRENT TIME
VTIM    DATA    0           DATA ACQU TIMER WORD
PDWD    DATA    0           PULSE DELAY , TENTH SECOND
SHCT    DATA    0           SHIFT COUNTER
CRMP    DATA    0           CURRENT RAMP
        EJEC
*   CLER CLEARS DATA TABLE,PRINTS TOTAL EXP, TIME AND
*   CALLS PARAMETER LIST
*
*   COPYRIGHT - VARIAN ASSOCIATES - 1970
        ORG     01000
CLER    ENTR
        STA     CLFL        PARAMETER FLAG
        STA     VPUL
        STA     TEMP
        CALL    RSGO
*
*   CALCULATE TOTAL EXP TIME
*
        LDA     ACTM
        ADD     PDWD        PULSE DELAY IN TENTH SECOND
        TAB
        LDX     TIFL
        XXZ     VARZ
        JXZ     CLED
        ASLA    1           DOUBLE AT +PD
        ADD     TAVE        LITTLE TEE'S
```

```
            TAB
            IZA
            MUL      NEXP           NUMBER OF EXPERIMENTS
CLED        CALL     CLEC
            MUL      HRPS           HOURS PER TRANSIENT
            CALL     CLEC           MOVE TO B REG
            MUL      HPUL
            LASR     6
            CALL     CLEE           RESTORE SCALE
            JOF      CLEB           OVER 3.2 K HOURS
            CALL     PTEN           PRINT HOURS
CLEB        CALL     PARA
            STA      PARA           RESET EXIT
            INR      CLFL           SET PARAM FLAG
            INR      LOG            SHUT OFF FTRO
            RETU     CODE
            SPAC
*
* TRANSFER VALUE TO B REG           NO SHIFTS IN TEMP
*
CLEC        ENTR
            JAZ*     CLEC
            LASR     1
            INR      TEMP
            JMP      *-4
*
* RESCALE ACCORDING TO NUMBER IN TEMP
* OF SET IF VALUE TOO LARGE
*
CLEE        ENTR
            CALL     CLEC           CLEAR A REG
            LDX      TEMP
            JXZ      CLEF
            LLFL     1
            DXR
            XAN      CODJ
            JMP      *-6
CLEF        LSRB     1              CLEAR B REG SIGN BIT
            RETU*    CLEE
            EJEC
*PARA ROUTINE PRINTS LIST OF PARAMETERS CONTROLING OPRATION OF COMPU
*
* COPYRIGHT - VARIAN ASSOCIATES - 1970
PARA        DATA     CODE           ENTRY
            CALL     CRLF
            CALL     TELA,MSAX      SPECTRAL WIDTH
            LDA      PSPW
            CALL     BDTT           GET FREQ. PRINT
            CIA      01
            SUBI     0240           SPACE BAR
            JAZ      PARJ           DO PLOT PARAMETERS
            CALL     CRLF
            CALL     TELA,MSAL      ACQ TIME
            LDA      ACTM           GET TENTH SECONDS
            CALL     PTEN
            CALL     CRLF
            LDA      POWO           CHECK VALUE
            JAZ      PARM
            CALL     TELA,MSBR      PULSE DELAY
            LDA      POWO           GET VALUE
            CALL     PTEN
            CALL     CRLF
PARM        LDA      IIFL
            OAR
            JAZ      PARO
            CALL     TELA,MSAO      PULSE WIDTH
PARO        LDA      PWBF           GET VALUE AND CHECK FLAG
            JAZ      PARC
            CALL     BDTT
PARC        CALL     CRLF
            CALL     PARD           GET NO. TRANS.
            CALL     TELA,MSAW      DATA LENGTH
```

```
          LDA     NPTS
          CALL    BOTT
          CALL    CRLF
          LDA     CLFL
          LDX     WTON        GET WT FUNC FLAG
          JIF     AZ+XZ,*+4
          JMP     PARG        NO NOT PRINT WT FUNC
PARM      LDX     WTFL        PRINT WT FUNC
          JXZ     *+7
          CALL    TELA,MSAJ   RESOLUTION ENHANCE
          JMP     *+5
          CALL    TELA,MSAI
          LDA     WTSC        GET TENTH SECONDS
          CALL    PTEN
PARG      CALL    CRLF
          IFF     XL
          GOTO    AA
          LDX     HILO        GET FLAG
          JXZ     *+7
AA        IFF     HA
          GOTO    BB
          NOP
          SEN     LHSW,*+7
BB        CONT
          CALL    TELA,MSBB        HI FIELD LOCK
          JMP     *+5
          CALL    TELA,MSBC        LO FIELD LOCK
          LDX     INTF        GET FLAG
          JXZ     PARJ
          CALL    TELA,MSAB   INTERLOCK
PARJ      CALL    TELA,MSAL   VERT SCALE
          LDA     SCAL
          CALL    BOTT
          CALL    CRLF
          CALL    TELA,MSBL   INTEGRAL VALUE
          LDA     INSC
          CALL    BOTT
          CALL    CRLF
          CALL    TELA,MSAM   BEGIN FREQ
          LDA     HRST
          CALL    PARI        GET FREQ
          CALL    TELA,MSAN   END FREQ
          LDA     HREN
          CALL    PARI        GET FREQ
          CALL    TELA,MSBJ   EXPANSION
          LDA     PPRZ
          JSS2    *+3
          LDA     PPRY
          CALL    PTEN
          CALL    CRLF
          LDA     ABFL
          JAZ     PARO
          CALL    TELA,MSBZ   ABSOLUTE VALUE
          CALL    CRLF
PARO      LDA     DRFL        GET FLAG
          JAZ     PARS
          CALL    TELA,MSBM
          CALL    CRLF
PARS      LDA     BSFL
          JAZ     PARN
          CALL    TELA,MSCD   BASE FLAT
          CALL    CRLF
PARN      LDA     ABSF        GET FLAG
          ORA     TIFL
          JAZ     PARL
          CALL    TELA,MSBP   ABS INT
          MORE
          CALL    CRLF
PARL      CALL    TELA,MSBQ   FOUR LINE FEEDS
          RETU*   PARA
*
* TEE ONE PARAMETERS
*
```

```
PARQ    STA     TEMP            COUNTER
        LDX1    LITT
        STA     TEMP+1          POINTER
        CALL    TELA,MSCB
        LDX     MSFL            GET FLAG
        JXZ     PARY            DO LT NOT LM
        CALL    TELA,MSDB       'MILISEC = '
        CALL    CRLF
PARW    LDA*    T+1             GET NUMBER
        CALL    BDTT            PRINT MILISECONDS
        JMP     PARX            CONTINUE
PARY    CALL    TELA,MSDC       'SEC ='
        CALL    CRLF
PARR    STA     BCDF            SET PO TO 3 PLACE
        LDA*    TEMP+1
        CALL    PTEN            PRINT LITTLE TEE VALUES
PARX    INR     TEMP
        INR     TEMP+1
        LDA     TEMP
        SUB     NEXP
        JAP     PARV
        CALL    TELA,MSCC       COMMA
        LDX     MSFL            GET FLAG
        DXR
        JXZ     PARW
        JMP     PARR
PARV    CALL    CRLF
        CALL    TELA,MSBU       PULSE NO 1
        LDA     PWAF
        CALL    BDTT
        CALL    CRLF
        CALL    TELA,MSBV       PULSE NO 2
        JMP     PARU
*
*   PARI CALCULATES PLOT FREQUENCY
*
PARI    ENTR
        STA     TEMP+12
        CALL    TELA,MSCH       HERTZ =
        LDA     TWOK
        SUB     TEMP+12
        LASR    15
        MUL     SPWD
        DIV     TWOK
        SUB     EXO8
        JAN     PARK
        IBR                     REMAINDER OVER 1/2
PARK    TBA
        ADD     PSPW
        SUB     SPWD
        CALL    BDTT            PRINT FREQUENCY
        CALL    TELA,MSBG       SPACE
        RETU*   PARI
*
PARD    ENTR
        CALL    TELA,MSAE       TRANSIENTS COMPLETED
        LDX     TIFL
        LDA     NPUL
        JXZ     *+3
        ASLA    1
        SUB     VPUL
        JXZ     *+3
        ASRA    1
        CALL    BDTT            PRINT TRANSIENTS
        RETU*   PARD
        EJEC
*  GOTO ROUTINE ENTERS EITHER ACCUM OR BLOCK AVERAGE
*
*  COPYRIGHT - VARIAN ASSOCIATES - 1970
```

```
*
GOTO    ENTR
        CALL    RSGO
        CALL    DTST        DATA LENGTH TEST
        LDA     T1FL
        OAR
        JAZ     TOGC
        CALL    BSAC        ACCUMULATE
        JMP     CRT
*
*   GOTO FOR TEE ONE
*
TOGC    LDX1    LITT
        STX     VLIT        INITIALIZE LITTLE TEE ADDRE
        STA     XSTP        X OFFSET STEPS TOTAL
        STA     OFFS        Y OFFSET TOTAL
        STA     EXPC        EXPERIMENT COUNTER
TOGA    CALL    ATOM
TOGO    INR     VLIT
        INR     EXPC
        LDA     EXPC
        SUB     NEXP
        JAZ*    GOTO
        JAP     CODC
        LDA     XOFS        X OFFSET
        ADD     XSTP
        STA     XSTP
        LDA     YOFS        Y OFFSET
        ADD     OFFS
        STA     OFFS
        JMP     TOGA
*
*
* ATOM AUTOMATICALLY CALLS ACCUM, WEIGHT, FOUR TRANS,  NO PLOT IN SEQU
* IF SS1 UP
* IFF SS1 DOWN GOES TO SCOPE
*
* COPYRIGHT - VARIAN ASSOCIATES - 1970
ATOM    ENTR
        CALL    RSGO
        CALL    DTST        DATA LENGTH TEST
        CALL    BSAC        ACCUMULATE
        LDX     WTON        GET WT FUNC FLAG
        JXZM    WTFU        WEIGHT
        CALL    FTRU
        JS1M    PLOT
        JSS1*   ATOM
        CALL    SCPE        GO TO SCOPE
*
*       DATA LENGTH TEST
*
DTST    ENTR
        LDB     SPWD        SPECTRAL WIDTH
        TZA
        MUL     CACT        10*ATSSW
        DIV     FIVE
        OBR
        ASRB    13          TEST TOO BIG
        JBZ*    DTST
        JMP     CODC
*
* RESU RE-ENTERS CONV, ACCUM,,ATOM,, OR T-ONE EXP,
*
* COPYRIGHT - VARIAN ASSOCIATES - 1970
RESU    ENTR
        SEN     FTBX,CODC   PULSE BOX OFF
        LDA     LOG
        LDB     VPUL        PULSES REMAINING
        JBZ     RESA
        JAZ     NSC         TO BSAC
RESA    LDB     T1FL
        OBR
```

```
              JBZ     TOGO
              JMP     CODC
              EJEC
* DIGITIZATION REDUCING ACCUMULATION
* USES HACKLEY VADC - 12BITS PLUS SIGN
*
* COPYRIGHT - VARIAN ASSOCIATES - 1970
BSAC          ENTR
              TZA                     INITIALIZE LOG
              STA     LOG
              LDX     EX12
              LDB     TABL
              CALL    CLIT
              CALL    RWRD            REMIND FILTERS
              INR     CLFL
              LDB     NPUL
              DECR    BS+AD
              JAN     CODC            GET ERROR MES.
*
* SET TO ALTERNATE FOR I=1
*
              LDA     ADDX            SET TO CONVENTIONAL
              LDX     UT1F
              JXZ     *+7             DO OLD T1
              LDX     T1FL
              JXZ     *+4
              ASLB    1               DOUBLE NPUL
              LDA     SUBX            SET TO ALTERNATE
              STA     SHIF+1
              STB     VPUL            INITIALIZE COUNTER
*
* DTERMINE SHIFT
*
              TZA
MOR           ASRB    01
              IAR
              JBZ     ENUF
              JMP     MOR
ENUF          STA     SHCT            SHIFT COUNTER
              ADD     ASLA
              STA     RMAX
              LDA     SHCT
              SUB     TWO             ADJUST FOR ADC
              JAP     *+3
              TZA
              ADD     ASRA
              STA     SHIF
* CALCULATE MAX RAMP
*
              LDA     ONE
RMAX          NOP                     GENERATE RAMP MAXIMUM
              STA     CRMP            INITIALIZE CURRENT RAMP
*
* GENERATE PMAR (RAMP SPELLED BACKWARDS)
*
NSC           LDA     SHCT
              ADD     ASUB
              STA     VSUB
              LDA     CRMP
              SUB     ONE             ADJUST FOR ADC
              STA     CRMP
              CALL    BTFL            BIT FLIPPER
              ASRA    2               ADJUST FOR ADC
              STA     TEMP+5          PMAR
              EXC     MUXS            SET TO SEQUENTIAL MODE
              INCR    A0
              OAR     MUXC            SELECT MUX CHANNEL 1
              IFF     XL
              GOTO    AA
              SEN     LPUF,*+5
              LDA     DE32            SET BIT 5
              CALL    UWRD            LOCAL PULSES OFF
```

```
AA      IFF     HA
        GOTO    HB
        DUP     5
        NOP
HB      CONT
        LDX     INTF            GET FLAG
        JXZ     *+4             DO NOT TEST INTERLOCK
        SFN     INTM,LOFA       TEST INTER LOCK
*
* GET TRANSIENT RESPONSE
*
* TEST FOR T=1
*
        LDA     T1FL
        JAZ     PU2Z            DO NORMAL PULSE DELAY
        LDA     PWAF
        JAZ     CODC            PULSE ONE ZERO
        LDA     PWBF
        JAZ     CODC            PULSE TWO ZERO
        LDA     MSFL
        JAZ     PU2Z            SKIP ADJ. IF L T
        TZA
        LDB*    VLIT            LITTLE M
        DIV     MHUN            CONVERT TO TENTH SECOND
        TBA
PU2Z    ADD     POWD
        TAX
        CALL    SECT
        INCR    A0
        STA     T+6             PREVENT HANG UP ON LM TIMER
        LDB     T1FL
        JBZ     PU2             NORMAL EXIT
        LDB     OT1F
        JBZ     PU2O            FOR OLD T1, ALWAYS DO P1 FIRST
        LDA     VPOL
        ANA     ONE
        OAR
        LDB     MSFL
        OBR
        JIF     AZ+BZ,PWAS      SPOIL HOMO & DO PULSE #2
        JAZ     PU2             LT, DON'T SPOIL HOMO, DO PULSE #2
PU2O    CIA     1
        SUB     RETU            RETURN TO SCOPE
        JAZ     LOFB            TTY EXIT
        LDA     DE64            SET BIT 6
        CALL    OWRD            USE COMPUTER CONTROL FOR T= 1
        LDA     PWA1            PULSE #1 FOR T=1
        EXC     RFON
        OAR                     PW TIMER
        JAP     *-1
PWAS    NOP                     FINE TIMER
        EXC     RFOF
        LDA     MSFL            GET FLAG
        OAR
        XAP     Z1BAD           SPOIL HOMOGENIETY
        LDX     HTWO
        STX     HOMT            SET HOMO SPOIL TIMER
        LDX*    VLIT            LITTLE T
        STX     T+6             SAVE WORD FOR MILISEC
        JANM    SECT            DO SEC TIMING
*
* ADD NOISE TO PULSE INTERVAL
*
PU2     CIA     VADC            GET NOISE
        EXC     MUXS            RESET MUX
        LDB     VPOL
        ASLB    9               TEST FOR 64TH TRANSIENT
        LDX     T1FL
        JBZ     *+3             64TH TRANSIENT
        LDA     TEMP+12         USE OLD VALUE
        STA     TEMP+12
        ANAI    017777          SET RANDOM TIMING WORD
```

```
        JXZM    WAIT            RANDOM TIMER
*
TAGN    EXC     PLON
        LDA     THTM
        LDB     PWBF
        EXC     PLOF
        JBZ     RX
        LDA     DE64            SET BIT 6
        CALL    OWRD            COMP PULSE WIDTH
        LDX     T1FL
        DXR
        JXZ     PT1
RX      DAR
        SEN     PUTR,PUM        RF PULSE TRIGGER
        JAN     TAGN            TRY AGAIN
        JMP     RX
PT1     LDB     MSFL
        JBZ     PUM             SKIP IF SECOND TIMING
        LDA     MSTM            TIMER WORD FOR 1 MS. BET. PU2 & PUM
        DAR
        JAP     *-1             LOOP
        LDX     T+6
        DXR
        STX     T+6
        INR     HOMT
        LDA     HOMT
        XAP     Z10K            TIME UP, RESTORE HOMOGENIETY
        JXZ     PUM             TIME UP
        JMP     PU2             CONTINUE MILISECOND TIMING LOOP
*
Z10K    EXC     HOMO            RESTORE GOOD HOMOGENIETY
Z1BAD   EXC     SPOIL           SPOIL HOMOGENIETY
*
PUM     LDA     DE32            SET BIT 5
        CALL    OWRD            SWITCHES TO COMP ACQ TIME
        LDA     PWBT            PULSE #2 FOR T=2
        EXC     RFON
        DAR                     PW TIMER
        JAP     *-1
PWBS    NOP                     FINE TIMER
        EXC     RFOF
        LDX     TABL
        LDB     NPTS
        JBZ     CODC
*
*       PHASE COMPENSATION
*
DLY     LDA     ALFA            (DEGREES/HERTZ)
        DAR                     DELAY TIMER
        JAP     *-1
        LDA     VTIM
        DAR     TIMR            START TIMER
        EXC     EESA            SET ADC TO EXT. START
        CIA     VADC            CLEAR VADC REGISTER
        EXC     MUXS            RESET MUX
        JMP     REDY            ADC READY
*
*   STORE TRANSIENT RESPONSE
*
NXPT    CIA     VADC            GET VALUE FOR NEXT POINT
        EXC     MUXS            RESET MUX
        ADD     TEMP+5
SHIF    NOP
        ADD     0,1
        STA     0,1
        IXR
        DBR
        JBZ     FINI
REDY    NOP
        SEN     VADC,NXPT       WAIT FOR NEXT POINT
        EXC     EESA            REFRESH EXT. START
        JMP     REDY
```

```
FINI    LDX     VPUL            DECREMENT PULSE COUNTER
        DXR                     DECREMENT PULSE COUNTER
        STX     VPUL
        JXZ     BEL
        JMP     NSC             GENERATE NEW PMAR
BEL     LDA     DING
        OAR     01
        CALL    RWRD            RETURN TO LOCAL PW AND AT
        CALL    TRAV
        RETU*   BSAC            DATA ACQUISITION EXIT
*
* EXIT FOR INTERLOCK FAILURE INTERRUPT
*
LOFA    CALL    RWRD            RETURN TO LOCAL PW AND AT
*
* FLASH OVERFLOW LAMP
*
        CALL    WAIT
        LDA     SIGN
        XOF     LAFS
        OME     1,DING          REING BELL
        SEN     0201,*+4
        JMP     *-9
        CALL    TELA,MSBG
        CALL    TELA,MSAB       INTLK MESS
*
* EXIT FOR TELETYPE INTERRUPT
*
LOFB    CALL    RWRD            RETURN TO LOCAL PW AND AT
        CALL    TRAV
        CALL    TELA,MSBG
        LDX     T1FL
        JXZ     LOFD
        CALL    TELA,MSCF
        LDA     EXPC
        JAZ     LOFD
        TZA
        STA     CLFL
        CALL    TELA,MSBG
LOFD    CALL    PARD            TRANSIENTS COMPLETED
        JMP     CRT
        MORE
        EJEC
* TRAV REMOVES D C OFFSET FROM TRANSIENT DATA
*
* COPYRIGHT - VARIAN ASSOCIATES - 1971
TRAV    ENTR
        TZA
        STA     TEMP+12         CLEAR SUM
        STA     TEMP+13
        LDX     NPTS            COUNTER
        LDB     TABL
        STB     TEMP+14         ADDRESS POINTER
TRAA    LDA*    TEMP+14
        LASR    15              TAB
        CALL    XDAD,TEMP+12
        STA     TEMP+12         SUMMATION OF
        STB     TEMP+13         ALL DATA VALUES
        DXR
        JXZ     *+6
        INR     TEMP+14
        TZA
        JMP     TRAA
        DIV     NPTS
        STB     TEMP+15         AVERAGE OFFSET
        LDX     NPTS
        LDB     TABL
TRAB    LDA     0,2             GET DATA VALUE
        SUB     TEMP+15         REMOVE OFFSET
        STA     0,2             REPLACE VALUE
        IBR
```

```
        OXR
        JXZ*    TRAV            CORRECTION APPLIED      EXIT
        JMP     TRAB            DO NEXT DATA VALUE
        EJEC
*   SPEC ENTERS SPECTRAL WIDTH IN HERTZ
*   CALCULATES AND SELECTS SIGNAL FILTER
*
*   COPYRIGHT - VARIAN ASSOCIATES - 1970
SPEC    ENTR
        CALL    ISND
        STA     CSPW            SPECTRAL WIDTH
        IFT     XLR
        CALL    RADJ
        IFT     HAR
        NOP
        IFT     HAR
        TAB
        STB     BSPW
        LDA     FTIM
        LDB     FTIM+1
        DIV     BSPW
        JOF     CODC            SPECTRAL TOO SMALL
        STB     TEMP+1          SAMPLE PERIOD
        ASRB    1
        STB     TEMP+2          HALF PERIOD
        LDA     FTIM
        LDB     FTIM+1
        DIV     TEMP+1
        JOF     CODC
        SUB     TEMP+2
        JAN     *+3
        IBR
        STB     BRSW            REAL SPECTRAL WIDTH
        TZA
        IFT     XLR
        MUL     RADA+1
        IFT     HAR
        TBA
        STA     RSPW
        LDA     BRSW
        SUB     CSPW
        JAZ     SPED
        CALL    CRLF
        CALL    TELA,MSCS       ACTUAL SPECTRAL WIDTH
        LDA     BRSW
        CALL    BOTT            PRINT SPWD
SPED    LDB     TEMP+1
SPEE    STB     CTIM            CURRENT TIME
        OBR     TIMR
        LDBI    FREQ
        STB     TEMP            ADDRESS OF FREQUENCY
        LDB     SIGN            EXT FILTER
        LDX     CSPW            SPECTRAL WIDTH
SPEA    TXA                     SPECTRAL WIDTH
        SUB*    TEMP
        JAP     SPEB            FILTER MATCHES SPECTRAL WIDTH
        INR     TEMP
        LSRB    1               NEXT FILTER
        JMP     SPEA
SPEB    EXC2    OREG            RESET FILTER
        OBR     OREG
        STB     FILP
        LDB     BSPW
        CALL    DLNG
        RETU*   SPEC
*
*   ENTER WITH 50 CM VALUES IN A REG.
*   EXIT WITH 1.024 A REG. IN B REG.
*   X UNCHANGED
*
RADJ    ENTR
        TAB
```

```
        ASR8    1
        STB     T+12
        TZB
RADA    OIVI    076400
        SUB     T+12
        XAP     LP16            IBR     ROUNDOFF
        RETU*   RADJ
        EJEC
* ACQT ENTERS ACQUISITION TIME
*
* COPYRIGHT - VARIAN ASSOCIATES - 1970
ACQT    ENTR
        CALL    TENS
        JBZ     CODC
        STB     CACT            CURRENT TIME TENTHS
        LDB     SSPW            SPECTRAL WIDTH
        CALL    DLNG            GET DATA LENGTH
        RETU*   ACQT
*
*
* PDLY DELAYS FOLLOWING RF PULSEE
*
PDLY    ENTR
        CALL    TENS
        STB     PDWD
        RETU*   PDLY
*
*       LTMS    SETS LITTLE T'S TO MILLISECONDS
*
LTMS    ENTR
        INCR    BD
        STB     MSFL            SET MILLISECOND FLAG
        JMP     LTEE+2
*
* LTEE ENTERS TIME BETWEEN A AND B PULSES
*
LTEE    ENTR
        STA     MSFL            CLEAR MILLISECOND FLAG
        STA     TEMP+1
        STA     NEXP
        LDAI    LITT
        STA     TEMP
LTEA    CALL    CRLF
        LDA     MSFL            GET FLAG
        JAZ     LTES
        CALL    TELA,MSOB       (CRLF)MILLISECONDS =
LTEX    CALL    ISNO            INPUT MILLISECONDS
        JXZ     LTEM            EXIT LESS THAN TEN
        SUB     DE10
        JAN     NONO            'MS>10'
        ADD     DE10            RESTORE INPUT
        JMP     LTEM
LTES    CALL    TELA,MSOC       (CRLF)SECONDS =
        CALL    TENS
        TBA
LTEM    STA*    TEMP
        JXZ     LTEB            EXIT LESS THAN TEN
        ADD     TEMP+1
        STA     TEMP+1
        INR     TEMP
        INR     NEXP
        LDA     DE10
        SUB     NEXP
        JAZ     LTEB
        JMP     LTEA
LTEB    LDB     TEMP+1
        DIV     NEXP
        STB     TAVE
        RETU    CODE
*
NONO    CALL    TELA,MSDA       'MS>10'
        JMP     LTEX            TRY AGAIN
```

```
*
* PONE ENTERS THE VALUE OF PULSE ONE FOR T-1 EXPERIMENS
*
PONE    ENTR
        CALL    PTME        ENTER PULSE TIME
        STX     PWAF        FLAG AND TIME IN USEC.
        STB     PWAT
        STA     PWAS
        RETU*   PONE
*
* PTWO ENTERS PULSE TWO TIME  AND NORMAL PULE WIDTH
* IF "0" ENTERED ROUTINE GIVES PW CONTROL TO FT PULSER
* IF NUMBERS ENTERED ROUTINE GIVES PW CONTROL TO ACQUITION
*
* COPYRIGHT - VARIAN ASSOCIATES - 1970
PTWO    ENTR
        CALL    PTME
        STX     PWBF
        STB     PWBT
        STA     PWBS
        RETU*   PTWO
*
* PTME ENTRY OF TIME FOR P=1, P=2, AND NORMAL PULSE WITH
*
PTME    ENTR
        CALL    ISND
        JAZ     PTMA
        TAX                 TIME AND FLAG
        IFF     F
        GOTO    AA
        IFT     HAD
        SUB     FIVE        ADJUST FOR HA=100
        IFT     SC
        ADD     FIVE        ADJUST FOR HR=220/300
        IFT     XL
        ADD     FIVE        ADJUST FOR XL=100
AA      IFF     L
        GOTO    BB
        IFT     HAD
        SUB     NINE        ADJUST FOR HA=100
        IFT     SC
        ADD     ONE         ADJUST FOR HR=220/300
        IFT     XL
        ADD     ONE         ADJUST FOR XL=100
BB      CONT
PTMA    TAB
        TZA
        MUL     PUWZ
        STA     TEMP+1      COARSE TIME
        TZA
        IFT     F
        MUL     DE20
        IFT     L
        MUL     DE12
        ADD     ASRA        FINE TIMER
        LDB     TEMP+1      COARSE TIMER
        RETU*   PTME
*
        IFT     F
PUWZ    DATA    035400      TIMER PERIOD
*
*
* TRANSIENT NUMBER CONTROL
*
* COPYRIGHT - VARIAN ASSOCIATES - 1970
NOTR    ENTR
        CALL    ISND
        STA     CNPL        CURRENT NUMBER OF PULSES
        RETU*   NOTR
*
* INTL SETS ACQ ROUTINE FOR TEST OF LOCK SIG
```

```
*     0 = BATTLE SHORT
*
INTL   ENTR
       CALL   FLAG
       STX    INTF
       RETU*  INTL
*
       IFF    HA
       GOTO   AA
LHFL   ENTR
       JMP    CODC
       DUP    3
       NOP
AA     CONT
       IFF    XL
       GOTO   BB
* LO/HI FIELD SELECTOR    0= LO FLD   1 = HI FLD
*
LHFL   ENTR
       CALL   FLAG
       STX    HILO
       RETU*  LHFL
BB     CONT
* TOGO SETS SYSTEM FOR T1 MEASUREMENTS
*
TOGO   ENTR
       CALL   FLAG
       STX    CT1F
       STA    XSTP         X OFFSET STEPS TOTAL
       STA    OFFS         Y OFFSET TOTAL
       RETU*  TOGO
*
* SENE/RESE ENTERS VALUES OF WEIGHTING TIME CONSTANTS
* SETS WEIGHTING FUNCTION FLAG TO ON OR OFFF
* AND SETS FLAG FOR SENSITIVITY OR RESOLUTION ENHANCE ENT
*
* COPYRIGHT - VARIAN ASSOCIATES - 1970
SENE   ENTR                SENSITIVITY ENHANCEMENT
       STA    WTFL         SET ENHANCEMENT FLAG TO ZER
       JMP    SRTC
       SPAC
       SPAC
       SPAC
RESE   ENTR                RESOLUTION ENHANCEMENT
       LDA    ONE
       STA    WTFL         SET ENHANCEMENT FLAG TO ONE
SRTC   CALL   TENS
       TZX
       XBZ    IXR
       STX    WTON
       STB    WTSC         VALUE IN TENTH SECONDS
       JMP    CODE
       EJEC
* DLNG CALCULATES DATA TABLE LENGTH
* ENTR WITH SPECTRAL WIDTH IN B REG.
*
* COPYRIGHT - VARIAN ASSOCIATES - 1970
DLNG   ENTR
       TZA
       MUL    CACT         10(ACTM)(SPWD)
       DIV    FIVE
       STB    CPTS
       CALL   TELA,MSAW    "DATA ="
       JOF    CODC
       LDA    CPTS
       SUB    FORK
       DAR                 INCLUDE MAX DATA LENGTH
       JAP    CODC
       LDA    CPTS
       CALL   BDTT
       LDA    CPTS
       JAZ    CODC
```

```
          RETU*    DLNG
          EJEC
* RSGO INITALIZES ACQUISITION AND CLEARS FULL DATA TABLE
*
* COPYRIGHT - VARIAN ASSOCIATES - 1970
RSGO      ENTR
          SEN      FTBX,CODC     FT BOX OFF
          STA      NRMC
          LDB      TABL
          LDX      FORK
          CALL     CLIT          CLEAR DATA TABLE
*
*
*   FREZ DATA FROM CURRENT LOCATIONS TO EXISTING OPERATING LOCATIONS
*
          LDA      CSPW
          STA      PSPW
          LDA      BSPW
          STA      SPWD          SPECTRAL WIDTH
          LDA      CNPL
          STA      NPUL          NUMBER OF TRANSIENTS
          LDA      CACT
          STA      ACTM          INTEGER ACQ TIME
          LDA      CPTS
          STA      NPTS          DATA LENGTH
          LDA      CTIM
          STA      VTIM          ADC TIMING
          LDA      CT1F
          STA      T1FL          SET TEE ONE
          INCR     XD
          DAR
          XAP      T1PL
          RETU*    RSGO          EXIT
          EJEC
* LOW FIELD LOCK INVERSION
* ALL OF DATA TABLE IS COMPLEMENTED
* AND TURNED END FOR END
*
* COPYRIGHT - VARIAN ASSOCIATES - 1970
SROT      ENTR
          LDA      LOG
          JAZ      CODC
          LDA      TABL          FWA OF DATA
          STA      TEMP          TOP POINTER
          ADD      EX12          TABLE LENGTH
          SUB      TWO
          STA      TEMP+1        LWA-1 OF DATA
SROS      DECR     XD            -1 IN X REG
          LDA*     TEMP          LOAD UPPER ELEMENT
          LDB*     TEMP+1        LOAD LOWER ELEMENT
          CPA                    TAKE 2'S COMP
          CPB
          STA*     TEMP+1        RESTORE ROTATED
          STB*     TEMP
          INR      TEMP          POINT TO NEXT
          INR      TEMP+1        ELEMENTS
          IXR
          JXZ      SROS+1        DO FOR IMAGINARY ENTRIES
          LDA      TEMP+1
          SUB      FOUR
          STA      TEMP+1        NEXT LOWER ENTRY
          SUB      TEMP
          JAP      SROS          NOT COMPLETE
          RETU*    SROT
          EJEC
* CLEAR INPUT TABLE
* ENTER WITH LENGTH IN X REG, FIRST ADDRESS IN B REG AND VALUE IN A REG
*
* COPYRIGHT - VARIAN ASSOCIATES - 1970
CLIT      ENTR
NEX       STA      0,2
          DXR
```

```
        JXZ*    CLIT          INPUT TABLE CLEARED
        IBR
        JMP     NEX
*
* TENTH SECOND TIMER ROUTINE FOR PULSE DELAYS
* ENTER WITH TENTH SECOND IN X REGISTER
*
SECT    ENTR
SECA    CIA     01            TTY EXIT
        SUB     RETU
        JAZ     LOFB
        JXZ*    SECT
        LDA     DE32          SET BIT 5
        CALL    OWRD          SHUT OFF PULSES
        LDA     TSEC          TENTH SECOND
        CALL    WAIT
        DXR
        JMP     SECA
*
* BIT FLIPPER
BTFL    ENTR
        TAX                   INPUT ADDRESS
        TZB                   FLIPPED ADR WILL GO TO B
        STB     TEMP
ACBL    TXA
        ASLB    1
        ANA     ONE           PICK EACH BIT FROM OLD A
        MERG    AS+BS+BD      PUT BIT INTO B
        INR     TEMP          COUNT BITS
        TXA
        ASRA    1             NEXT BIT OF OLD ADR
        TAX
        LDA     TEMP
VSUB    NOP                   SET FOR NUMBER OF BITS
        JAN     ACBL          ARE ALL BITS FLIPPED
*
* BITS ARE ALL FLIPPED
* COUNT NUMBER OF BITS UP TO BUT NOT
* INCLUDING MOST SIGNIFICANT ONE BIT
        TBA                   FLIPPED ADR
        RETU*   BTFL
        EJEC
* WEIGHTING FUNCTION WEIGHTS THE TRANSIENT WITH AN EXPONENTIAL
* FUNCTION TO ENHANCE EITHER SENSITIVITY OR RESOLUTION
*
* COPYRIGHT - VARIAN ASSOCIATES - 1970
WTFU    ENTR
        LDA     LOG
        LDX     WTON          GET WT FUNC FLAG
        JIF     AZ+XZ,*+4     SEQUENCE OK
        JMP     CODC          GET ERROR
        STA     CLFL
        LDB     WTSC          WEIGHTING TIME CONSTANT IN TENTH SECONDS
        TZA
        MUL     NPTS          ADJUST FOR DATA LENGTH
        LASR    8
        STB     TEMP          (WTSC)(NPTS)
        LDA     ACTM          ACQ. TIME IN TENTH SEC.
        TZB
        LASR    8
        DIV     TEMP
        JBZ     *+3
        DBR
        CPB
        LASL    15            TRANSFER TO A AND DROP SIGN BIT
        STA     TEMP          STARTING VALUE OF EXPONENTIAL
LAFS    LDA     FS
        STA     TEMP+1        CURRENT VALUE OF EXPONENTIA INITIALIZED
        LDA     TABL          FWA DATA TABLE
        STA     TEMP+2        DATA LOCATION TO BE WEIGHTE
        LDX     NPTS
WTFA    JXZ*    WTFU          TRANSIENT WEIGHTED  EXIT
```

```
        INR     TEMP+2
        DXR
        LDB     TEMP+1
        TZA
        MUL     TEMP
        STA     TEMP+1      NEW CURRENT VALUE OF EXPONENTIAL
        LDA     WTFL        LOOK AT FLAG
        JAZ     WTFD
*
* RESOLUTION ENHANCER
*
        TZB
        LDA*    TEMP+2
        DIV     TEMP+1
        STB*    TEMP+2
        JMP     WTFA
*
* SENSITIVITY ENHANCER
*
WTFD    LDB*    TEMP+2
        MUL     TEMP+1
        STA*    TEMP+2      POINT WEIGHTED
        JMP     WTFA
        EJEC
*       FTRU CHECKS FLAGS AND CALLS FOURIER
*
* COPYRIGHT - VARIAN ASSOCIATES - 1970
FTRU    ENTR
        LDA     LOG
        OAR
        JAZ     CODC
        INR     LOG
*
*APODIZATION ROUTINE SMOOTHS END OF TRANSIENT REDUCING WIGGLES
* IN TRANSFORMED SPECTRUM.
*
        NOP
        LDB     NPTS
        MUL     SLOB
        TAX                 SET UP LOCATION COUNTER
        STA     TEMP        LENGTH OF APODIZATION
        LDA     TABL
        ADD     NPTS
        SUB     TEMP
        STA     TEMP+2      START OF APODIZED DATA
        LDB     PIEE
        TZA
        DIV     TEMP
        STB     TEMP        SLOPE OF ARGUMENT
        TZA
APOA    STA     TEMP+1      ARGUMENT
        CALL    XCOS
        ADD     EX14
        TAB
        TZA
        MUL*    TEMP+2
        STA*    TEMP+2
        INR     TEMP+2
        DXR
        JXZ     *+6         TRANSIENT APODIZED
        LDA     TEMP+1
        ADD     TEMP        INCR THE ARGUMENT
        JMP     APOA
        LDA     FTIZ        SUB COMMAND
        STA     VSUB        SET BIT FLIPPER
        CALL    FTRA        FOURIER TRANSFORM
        CALL    COEE        RESTORE COS,SIN COEFF
        LDA     DING
        OAR     1           RING BELL
        IFF     HA
        GOTO    AA
        NOP
```

```
        SEN*    LHSW,FTRU
AA      CONT
        IFF     XL
        GOTO    BB
        LDX     HILO            GET FLAG
        JXZ*    FTRU
BB      CONT
        CALL    SROT
        RETU*   FTRU
*
FTIZ    SUB     DE12
        EJEC
        MORE
*FAST FOURIER TRANSFORM COOLEY TUKEY METHOD
*
* COPYRIGHT - VARIAN ASSOCIATES - 1970
FTRA    ENTR                    ENTRY
*
*CALCULATE ORDER THAT SIN AND COSINE FUNCTIONS
*ARE USED IN AND STORE IN TABLE AT TAB2
        LDX     TAB2            FWA OF ROOT TABLE
        TZA
        STA     NRMC
        STA     0,1             FIRST ENTRY
        LDA     EX09
        ASRA    1
        STA     TEMP
        ASRA    1
        STA     TEMP+1
        TXA
        ADD     TEMP
        TAX                     MIDDLE ADDRESS OF TABLE
        INCR    01
        STA     0,1             STORE MIDDLE ENTRY
        LDA     TEMP+1
        JAZ     FTRD
*
*GET 4 TIMES FIRST OLD ENTRY
FTRF    LDA     TAB2            FWA OF TABLE
        ADD     TEMP
        TAX                     ADDRESS OF FIRST NON ZERO
        LDB     0,1
        ASLB    2
        STB     TEMP+2
*
*GENERATE NEW EVEN ENTRIES
        TXA
        SUB     TEMP+1
        TAX                     ADDRESS OF FIRST NEW ENTR
LP6     ASRB    1               ADJUST PLOT FOR BLOCK AVER/ UNV
        STB     0,1             STORE NEW VALUE
        ADD     TEMP+1
        TAX                     ADDRESS OF NEXT OLD ENTRY
FTRG    LDA     TEMP+2
        SUB     0,1
        TAB                     VALUE OF NEXT NEW ENTRY
        TXA
        ADD     TEMP+1
        TAX                     ADDRESS OF NEXT OLD ENTRY
        STB     0,1             STORE NEW ENTRY
        ADD     TEMP+1
        TAX
        SUB     TAB2            FWA OF TABLE
        SUB     EX09            LENGTH OF ROOT TABLE
        JAN     FTRG            FIND MORE NEW ENTRIES
        LDA     TEMP+1          DIVIDE INCREMENTOR BY 2
        STA     TEMP
        ASRA    1
        JAZ     FTRD            TABLE COMPLETE, RETURN
        STA     TEMP+1
        JMP     FTRF            DOUBLE TABLE LENGTH AGAIN
*
```

```
*FIND COSINES AND SINE FOR WEIGHTING FUNCTIONS
FTRD    LDA     TAB2
        STA     TEMP+1      FWA OF W ROOT TABLE
        LDA     TAB1
        STA     TEMP        FWA OF COS, SIN TABLE
FTRE    LDA     TEMP
        SUB     TEMP+1
        JAZ     FTRX        SIN COS TABLE COMPLETE
        TZA
        LDB*    TEMP+1
        MUL     PIEE
        LASL    1
        DIV     EX12        NO OF RAW DATA
        STB     TEMP+2      2*PI*I/N
        TBA
        CALL    XCOS        FIND COS OF ARG
        ASLA    1
        STA*    TEMP
        INR     TEMP
        LDA     TEMP+2
        CALL    XSIN        FIND SIN OF ARG
LP18    ASLA    1
        CPA
LP12    IAR
        STA*    TEMP
        INR     TEMP
        INR     TEMP+1
        JMP     FTRE
*
* COS,SIN TABLE IS COMPLETE
* DO FAST FOURIER TRANSFORM
FTRX    CALL    SMFT        SET MAX VALUE TO 14 BITS
        LDA     EX10
        STA     TEMP+2      INCREMENT BETWEEN POINTS
        TZA
        STA     TEMP+4      ODD OR EVEN FOR W PICK U
        STA     TEMP+3      WHICH CALCULATION BLOCK
        LDA     TABL        FWA OF DATA TABLE
        STA     TEMP        POINT TO 1ST WORD IN CAL
        LDA     TEMP+2
        CPA
        IAR
        STA     TEMP+1      NO OF CALC/GROUP
FTRB    LDA     TEMP        ADR OF 1ST ENTRY
        TAX
        LDB     0,1         LOAD 1ST ENTRY
        STB     TEMP+5      STORE 1ST ENTRY
        ADD     TEMP+2
        TAX                 ADR OF 2ND OR 3RD ENTRY
        LDB     0,1
        LDA     TEMP+3      BLOCK NUMBER
        JAZ     *+5         IS IT ZERO
        STB     TEMP+7      STORE AS 3RD ENTRY
        JMP     *+3
        STB     TEMP+6      STORE AS 2ND ENTRY
        TXA
        ADD     TEMP+2
        TAX                 ADR OF 3RD OR 2ND ENTRY
        LDB     0,1
        LDA     TEMP+3      BLOCK NUMBER
        JAZ     *+5         IS IT ZERO
        STB     TEMP+6      STORE AS 2ND ENTRY
        JMP     *+3
        STB     TEMP+7      STORE AS 3RD ENTRY
        TXA
        ADD     TEMP+2
        TAX                 ADR OF 4TH ENTRY
        LDA     0,1
        STA     TEMP+8      STORE 4TH ENTRY
*
* INPUTS ARE NOW PROPERLY LOADED
* DO COMPLEX CALCULATION
```

```
        LDA     TAB1            FWA COS,SIN TABLE
        ADD     TEMP+3          TWO*GROUP NO
        ASRA    1
        ASLA    1
        TAX
        LDA     0,1             LOAD COS,SIN
        LDB     1,1             WEIGHTING FUNCTION
        LDX     TEMP+4          0=EVEN  1=ODD
        JXZ     FTRC            IS GROUP NO EVEN OR ODD
        CPA
        IAR
        CPB
LP16    IBR                     UP
        LLRL    16              EXCHANGE A AND B
        LDX     TEMP+3          GROUP NUMBER
        OXR
        JXZ     *+4             IS IT GROUP NO ONE
        JMP     FTRC
        LDAI    055202
        COMP    AS+BU
        IBR
*
*SINGLE PRECISION FRACTIONAL COMPLEX MULTIPLY
*MULTIPLIER IN A AND B REGISTERS
*
FTRC    ROF
        STA     TEMP+10         REAL MULTIPLIER
        STB     TEMP+11         IMAGINARY MULTIPLIER
        MUL     TEMP+7          IM(MULT)*RE(MULC)
        STA     TEMP+12
        LDB     TEMP+10         RE(MULT)
        MUL     TEMP+8          RE(MULT)*IM(MULC)
        ADD     TEMP+12         IM(MULT)*RE(MULC)
        LDB     TEMP+11         IM(MULT)
        STA     TEMP+11         IMAGINARY PRODUCT
        MUL     TEMP+8          IM(MULT)*IM(MULC)
        STA     TEMP+12
        LDB     TEMP+7          RE(MULC)
        MUL     TEMP+10         RE(MULT)*RE(MULC)
        SUB     TEMP+12
        STA     TEMP+7          CR*W
        ADD     TEMP+5
        LDB     TEMP+11         IMAG. PRODUCT
        LLRL    16
        ADD     TEMP+6
        LLRL    16
        LDX     TEMP
        STA     0,1
        TXA
        ADD     TEMP+2
        TAX                     ADR OF 2ND OUTPUT
        STB     0,1
        ADD     TEMP+2
        TAX                     ADR OF 3RD OUTPUT
        LDA     TEMP+5
        LDB     TEMP+6
        SUB     TEMP+7
        LLRL    16
        SUB     TEMP+11
        LLRL    16
        CPB                     COMPLEX CONJUGATE
        IBR
        STA     0,1
        TXA
        ADD     TEMP+2
        TAX                     ADR OF 4TH OUTPUT
        STB     0,1
        INR     TEMP+1          NO OF CALCS TO BE MADE
        INR     TEMP            ADR OF FIRST ENTRY
        LDA     TEMP+1
        JAZ     *+4
        JMP     FTRB            MOVE CALC 1 PLACE RIGHT
```

```
        INCR    01
        ERA     TEMP+4          CHANGE FROM EVEN TO ODD
        STA     TEMP+4          OR ODD TO EVEN
        INR     TEMP+3          INCREMENT GROUP NO
        LDA     TEMP
        ADD     TEMP+2
        ADD     TEMP+2
        ADD     TEMP+2
        STA     TEMP            NEXT INITIAL GROUP ADR,
        SUB     TABL
        SUB     EX12
        JAN     FTRB+4          NEXT GROUP OF CALCULATIO
*
* LEVEL IS COMPLETE, DO NEXT LEVEL
        CALL    SHFT            SET MAX VALUE TO 14 BITS
        LDA     TEMP+2
        ASRA    1
        JAZ     *+4             TRANSFORM COMPLETE
        JMP     FTRX+3          DO NEXT LEVEL OF CALC
*
* SIGN RESULTS ARE CARRIED IN BOTH BITS 14 AND 15
* SET ALL SIGN BITS TO ZERO
* BIT 15 IS USED AS A FLAG TO SHOW PROPER LOCATION
        LDX     TABL            FWA OF TABLE
        LDA     EX11            LENGTH OF TABLE
        DAR
FTSK    LDB     0,1
        ASLB    1               SHIFT OFF SIGN BIT
        LSRB    1               READ IN ZERO BIT
        STB     0,1
        IXR
        IXR
        DAR
        JAP     FTSK            CONTINUE
*
* SORT INTO (RE, IM) PAIRS
        TZX
        STX     TEMP+2          CURRENT COUNT
FTSL    INR     TEMP+2
        LDA     TEMP+2
        SUB     EX11
        JAZ     FTSP            SORT COMPLETE
        ADD     EX11
        CALL    ACAL            CALCULATE NEXT COUNT
        STA     TEMP+4          NEXT COUNT
        SUB     TEMP+2
        JAZ     FTSL            DONT MOVE PAIR
        LDA     TEMP+2
        STA     TEMP+3
        ASLA    1
        ADD     TABL
        TAX                     ADR OF CURRENT ENTRY
        LDA     0,1
        JAN     FTSL            ALREADY MOVED
        LDB     1,1
        STA     TEMP+5          TEMPORARY STORAGE
        STB     TEMP+6
FTSM    LDA     TEMP+4
        ASLA    1
        ADD     TABL
        TAX
        LDA     TEMP+3
        ASLA    1
        ADD     TABL
        TAB
        LDA     0,1
        ORA     SIGN
        STA     0,2
        LDA     1,1
        STA     1,2
        LDA     TEMP+4
        STA     TEMP+3          OLD ADR
```

```
        CALL    ACAL
        STA     TEMP+4      NEW ADD
        SUB     TEMP+2
        JAZ     FTSN
        JMP     FTSM
*
* CLOSE LOOP
FTSN    LDA     TEMP+3
        ASLA    1
        ADD     TABL
        TAX
        LDA     TEMP+5
        ORA     SIGN        SET HOME FLAG
        LDB     TEMP+6
        STA     0,1
        STB     1,1
        JMP     FTSL
*
* RESTORE SIGN BITS
FTSP    LDX     TABL        FWA OF TABLE
        LDA     EX12        LENGTH OF TABLE
        DAR
FTSU    LDB     0,1
        LRLB    1           SHIFT HOME FLAG OFF
        ASRB    1
        STB     0,1
        IXR
        DAR
        JAP     FTSQ        CONTINUE
*
* REPLACE FIRST ENTRY WITH SUM OF FIRST TWO
        LDX     TABL
        LDA     0,1
        ADD     1,1
        STA     0,1
        TZA
        STA     1,1
        RETU*   FTRA        RETURN
*
* SHIFT ALL ENTRIES TO MAINTAIN FOURTEEN BITS
*
* COPYRIGHT - VARIAN ASSOCIATES - 1970
SMFT    ENTR                SCALE, MAINTAIN 14 BITS
*
* FIND MAXIMUM VALUE IN LIST
        LDX     TABL        FWA OF LIST
        TZA
        STA     TEMP+4      MAX VALUE IN LIST
        LDA     0,1
        JAP     *+4
        CPA
        IAR
        SUB     TEMP+4
        JAN     *+4
        ADD     TEMP+4      NEW LARGEST VALUE
        STA     TEMP+4
        INCR    045
        SUB     EX12
        SUB     TABL
        JAN     SMFT+4
*
* FIND NUMBER OF SHIFTS REQUIRED
        LDA     OE14
        LDB     TEMP+4
        JBZ     *+6
        ASRB    1
        DAR
        JMP     *-4
        JAZ*    SMFT        RETURN, NO CORR. REQD.
        STA     TEMP+9
        ADD     NRMC
        STA     NRMC
```

```
            LDA     TEMP+9
*
* FORM SHIFT COMMAND
            JAN     *+5
            ADD     ASLA
            JMP     *+5
            CPA
            IAR
            ADD     ASRA
            STA     *+3
*
* SHIFT DATA TO 14 BITS
            LDX     TABL
            LDA     0,1
            NOP
            STA     0,1
            INCR    045
            SUB     TABL
            SUB     EX12
            JAN     *-6
            RETU*   SMFT            RETURN, ALL CORR MADE
*
* CALCULATE BIT FLIPPED ADDRESS FOR
* FAST FOURIER TRANSFORM OUTPUT SORT
* INPUT AND OUTPUT BOTH IN A REGISTER
ACAL        ENTR
            CALL    BTFL
            TZX                     ZERO BIT COUNTER
ACCL        ASRA    1
            JAZ     ACDL            ALL BITS COUNTED
            IXR
            JMP     ACCL
*
* X REGISTER HAS NO OF BITS TO BE CHECKED
* TAKE EXCLUSIVE OR OF EACH BIT TO BE CHECKED
* WITH BIT SOUGHT AND REPLACE, CHANGE BIT
* SOUGHT WHENEVER EXCLUSIVE OR GIVES A ONE
ACDL        STB     TEMP            STORE ADDRESS
            TAB                     INITIAL BIT SOUGHT
            IAR
            STA     TEMP+1          BIT POSITION
ACEL        LDA     TEMP
            JXZ*    ACAL
            DXR
            TBA                     BIT SOUGHT
            ERA     TEMP
            STA     TEMP            SAVE RESULT
            ANA     TEMP+1          IS EXCLUSIVE OR 0 OR 1
            MORE
            JAZ     ACFL
*
* CHANGE BIT SOUGHT
            TBA
            ERA     TEMP+1
            TAB
ACFL        LDA     TEMP+1
            LLRL    1               GET NEXT BIT
            STA     TEMP+1
            JMP     ACEL
            EJEC
* XSIN/XCOS  FIXED POINT SINGLE PRECISION SINE / COSIN FUNCTIONS
*CALLS SUBROUTINE (POLY), X IN AR SCALED *1/4
*
* SIN(X) FOR X BETWEEN -PI/4 AND +PI/4
* SIN (X/4) SCALED *(1/2)
*
XSIA        LDB     XSIN
            STB     XCOS            FIX EXIT
            JAP     *+10
            ADD     XCOB+1
            JAP     *+4             REDUCE A TO BETW. + OR
            CPA                     ... CALL IT Y
            IAR                     IF NEG. USE Y=ABSXA&PI
```

```
            SUB     XCOB+1
            JMP     XCOC
            SUB     XCOB+1
            JMP     XCOA
    XSIN    ENTR
            JMP     XSIA
*
* COS(X) FOR X BETWEEN -PI/4 AND +PI/4
* COS (X/4) SCALED *(1/2)
*
    XCOS    ENTR
    XCOA    JAN     *+4             COS(X) FOR X IN -PI TO
            CPA                     IS EVALUATED AS
            IAR                     SIN(PI/2-ABS(X)), WHICH
            IFF     NBIT=16
    XCOB    ADDI    031104          REDUCES THE VARIABLE
            IFF     NBIT=18
    XCOB    ADDI    0144420
    XCOC    ASLA    1               TO RANGE -PI/2 TO &PI/
            CALL    POLY
            IFF     NBIT=16
            GOTO    1
            DATA    1,0134,-03200,042104,-0252525
            DATA    0,0377777,0
            GOTO    2
1           DATA    1,027,-0650,010421,-052525
            DATA    0,077777,0
2           JMP*    XCOS            COSXA< IS SCALED *1/2,
            EJEC
*   POLY                            SINGLE PRECISION FIXED POI
*                                   POLYNOMIAL EVALUATOR
*
*THIS UTILITY ROUTINE IS DESIGNED SPECIFICALLY FOR
*GROUP OF ELEMENTARY FUNCTION... IT MAY BE USED,WIT
*SOME CAUTION, FOR GENERAL POLYNOMIAL PROBLEMS
*
* COPYRIGHT 1967 BY VARIAN DATA MACHINES
    POL1    STX     POLY-4
            STA     POLY-3
            STA     POLY-2
            LDX     POLY
            LDA     0,1
            JAZ     POLL
            LDB     POLY-3
            IFF     NBIT=16
            LDAI    040000
            IFF     NBIT=18
            LDAI    0200000
            IFT     SMOV
            MUL     POLY-3
            IFF     SMOV
            CALL    XMUL,POLY-3
            STA     POLY-2
            TZA
    POLL    STA     POLY
            IXR
            LDA     0,1
            JAZ     POL2
            ADD     POLY
            TAB
            TZA
            IFT     SMOV
            MUL     POLY-2
            IFF     SMOV
            CALL    XMUL,POLY-2
            JMP     POLL
    POL2    IXR
            LDA     0,1
            JAZ     POL3
            ADD     POLY
            TAB
```

```
           TZA
           IFF     SMOV
           CALL    XMUL,POLY-3
           IFT     SMOV
           MUL     POLY-3
           IXR
  POL3     XAZ     POLY-1
           ADD     0,1
           IXR
           STX     POLY
           LDX     *+3
           JMP*    POLY
           BSS     3
           DATA    014012
  POLY     ENTR
           JMP     POL1
           EJEC
           READ    70,29
  *                                                                      XDAD0001
  *  XDAD                 FIXED POINT DOUBLE PRECISION ADD/SUBTRACT       XDAD0002
  *                                                                      XDAD0003
           STX     XDAD+3      SAVE XR
           ROF                 RESET OF
           LDX     XDAD                                                  XDAD0030
           LDX     0,1         XR=ADDR OF HI B                           XDAD0040
           STA     XDAD+4      SAVE HI A
           TBA                 GET LO A
           ADD     1,1         ADD LO B                                  XDAD0070
           IFF     NBIT=16                                               XDAD0075
           ANAI    077777      MASK SIGN                                 XDAD0080
           IFF     NBIT=18
           ANAI    0377777                                               XDAD0084
           TAB                 SAVE RESULT                               XDAD0090
           TZA                                                           XDAD0100
           AOFA                GET CARRY                                 XDAD0110
           ROF                 RESET OF                                  XDAD0120
           ADD     XDAD+4      ADD HI A
           ADD     0,1         ADD HI B                                  XDAD0140
           INR     XDAD        SET RETURN                                XDAD0150
           LDX     XDAD+3      RESTORE XR
           JMP     0           RETURN                                    XDAD0170
  XDAD     EQU     *+1         ENTRY                                     XDAD0180
           JMP     *-19                                                  XDAD0190
           DATA    0,0         TEMP STORAGE                              XDAD0200
           READ    80,29
           EJEC
  * TRANSIENT SCOPE DISPLAY
  *
  * COPYRIGHT - VARIAN ASSOCIATES - 1970
  CRT      SEN     0201,XOFF
           LDX     TABL
           LDB     EX12
  NP       TXA
           SUB     FIAD
           NOP
           EXC2    SWEP        X AXIS GAIN
           OAR     DAC         SCOPE HORIZONTAL OUTPUT
           LDA     0,1
           IXR
           DBR
           ASRA    5           Y AXIS GAIN
           EXC2    RECD        RECORDER AND SCOPE VERTICAL OUTPUT
           OAR     DAC
           JBZ     CRT
           JMP     NP
           EJEC
  * SCPE DISPLAYS EITHER THE TRANSIENT OR SPECTRUM ON TH OSCILLOSCOPE
  * DEPENDING ON WHETHER BEFORE TRANSFORM OR AFTER
  * USES SUBROUTINE GETV
  *
```

```
* COPYRIGHT - VARIAN ASSOCIATES - 1970
  SCPE   ENTR
         LDX    LOG
         JXZ    CRT
         CALL   COEE         ESTABLISH SINE/COSINE TABLE
  KNOB   LDA    ABFL         TEST FOR KNOB USE
         JAZM   PHAS         LOOK AT PHASE KNOBS
         JMP    SCOC         GO TO SCOPE
         SPAC
         SPAC
* PHAS         ROUTINE SETS PHASE OF SPECTRA BY USING KNOBS ON FT PULSER
*              ENTERS SPECTRUM SCOPE ROUTINE AT SCOC AFTER SETTING UP FULL
*              DATA TABLE DISPLAY
*
  PHAS   ENTR
         EXC    DESA         DISABLE ADC EXT START
         EXC    MUXR         SET MUX TO RANDOM
         LDA    THRE
         OAR    MUXC         SET MUX TO INITIAL PHASE
         CIA    VADC
         LDA    ONE
         SEN    PSEN,*+3
  VARZ   TZA
         SUB    PHFL         PHASE FLAG
         JAZM   COEE
         LDXI   PRAI
         STX    TEMP+11      SET POINTER TO INITIAL
         LDB    FOUR
         CALL   GTST
         INR    TEMP+11      SET POINTER TO FINAL
         LDB    THRE
         CALL   GTST
         RETU*  PHAS         EXIT
*
*
* GTST OPERATES ADC AND TESTS VALUES FROM PHASE POTS
* ENTER WITH OLD PHASE VALUE IN X REGISTER , MUX SETTING IN B REGISTER
* IF PHASE VALUES HAVE BEEN CHANGED NEW SIN/COS TABLES CALCULATED
*
  GTST   ENTR
         EXC    SADC         START ADC
         OBR    MUXC         SET MUX
         NOP                 INTERRUPT
         SEN    VADC,*+4     WAIT FOR CONVERSION
         JMP    *-3          CONVERSION NOT FINISHED
         CIA    VADC
         ASRA   3            SET PHASE RANGE TO 360 DEGREES
         TAX                 SAVE NEW PHASE
         SUB*   TEMP+11      GET DIFERENCE
*
*TEST DETERMINES IF PHASE CONTROLS HAVE BEEN READJUSTE
* IFF NO CHANGE ANOTHER SCAN IS PUT ON SCOPE
*
         LDB    FIVE
         SUB    TWO
  GTSA   JAZ*   GTST         EXIT
         IAR
         OBR
         JBZ    GTSB         CALCULATE NEW SIN/COS TABLE
         JMP    GTSA
*
  GTSB   STX*   T+11         STORE NEW PHASE
         CALL   COEE
         RETU*  GTST
*
* BEGIN SCOPE DISPLAY
*
  SCOC   LDA    ASLA
         LDB    ABSF         ABS, INT, FLAG
         JBZ    *+4
         SUB    THRE
```

```
          SUB      NRMC
          XBZ      SCMD          SCALE FOR NORMALICED
          STA      SCSH          SCALE SHIFTER
          LDA      SCAL
SCSH      NOP                    SHIFT SPACE
          STA      SCLF
*
* XPNT ROUTINE MOVES SPOT ON SCOPE RIGHT
* MAINTAINING 10 CM SWEEP WIDTH
*
          LDX      HRST          SET STARTING POINT
XPNT      LDA      HREN
          SUB      HRST
          STA      TEMP+12       NO. OF DATA POINTS
          MERG     XS+AD+BD
          SUB      HRST
          DIV      TEMP+12
          TBA
          SUB      EX14
          ASRA     2             X AXIS GAIN
          STA      TEMP+4
          CALL     GETV
          TAB
          MUL      SCLF          VERTICAL SCALING
          LASL     1             Y AXIS GAIN
          LDB      TEMP+4
          EXC2     SWEP          SCOPE HORIZONTAL OUTPUT
          OBR      DAC
          EXC2     RECD          SCOPE VERTICAL OUTPUT
          OAR      DAC
          INCR     XS+AD+XD
          SUB      HREN          END OF DISPLAY
          JAN      XPNT
* SCOPE AND PLOT PARAMETER X AXIS CONTROL
* EXPAND, SHRINK, ROTATE LEFT AND RIGHT
*
          LDA      HREN
          SUB      HRST
          STA      TEMP+14
          ASRA     5             ZOOM SPEED
          STA      TEMP+13
          LDA      FS
          SUB      TEMP+14
          STA      TEMP+14
          TZX                    NEW COMMAND
          SEN      0201,*+3      SENSE TTY
          INCR     XD            OLD COMAND
          CIA      01            GET COMMAND
          SUB      ESS           "S"
          JAZ      VARS          SHRINK DISPLAY
          ADD      ONE           "R"
          JAZ      VARR          RIGHT
          ADD      TWO           "P"
          JAZ      VARP          GO TO PLOT
          ADD      TWO           "N"
          JAZ      VARN          NORMALIZE
          ADD      TWO           "L"
          JAZ      VARL          LEFT
          ADD      THRE          "I"
          JAZ      VARI          INCREASE
ADD4      ADD      FOUR          "E"
          JAZ      VARE          EXPAND
          ADD      ONE           "D"
          JAZ      VARD          DECREASE
          ADD      SIX           ">"
          JIF      AZ+XZ,VACR    JOG RIGHT
          ADD      TWO           "<"
          JIF      AZ+XZ,VACL    JOG LEFT
          ADDI     057           CARRIAGE RETURN
          JAZ      XOFF          EXIT
          JMP      KNOB
*
```

```
*       JOG ONE DATA POINT LEFT
*
VACL    LDA     HREN
        SUB     TWOK
        JAP     KNOB            LEFT LIMIT
        INR     HREN
        INR     HRST
        JMP     KNOB
*
*       JOG ONE DATA POINT RIGHT
*
VACR    LDA     HRST
        JAZ     KNOB            RIGHT LIMIT
        OAR
        STA     HRST
        LDA     HREN
        OAR
        STA     HREN
        JMP     KNOB
*
*   VERTICAL INCREASE
*
VARI    LDA     SCAL
        SUB     STOP            TEST LIMIT
        XAP     VARZ            RESET
        ADD     STOP            RESTORE SCALE
        DIV     TEMP+14
        IBR
        STB     SCAL
        JMP     SCOC
*
*   VERTICAL DECREASE
*
VARD    LDB     SCAL
        MUL     TEMP+14
        STA     SCAL
        JMP     SCOC
*
*   EXPAND DISPLAY
*
VARE    LDA     HRST
        ADDI    0122            4X OF DATA TABLE
        SUB     HREN
        JAP     KNOB            EXPANSION LIMIT
        LDA     HRST
        ADD     TEMP+13
        STA     HRST            NEW START
        LDA     HREN
        SUB     TEMP+13
        JMP     VARR+7
*
* SHRINK DISPLAY
*
VARS    LDA     HRST
        SUB     TEMP+13
        XAN     VARZ            SET TO FULL LEFT
        TAB                     B = 0 IF LEFT LIMIT
        STA     HRST
        LDA     HREN
        ADD     TEMP+13
        SUB     TWOK
        XAP     VARZ            SET TO FULL RIGHT
        TAX                     X = 0 IF LEFT LIMIT
        ADD     TWOK
        STA     HREN
        JIF     BZ+XZ,KNOB      RETURN TO PHASE CONTROL
        JMP     SCOC            RETURN TO SCOPE
*
* ROTATE SPECTRUM LEFT
*
VARL    LDA     HREN
        ADD     TEMP+13
```

```
            SUB     TWOK+1
            JAP     KNOB            LEFT LIMIT EXIT
            ADD     TWOK+1
            STA     HREN
            LDA     HRST
            ADD     TEMP+13
            STA     HRST
            JMP     SCOC            RETURN TO SCOPE
*
* ROTATE SPECTRUM RIGHT
*
VARR        LDA     HRST
            SUB     TEMP+13
            JAN     KNOB            RIGHT LIMIT EXIT
            STA     HRST
            LDA     HREN
            SUB     TEMP+13
            STA     HREN
            JMP     SCOC            RETURN TO SCOPE
*
* RETURN TO FULL DISPLAY
*
VARN        LDA     SVST
            STA     HRST            START
            LDA     SVEN
            STA     HREN            END
            LDA     SVSC
            STA     SCAL            VERTICAL
            JMP     KNOB
*
*       VARP EXITS SCOPE AND GOES TO PLOT
*
VARP        LDA     SIGN
            EXC2    SWEP
            UAR     DAC
            CALL    HREX            CALC. EXPANSION
            CALL    PLOT
            RETU    CODE
*
* ENTER WITH ARGUMENT IN VOLTS
* ROUTINE GENERATES SIN/COS TABLE FOR SCOPE AND PLOT  OUTINES
*
* COPYRIGHT - VARIAN ASSOCIATES - 1970
COEE        ENTR
            TZA
            STA     TEMP+6          SIN/COS LOCATION
            ADD     TAB1
            STA     TEMP+7          SIN/COS TABLE
            LDA     PHAF
            SUB     PHAI            GET TOTAL RANGE
            TZB                     RESET PHASE FLAG
            SEN     PSEN,COEB
            LDB     ONE             SET PHAS FLAG
            JAN     COEA
            SUB     PIPH
            JMP     COEB
COEA        ADD     PIPH
COEB        STB     PHFL            PHASE FLAG
            STA     TEMP+8
COEC        LDB     TEMP+8
            TZA
            MUL     TEMP+6
            DIV     EX09
            TBA
            ADD     PHAI
            ASLA    1               SCALE BY TWO
COED        JAP     COEF
            ADD     PIPH
            JAP     COEH            ARGUMENT OK
            ADD     PIPH            TURN VECTOR 2 PI
            JMP     COED
COEF        SUB     PIPH
```

```
        JAP     COEG            TURN VECTOR =2 PI
        ADD     PIPH            ARGUMENT OK
        JMP     COEI
COEG    SUB     PIPH
        JMP     COED
COEH    SUB     PIPH
COEI    ASLA    6               SCALE ARGUMENT
        IFF     XL
        GOTO    AA
        LDB     HILO            GET FLAG
        JBZ     *+3
AA      IFF     HA
        GOTO    BB
        NOP
        SEN     LHSW,*+3
BB      CONT
        CPA
        STA     TEMP+9
        CALL    XCOS
        ASLA    1               SCALE COSINE TO UNITY
        STA*    TEMP+7
        INR     TEMP+7
        LDA     TEMP+9
        CALL    XSIN
        ASLA    1               SCALE SINE TO UNITY
        STA*    TEMP+7
        INR     TEMP+7
        INR     TEMP+6
        LDA     TEMP+6
        SUB     EX09
        JAN     COEC
        RETU*   COEE
        EJEC
* PPRI SETS UP INTEGRAL SCALE FACTORS
*
* COPYRIGHT - VARIAN ASSOCIATES - 1970
PPRI    ENTR
        LDA     INSC
        CALL    OTIN
        JAZ     CODC            REJECT ZERO
        STA     INSC
        RETU    CODE
*
* PPRM ROUTINE SETS UP PLOT ROUTINE PARAMETERS
* IFF SS2 SET HORIZONTAL EXPANSION IS CALCULATED TO FIL
* 50 CM AS NEAR AS POSSIBLE
*
* COPYRIGHT - VARIAN ASSOCIATES - 1970
PPRM    ENTR
        LDA     SCAL
        STA     SVSC
        CALL    OTIN
        JAZ     PPRA            USE PREVIOUS VALUE
        STA     SCAL            SCALING FACTOR FOR PLOT AND SCOPE ROUTINE
        STA     SVSC
PPRA    LDA     SPWD
        ASLA    1
        STA     TEMP+1          SCALED FREQ
        LDA     HRST
        STA     TEMP+3
PPRB    CALL    CRLF
        CALL    TELA,MSAM       BEGIN FREQ
        LDA     TEMP+3
        CALL    PARI
        CALL    PTST
        STA     TEMP+3          TENT START LOCATION
        CALL    TELA,MSAN       END FREQ
        LDA     HREN
        STA     TEMP+4
        CALL    PARI
        CALL    PTST
        STA     TEMP+4          TENT END LOCATION
```

```
        LDA     TEMP+4
        SUB     TEMP+3          TEST SEQUENCE
        DAR                     DO NOT USE ZERO
        JAN     PPRB
        LDA     TEMP+3
        STA     HRST            START LOCATION SCALED BY TW
        STA     SVST
        LDA     TEMP+4
        STA     HREN            END LOCATION SCALED BY TWO
        STA     SVEN
PPRD    JSS2    PPRE            CALCULATE EXPANSION
        CALL    TELA,MSBJ       HORZ EXPAND
        LDA     PPRY
        CALL    PTEN
        CALL    TELA,MSBG
        CALL    TENS
        JBZ     *+3             DO NOT USE ZERO
        STB     PPRY
*
*       SHIFT SPOT OFF SCOPE SCREEN
*
XOFF    LDA     SIGN
        EXC2    SWEP            SCOPE HORIZONTAL OUTPUT
        DAR     DAC
PPRE    CALL    HREX
        RETU    CODE
*
*   CALCULATE EXPANSION AUTOMATICALLY IF SS2 SET
*
HREX    ENTR
        LDA     HREN
        SUB     HRST
        DAR                     FUDGE
        STA     TEMP+5
        TZA
        LDB     TWOK
        DIV     TEMP+5
        TZA
        MUL     DE10
        STB     PPRZ
        RETU*   HREX
        EJEC
*   PTST TESTS IF FREQ ENTERED ON TTY IS IN RANGE AND C LCULATES
*   LOCATION IN DATA TABLE
*   ENTR WITH FREQ IN A REG,EXIT WITH LOC IN A REG,
*
PTSA    INR     PTST            SKIP STORE
PTSB    STA     TEMP+2
        SUB     SPWD
        DAR                     ZERO MAKE NEG
        JAP     PPRB            BEGIN FREQ TOO LARGE
        LDA     SPWD
        SUB     PSPW
        ADD     TEMP+2
        TZB
        DIV     TEMP+1          PLOT RATIOS
        ASRB    2               SCALE FOR 8192 DATA TABLE
        STB     TEMP+2
        LDA     TWOK
        SUB     TEMP+2
        RETU    0
PTST    BES     0               ENTRY
        CALL    ISND
        JXZ     PTSA            PARAMETER NOT ENTERED
        JMP     PTSB
*
*   ASP ROUTINE ENTERS PARAMETER FOR Y OFFSET, X OFFSET
*
ASP     ENTR
        CALL    TELA,MSBX
        CALL    TENS
        ASLB    7
```

```
        STB     YOFS
        CALL    TELA,MSBY
        CALL    TENS
        TZA
        MUL     DE20
        STB     XOFS
        RETU*   ASP
*
* OTIN PRINTS AND TAKES IN PARAMETERS
*
OTIN    ENTR
        CALL    BDTT
        CALL    TELA,MSBG
        CALL    ISND
        RETU*   OTIN
*
* PIFR ENTERS THRESHOLD IN CM FOR PLOT PRINTOUT
*
PIFR    ENTR
        CALL    TENS
        ASLB    6
        STB     THRS        THRESHOLD
        RETU*   PIFR
        SPAC
        SPAC
* RATE ENTERS PARAMETERS CONTROLLING PLOTTING SPEED
*
RATE    ENTR
        LDA     FSTP
        ASRA    8
        CALL    OTIN        PRINT AND GET TIMING WORD
        JAZ*    RATE        USE OLD VALUE
        ASLA    8
        STA     FSTP
        RETU*   RATE
*
* DRFT SETS FLAG THAT DOES OR SKIPS DRIFT CORRECTION
* 0= SKIP, 1= DO CORRECTION
*
DRFT    ENTR
        CALL    FLAG
        STX     DRFL
        RETU*   DRFT
*
* ABSI SETS FLAG FOR VERTICAL SCALING
* ABSF = 1 FOR ABSOLUTE INTENSITY, 0 FOR NORMALIZED
*
ABSI    ENTR
        CALL    FLAG
T1PL    STX     ABSF
        RETU*   ABSI
*
*       UPT1    SETS PROGRAM FOR UPRIGHT T1 DISPLAY
*               IF ZERO PROGRAM WILL DISPLAY INVERTED SPECTRA
*
UPT1    ENTR
        CALL    FLAG
        STX     UT1F
        RETU*   UPT1
*
* ABPL SET PLOT FLAGS FOR ABSOLUTE VALUE MODE
*
ABPL    ENTR
        CALL    FLAG
        STX     ABFL        ABSOLUTE VALUE FLAG
        RETU*   ABPL
*
* BASE SETS FLAG FOR BASELINE FLATTENING
*
BASE    ENTR
        CALL    FLAG
        STX     BSFL
```

```
        RETU*    BASE
* INTG SETS PLOT FOR INTEGRALS AND JUMPS TO PLOT
* INTEGRAL SCALE FACTOR IN INSC
*
* COPYRIGHT - VARIAN ASSOCIATES - 1970
INTG    ENTR
        LDX     ABFL            ABS VAL FLAG
        JXZ     ININ            DO INTEGRALS
        JMP     CODC            ILLEGAL
*
* ENTER WITH TABLE ENTRY NUMBER OF FIRST POINT TO PE  LOTTED IN HRST
* LAST POINT TABLE POSITION IN HREN, AND VERTICAL SCA E FACTOR
* IN SCAL
* IFF SS3 SET PEN IS SHAKEN TO START FLOW OF INK
*
PLOT    ENTR
        INCR    XD              SET X TO ONE
ININ    STX     INFL            SET PLOTTING TO INTAGRALS
        NOP
        NOP
        TZA
        STA     TEMP+5          CLEAR OLD VALUE
        STA     STPC            CLEAR STEP COUNTER
        STA     TEMP+3          CLEAR INTG END OFFSET
        STA     TEMP+4          CLEAR INTG BEGIN OFFSET
        STA     INSM
        STA     SAVB
*
* PLOT TRANSIENT
*
        STA     WKST
        LDB     FORK
        STB     WKEN            SET TO FULL DATA TABLE
        LDB     DE10            UNITY HORIZONTAL EXPANSION
        LDA     LOG
        JAZ     *+7
*
* PLOT SPECTRUM
*
        LDB     HRST
        STB     WKST
        LDB     HREN
        STB     WKEN
        LDB     PPRZ
        JSS2    *+3
        LDB     PPRY
        STB     SSTP            SCALED STEPS
        LDA     ABSF
        ORA     T1FL            ABSOLUTE MANDATORY WITH T=1
        TAB
        LDA     LASR
        JBZ     LP8             NORMALISE
        ADD     DE10            ABSOLUTE INTENSITY
        ADD     NRMC
        STA     LP9
        STA     LP11
        LDA     INSC
        STA     INSF
        LDA     SCAL
        JMP     LP10
*
* FIND MAX POS VALUE
*
LP8     ADD     FOUR
        STA     LP9
        STA     LP11
        ZERO    XD+AD
        STA     MAXV
LP1     CALL    GETV
        SUB     MAXV
        JAN     *+4
        ADD     MAXV
```

```
              STA     MAXV
              INCR    XS+AD+XD
              SUB     EXI1
              JAN     LP1
              LDA     INSC            CALCULATE INTEGRAL SCALE FACTOR
              TZB
              DIV     MAXV
              STB     INSF
              LDA     SCAL
              TZB
              DIV     MAXV
              TZA
              MUL     RCAL
    LP10      STA     SCLF
              JOF     CODC
              LDA     ORFL
              JAZ     LP21
              LDX     WKST            CALCULATE BEGIN OFFSET
    LP3       CALL    GETV
              ADD     TEMP+4
              STA     TEMP+4          BEGIN OFFSET
              INCR    XS+AD+XD
              SUB     WKST
              SUB     DE16
              JAN     LP3
              LDA     TEMP+4
              ASRA    4               DIVIDE BY 16
              STA     TEMP+4          BEGIN OFFSET
              LDX     WKEN            CALCULATE END OFFSET
              DXR
    LP4       CALL    GETV
              ADD     TEMP+3
              STA     TEMP+3          END OFFSET
              DECR    XS+AD+XD
              SUB     WKEN
              ADD     DE16
              JAP     LP4
              LDA     TEMP+3
              ASRA    4               DIVIDE BY 16
              STA     TEMP+3          END OFFSET
              JOF     LP20            USE SINGLE VALUES
    LP21      CALL    IPLT            INITIALIZE PLOT ROUTINES
*
*   MOVE CARRIAGE TO RIGHT BEFORE PLOTTING
*
              LDX     XSTP
    XOVA      JXZ     *+11
              EXC     EFRQ
              LDA     SLEW
              ADD     SLEW
              DXR
              EXC     EFRQ+OFF
              CALL    WAIT
              JMP     XOVA
              LDX     WKST            WORKING START
    LP2       INCR    XS+AD
              SUB     WKST
              STA     TEMP+12         POSITION IN PLOT
              TZA
              LDB     SSTP            SCALED STEPS
              MUL     TEMP+12
*
*   SHIFT B TO A AND SCALE
*
              LASL    13
              SUB     STPC
              STA     VSTP
              XAZ     LP12
              STA     DELF            DELTA FACTOR
              CALL    GETV
*
*   CORRECT 1ST AND 2ND ORDER DRIFT FOR INTEGRATION AND PLOT.
```

```
            STA     TEMP+12         SAVE DATA VALUE
            LDX     DRFL            LOOK AT DRIFT FLAG
            JXZ     DRFA            DO NOT CORRECT
            LDA     SAVX
            SUB     WKST
            STA     TEMP+13         DATA LOCATION
            LDA     WKEN
            SUB     WKST
            STA     TEMP+7          DATA LENGTH
            LDA     TEMP+4          BEGIN OFFSET
            SUB     TEMP+3          END OFFSET
            TAB
            TZA
            MUL     TEMP+13
            DIV     TEMP+7
            TBA                     CURRENT BASELINE OFFSET
            SUB     TEMP+4          CORRECT BEGIN OFFSET
            ADD     TEMP+12
DRFA        TAB
            TZA
            LDX     INFL
            JXZ     LP5
*
*   CORRECT 3RD AND HIGHER ORDER DRIFT FOR PLOT
*
            LDX     BSFL
            JXZ     LP15
            TBA
            ASRA                    ADJUST CORRECTION
            ADD     INSM            OFFSET
            STA     TEMP+12         SAVE DATA
            ASRA    6               SET THRESHOLD
            LDB     INSM
            XAN     LP16            UP
            XAZ     LP17            DWN
            STB     INSM            NEW OFFSET
            LDB     TEMP+12
            ASLB                    RESTORE SCALE
            TZA
LP15        MUL     SCLF
LP9         NOP                     RESCALE VERTICAL PLOT
            JAZ     GEAR            VALUE OK
            JAN     GEAR            NEG VALUES OK
            LDB     FS              USE OVERANGE
            JMP     GEAR
LP5         MUL     INSF
LP11        NOP
            LASL    10
            ROF
LP13        ADD     INSM            SUM
            JOF     CODC
LP14        STA     INSM
            JMP     GEAF
*
LP20        LDX     WKEN
            CALL    GETV
            STA     T+3             END OFFSET
            LDX     WKST
            CALL    GETV
            STA     T+4             BEGINING OFFSET
            RETU    LP21
            MORE
*
*   GEAR ROUTINE INTERPOLATES BETWEEN POINTS AND VARIES  ARRAIGE SPEED
*       INVERSELY AS VERTICAL PEN MOVEMENT.
*   ENTER WITH VALUE IN A AND B REG
*
*   COPYRIGHT - VARIAN ASSOCIATES - 1970
GEAR        LASL    15              PUT VALUE IN A REGISTER
GEAF        ADD     OFFS            MOVE PEN UP BEFORE PLOTTING
            XOF     LAFS            LDA FS
```

```
              LASR      1              SET TO 14 BITS
              SUB       TEMP+5         OLD VALUE
              LASR      15             TOTAL DELTA
              STA       TEMP+10        NEW DELTA SIGN
              DIV       DELF
              STB       TEMP+7         DELTA/STEP
       GEAB   LDA       TEMP+5         OLD VALUE
              ADD       TEMP+7         DELTA
              STA       TEMP+5         CURRENT VALUE
*
* TEST THRESHOLD
*
              LDA       INFL
              JAZ       GEAH           NO P.O. ON INTEGRALS
              LDA       THRS
              JAZ       GEAH           THRESHOLD ZERO
              ADD       OFFS
              ASRA      1
              SUB       SAVB
              ANA       TEMP+10        NEW DELTA SIGN
              ANA       TEMP+14        OLD DELTA SIGN
              JAP       GEAH
*
* PRINT INTENSITY AND FREQUENCY
*
              CALL      CRLF
              LDA       SAVX
              DAR
              CALL      PARI           PRINT FREQ
              CALL      TELA,MSBL
              LDA       SAVB
              ASLA      1
              SUB       OFFS
              ASRA      7              CONVERT TO MM
              CALL      BDTT           PRINT INTENSITY
       GEAH   LDA       TEMP+10
              CPA
              STA       TEMP+14        OLD DELTA SIGN INDICATOR
              LDB       SAVB
       GEAA   TBA
              ASRA      5              POSITION FOR DAC
              IFT       FLSW
              GOTO      NOP
              IFT       HAR
              CPA
              IFT       XLR
       NOP    NOP
*
* OUTPUT TO DAC
*
              EXC2      RECD
              OAR       DAC
              LDA       SLWP
              CALL      WAIT
              LDA       TEMP+7
              LOX       VSTP
              JAZ       GEAE
       LP17   DBR                      DOWN
              JAN       GEAC
              IBR
              IBR
       GEAC   TBA
              SUB       TEMP+5
              JAZ       *+4
              JMP       GEAA
              STB       SAVB
       GEAE   JXZ       GEAD
              EXC       EFRQ
              INR       STPC           COUNT STEPS
              EXC       EFRQ+OFF
              LDA       FSTP
              LDB       INFL
```

```
        XBZ     LP18            DO HALF SPEED FOR INTEGRALS
        CALL    WAIT
        DXR
        STX     VSTP
        JXZ     *+4
        JMP     GEAB
GEAD    CALL    PEND
        SEN     0201,INRS       SENSE TTY
GEAG    SEN     RLIM,CODC       TEST RIGHT LIMOT
        LDX     SAVX            RESTORE X REGISTER
        INCR    XS+AD+XD
        SUB     WKEN            WORKING END
        JAN     LP2
        LDB     INFL
        JBZM    INPO            PRINT INTRGRAL
EXIT    CALL    MPLF
        CALL    RWRD            RETURN PLOT TO NORMAL
        JMP*    PLOT
*
* TELETYPE EXIT
*
TTEX    CALL    MPLF
        JMP     CODE
*
*
*
*
WKST    EQU     TEMP            STARTING LOCATION
WKEN    EQU     TEMP+1          ENDING LOCATION
SAVX    EQU     TEMP+2          PLOT DATA LOCATION
VSTP    EQU     TEMP+6          RECORDER STEPS PER DATA POI T
INSM    EQU     TEMP+8          INTEGRAL SUM
SCLF    EQU     TEMP+9          SCALE FACTOR
MAXV    EQU     TEMP+10         MAXIMUM VALUE
INSF    EQU     TEMP+11         INTEGRAL SCALE FACTOR
INFL    EQU     TEMP+15         INTEGRAL FLAG
SAVB    EQU     TEMP+16         PLOT DATA VALUE
DELF    EQU     TEMP+17         DELTA FACTOR
* GETV ROUTINE IS USED TO SELECT THE TYPE OF INFORMAT ON RETREIVAL
*
* COPYRIGHT - VARIAN ASSOCIATES - 1970
GETV    ENTR
        STX     SAVX
        TXA
        LDB     LOG
        JBZ     PNTV
        LDB     ABFL            0= PHASED VALUE, 1=ABSOLUTE VALUE
        JBZ     PHAV
        JMP     PABS
*
* PABS ROUTINE IS USED FOR ABSOLUTE VALUE RETREIVAL
* RETURNS WITH VALUE IN A REG    X UNCHANGED
*
* COPYRIGHT - VARIAN ASSOCIATES - 1970
PABS    ASLA    1
        ADD     TABL
        TAX                     REAL ADDRESS
        TZA
        LDB     0,1
        MUL     0,1             REAL SQUARE
        LASR    14
        STB     TEMP+12
        LDB     1,1
        MUL     0,1             REAL SQUARE
        LASR    14
        STB     TEMP+12
        LDB     1,1
        MUL     1,1             IMAG SQUARE
        LASL    1
        ADD     TEMP+12         SUM OF SQUARES
        STA     TEMP+12
        TZA
        STA     TEMP+13         ROOT OF SQUARES
PABA    INR     TEMP+13
        TZA
        LDB     TEMP+13
```

```
        MUL     TEMP+13
        TBA
        SUB     TEMP+12
        JAN     PABA
        LDA     TEMP+13     ROOT OF SUM OF SQUARES
        ASLA    7
        LDX     SAVX
        RETU*   GETV        EXIT
*
* PNTV USED FOR SEQUENTIAL DATA POINT RETREIVAL
* RETURNS WITH VALUE IN A REG    X UNCHANGED
*
* COPYRIGHT - VARIAN ASSOCIATES - 1970
PNTV    ADD     TABL
        TAB
        LDA     0,2
        ASRA    1
        RETU*   GETV
        EJEC
* PHAV ROUTINE IS USED FOR PHASED VALUE INFORMATION R TREIVAL
* RETURNS WITH VALUE IN A REGISTER    X UNCHANGED
*
* COPYRIGHT - VARIAN ASSOCIATES - 1970
PHAV    ASRA    2
        ASLA    1
        ADD     TAB1
        TAX
        LDA     0,1
        STA     TEMP+12     TEMP VALUE OF COS
        LDA     1,1
        STA     TEMP+13     TEMP VALUE OF SIN
        LDA     SAVX
        ASLA    1
        ADD     TABL
        TAX
        LDB     0,1
        TZA
        MUL     TEMP+12
        STA     TEMP+12     REAL VALUE
        LDB     1,1

TZA
        MUL     TEMP+12
        STA     TEMP+12     REAL VALUE
        LDB     1,1
        TZA
        MUL     TEMP+13     IMAG VALUE
        ADD     TEMP+12     SUM
        LDX     SAVX
        JMP*    GETV
        EJEC
* INRS RESETS INTEGRAL TO ZERO BY TYPING "Z" ON TTY
* MAX INTEGRAL VALUE EQUALS 1000
*
* COPYRIGHT - VARIAN ASSOCIATES - 1970
INRS    CIA     1
        SUBI    0332        TEST Z
        LDB     INFL
        JIF     AZ+BZ,*+4
*
* TELETYPE EXIT
        JMP     TTEX
        CALL    INPO        PRINT INTEGRAL
        LDA     GLCH        MARK PLOT
        INCR    BD
        STB     DELF        SET DELTA
        JMP     GEAF+5      RETURN TO PLOT
*
* INPO PRINTS INTEGRAL VALUE
INPO    ENTR
        CALL    CRLF
        CALL    TELA,MSBL
        LDB     INSM
        MUL     THOU
        CALL    BDTT
        STX     INSM
        RETU*   INPO
```

```
        EJEC
MPLF    ENTR
        CALL    RWRD            CLEAR DIG I/O
        LDA     DE13
        CALL    OWRD            PLACE RECORDER IN REMOTE
        TZA                     SET AMPLITUDE TO ZERO
        EXC2    RECD
        OAR     DAC
        LDA     SLEW            MAXIMUM SLEWING SPEED
MPLA    OAR                     ACCELERATE CARRIAGE
MPLB    ADD     SLEW
        SEN*    LLIM,MPLF       EXIT
        SEN     0201,CODE
        STA     TEMP+12         SAVE NEW TIMING WORD
        CALL    WAIT
        EXC     EFRQ            STEP RECORDER
        LDA     TEMP+12
        SUB     SLEW
        EXC     EFRQ+OFF        ONE STEP
        JAP     MPLA
        JMP     MPLB
*
*   SUBROUTINE TO INITIALIZE PLOTTER
*
IPLT    ENTR
        CALL    MPLF            MOVE PEN LEFT
        INR     FILP
        TZA
        CALL    OWRD            PREPARE TO MOVE RIGHT
*
*       LEFT LIMIT SWITCH REGISTRATION
*
REGH    SEN     LLIM,REG        CHECK LEFT LIMIT SWITCH
        LDA     THTM            WAIT 50 M.S.
        CALL    WAIT            LET SWITCH SETTLE
        SEN     LLIM,REG        RECHECK LEFT LIMIT SWITCH
*
*       SHAKE PEN TO START INK FLOWING IF SS3 UP
*
        LDX     DE10
DWN     CALL    PEND            DROP PEN
        LDA     THTM            WAIT 50 MILLI SECONDS
        JS3M    WAIT
        CALL    PENU            LIFT PEN
        LDA     THTM
        JS3M    WAIT
        DXR                     COUNT SHAKES
        JXZ*    IPLT
        JMP     DWN
REG     EXC     EFRQ            STEP RECORDER
        LDA     FSTP
        EXC     EFRQ+OFF        ONE STEP
        CALL    WAIT
        JMP     REGH
*
*       LIFT PEN
*
PENU    ENTR
        STA     TEMP+13         SAVE A REG
        LDA     DE16
        CPA
        ANA     FILP            KEEP FILTER POSITION
        EXC2    OREG
        OAR     OREG
        LDA     TEMP+13         RESTORE A REG
        RETU*   PENU
*
*       DROP PEN
*
PEND    ENTR
        STA     TEMP+13         SAVE A REG
        LDA     DE16
```

```
        ORA     FILP            KEEP FILTER POSITION
        EXC2    OREG
        OAR     OREG
        LDA     TEMP+13         RESTORE A REG
        RETU*   PEND
*
*       OUTPUT WORD TO DIGITAL I/O
*       RETAIN FILTER POSITION
*
OWRD    ENTR
        ORA     FILP            KEEP FILTER POSITION
        EXC2    OREG
        OAR     OREG
        STA     FILP            REMEMBER NEW OPERATION
        RETU*   OWRD
*
*       RESET WORD TO DIGITAL I/O
*       RETAIN FILTER POSITION
*
RWRD    ENTR
        LDA     FILP
        ANA     FMSK
        STA     FILP
        EXC2    OREG
        OAR     OREG
        RETU*   RWRD
*
* WAIT OPERATES SOFTWARE TIMER  ENTER WITH TIMER WORD IN A REG
* COPYRIGHT - VARIAN ASSOCIATES - 1970
WAIT    ENTR
        IFF     F
        GOTO    AA
        SUB     ONE             DECREMENT A REG.
        LRLA    16
        JAP     **2             TIME NOT UP
AA      IFF     L
        GOTO    BB
        DAR
        JAP     **1             TIME NOT UP
        NOP
BB      CONT
        RETU*   WAIT            EXIT  TIME UP
*
*   FLAG TEST ZERO/ONE FROM TTY AND SETS X REG SAME
*
FLAG    ENTR
        TZX
        CALL    INA
        SUB     ASCO
        JAZ*    FLAG            TEST ZERO
        DAR
        LDX     ONE
        JAZ*    FLAG            TEST ONE
        JMP     CODC
*
*  TENS TAKES IN PARAMETERS IN TENTHS
* VALUE IN B REG = 10 TIMES INPUT
*
TENS    ENTR
        CALL    ISND
        DIV     PARZ
        JOF     CODC
        RETU*   TENS
*
* PTEN PRINTS TENS IN INTEGER AND TENTHS.
*
PTEN    ENTR
        TAB
        MUL     PARZ
        STB     TEMP+3
        CALL    BDTT
        LDA     ASCP            ASCII PERIOD
```

```
        CALL    OUTA
        TZA
        LDB     TEMP+3
        DIV     PARZ
        TBA
        ADD     ASCO
        CALL    OUTA
        RETU*   PTEN
        EJEC
* ISND READS ONE DECIMAL NUMBER UP TO 32767.9 IN TENTH
* WHOLE NUMBER IN A REG AND FRACTION IN BREG
*
* COPYRIGHT - VARIAN ASSOCIATES - 1970
ISND    ENTR
        ZERO    06
        STB     TEMP+14         CLEAR DIGIT COUNTER
INSP    STB     INS1            SAVE CURRENT RESULT
        CALL    INA
        SUB     INS4
        JAZ     INSR            CARRIAGE RETURN
        INR     TEMP+14         COUNT DIGITS ENTERED
        SUB     INS7
        XAZ     IXR
        JAZ     INSR
        SUB     INS8
        JAP     ISND+1          ILLEGAL TOO BIG
        ADD     INS9
        JAN     ISND+1          ILLEGAL TOO SMALL
        LDB     INS1            OLD RESULT
        MUL     INS9            TIMES TEN  NEW NUMBER IN A REG.
        JMP     INSP            GET NEXT CHARACTER
INSR    LDA     INS1
        STA     IN10            BINARY NUMBER
        TZB
        JXZ     INSS            SKIP TENTH ENTRY
        CALL    INA
        SUB     INS4            CARRIAGE RETURN
        JAZ     *+5
        SUB     INS5
        JAN     ISND+1          ILLEGAL TOO SMALL
        TAB
        SUB     INS9
        JAP     ISND+1          ILLEGAL TOO BIG
        TBA
        MUL     PARZ            CONVERT TO BINARY FRACTION
        LDA     INS4
        CALL    OUTA
        LDA     IN10            GET BINARY NUMBER
INSS    LDX     TEMP+14         GET DIGIT COUNT
        RETU*   ISND
*
*
INS1    EQU     TEMP+12         PARTIAL RESULT
INS4    EQU     RETU            CARRIAGE RETURN
INS5    DATA    043             ZERO MINUS CR.
INS7    DATA    041
INS8    EQU     0E12
INS9    EQU     0E10
IN10    EQU     TEMP+13         WHOLE BINARY NUMBER
        EJEC
* DONR ALLOWS USE OF TELETYPE FOR COMMENTS
* RETURN TO MONITER BY USING RUBOUT
*
DONR    ENTR
DONS    CALL    INA
        JMP     DONS
*
*       EDIT JUMPS TO AID ROUTINE
*
EDIT    ENTR
        JMP     AID
*
```

* CODE ACCEPTS TWO ALPHA CHARACTERS AND COMPARES WITH HARACTERS IN
* ITS LIBRARY, ERROR MESSAGE IS PRINTED OF OPERATION OT AVAILABLE
*
* COPYRIGHT - VARIAN ASSOCIATES - 1970

```
CODG    LDA     CODF+14     WTFU
        SUB     OPX
        JAZ     CRT
        LDA     CODF+24     FTRU
        SUB     OPX
        JAZM    SCPE        GO TO SCOPE
*
CODE    CALL    CRLF        NORMAL ENTRY FOR TTY MONITO
        CALL    CRLF
        CALL    RWRD        RESET DIG, I/O
        LDAI    0276
        CALL    OUTA        PRINT ARROW
CODJ    SOF
        CIA     01
        CALL    INA         GET FIRST CHAR
        LRLA    010
        STA     TEMP+017
        CALL    INA         GET SECOND CHAR
        ADD     TEMP+017
        STA     TEMP+017
        TZB
        STB     TEMP+016
        LDX     LIB
CODA    LDA     0,1
        JAZ     CODC        OPERATION NOT AVAILABLE
        SUB     TEMP+017    FIND OPERATION
        JAZ     CODB        OPERATION DO DO
IXR     IXR
        INR     TEMP+016
        INR     TEMP+016
        JMP     CODA
CODB    LDAI    (CODF)      GET OPERATION
        ADD     TEMP+016
        STA     TEMP+016
        LDA*    TEMP+016
        STA     OPX         SET UP OPERATION
        INR     TEMP+016
        LDA*    TEMP+016
        STA     MESX        SET UP MESSAGE
CODI    ROF
        CALL    TELA,MSBG   SPACE TTY TO RIGHT
        CALL    TELA,0      GET MESSAGE
MESX    BES     0
        CALL    0
OPX     BES     0
        JMP     CODG
CODC    CALL    TELA,MSBD   ERROR MESSAGE
        JMP     CODE
LIB     DATA    (CODD)      CODD ORG
*
* CODD  FIRST ADDRESS OF LIBRARY
*
CODD    DATA    'PA'
        DATA    'IN'
        DATA    'AT'
        DATA    'PW'
        DATA    'NT'
        DATA    'GO'
        DATA    'RA'
        DATA    'WT'
        DATA    'SE'
        DATA    'RE'
        DATA    'PL'
        DATA    'PP'
        DATA    'FT'
        DATA    'SC'
        DATA    'SW'
        DATA    'AU'
```

```
        DATA    'IP'
        DATA    'DC'
        DATA    'IS'
        DATA    'CL'
        DATA    'AI'
        DATA    'SR'
        DATA    '  '
        DATA    'PO'
        DATA    'AV'
        DATA    'PT'
        DATA    'BL'
        DATA    'PO'
        DATA    'LH'
        DATA    'T1'
        DATA    'P1'
        DATA    'P2'
        DATA    'AS'
        DATA    'LT'
        DATA    'LM'
        DATA    'DM'
        DATA    'GN'        GOOD NIGHT
        DATA    'ED'        STOPPER
        DATA    0
        EJEC
        READ    80,29
*                                                   ** OPERATION **      ** CALL **
*
CODF    DATA    (PARA)                              PA
        DATA    (MSBE)      PARAMETER LIST          PA
        DATA    (INTL)                              IN
        DATA    MSAB+1      INTERLOCK               IN
        DATA    (ACQT)                              AT
        DATA    (MSAC)      ACQUISITION TIME        AT
        DATA    (PTWD)                              PW
        DATA    (MSAD)      PULSE WIDTH             PW
        DATA    (NOTR)                              NT
        DATA    (MSAE)      NUMBER TRANSIENTS       NT
        DATA    (GOTO)                              GO
        DATA    (MSBE)      START ACCUMULATION      GO
        DATA    (RESU)                              RA
        DATA    (MSBE)      RESUME                  RA
        DATA    (WTFU)                              WT
        DATA    (MSBE)      WEIGHT FUNCTION         WT
        DATA    (SENE)                              SE
        DATA    (MSAI)      SENSITIVITY ENHANCEMENT SE
        DATA    (RESE)                              RE
        DATA    (MSAJ)      RESOLUTION ENHANCEMENT  RE
        DATA    (PLOT)                              PL
        DATA    (MSBE)      PLOT                    PL
        DATA    (PPRM)                              PP
        DATA    (MSAL)      VERT SCALE (PLOT PARAM) PP
        DATA    (FTRU)                              FT
        DATA    (MSBE)      FOURIER TRANSFORM       FT
        DATA    (SCPE)                              SC
        DATA    (MSBE)      SCOPE DISPLAY           SC
        DATA    (SPEC)                              SW
        DATA    (MSAX)      SPECTRAL WIDTH          SW
        DATA    (ATOM)                              AU
        DATA    (MSBE)      AUTOMATIC OPERATION     AU
        DATA    (INTG)                              IP
        DATA    (MSBE)      INTEGRATE               IP
        DATA    (ORF1)                              DC
        DATA    (MSBM)      DRIFT CORRECTION        DC
        DATA    (PPRI)                              IS
        DATA    (MSBL)      INTEGRAL SCALE          IS
        DATA    (CLER)                              CL
        DATA    (MSBT)      CLEAR                   CL
        DATA    (ABSI)                              AI
        DATA    (MSBP)      ABSOLUTE INTENSITY      AI
        DATA    (SROT)                              SR
        DATA    (MSBE)      SPECRUM ROTATE          SR
        DATA    (DONR)
```

```
        DATA    (MSBE)          COMMENTS
        DATA    (PDLY)                                  PD
        DATA    (MSBR)          PULSE DELAY             PD
        DATA    (ABPL)                                  AV
        DATA    (MSBZ)          ABSOLUTE VALUE PLOT     AV
        DATA    (RATE)                                  PT
        DATA    (MSCE)          PLOTTING TIME           PT
        DATA    (BASE)                                  BL
        DATA    (MSCD)          BASELINE FLATTENING     BL
        DATA    (PIFR)                                  PO
        DATA    (MSCM)          INT AND FREQ PRINT OUT  PO
        DATA    (LHFL)                                  LH
        DATA    MSBB+1          LO/HI FIELD LOCK        LH
        DATA    (TOGO)                                  T1
        DATA    (MSCF)          TEE ONE                 T1
        DATA    (PONE)                                  P1
        DATA    (MSBU)          PULSE ONE               P1
        DATA    (PTWO)                                  P2
        DATA    (MSBV)          PULSE TWO               P2
        DATA    (ASP)                                   AS
        DATA    (MSBW)          PLOT ASPECT             AS
        DATA    (LTEE)                                  LT
        DATA    (MSCB)          LITTLE TEE              LT
        DATA    (LTMS)                                  LM
        DATA    (MSCB)                                  LM
        DATA    (UPT1)                                  DM
        DATA    (MSDD)          DIFFERENTIAL PLOT MODE  DM
        DATA    (GONI)          GOOD NIGHT              GN
        DATA    (MSGN)          GOOD NIGHT              GN
        DATA    EDIT                                    ED
        DATA    (MSBE)          EDIT                    ED
        EJEC
*                               MESSAGE TABLE
*
* USED FOR FOURIER OPERATIONS AND PARAMETER HANDLING
*
MSAB    DATA    0106612,'INTLK  ',0
MSAC    DATA    'ACQ TIME(SEC) = ',0
MSAD    DATA    'PULS WDTH(USEC) = ',0
MSAE    DATA    'TRANS=',0
MSAI    DATA    'SEN ENH TC(SEC) = ',0
MSAJ    DATA    'RES ENH TC(SEC) = ',0
MSAL    DATA    0106612,'VRT=',0
MSAM    DATA    'BGN',0
MSAN    DATA    0106612,'END ',0
MSAW    DATA    0106612,'PTS=',0
MSAX    DATA    'SPEC WDTH(HZ) =',0
MSBB    DATA    'H FLD ',0
MSBC    DATA    'L FLD ',0
MSBD    DATA    0106012,0137607         ? BEL
MSBE    DATA    0               GOTO MESSAGE
MSBG    DATA    '  ',0          TWO BLANKS
MSBI    DATA    'FAIL ',0
MSBJ    DATA    0106612,'HRZ=',0
MSBL    DATA    'INT=',0
MSBM    DATA    'DRFT CR ',0
MSBP    DATA    'ABS INT ',0
MSBQ    DATA    0105212,0105212,0105212,0105212    8 LINE FEEDS
MSCR    DATA    0106612,0       CARRIAGE RETURN/LINE FEED
MSBR    DATA    'DELAY (SEC) = ',0
MSBT    DATA    'HOURS = ',0
MSBU    DATA    'PULSE ONE(USEC) = ',0
MSBV    DATA    'PULSE TWO(USEC) = ',0
MSBW    DATA    'AS',0150215,0
MSBX    DATA    0105326,'O(CM)=',0
MSBY    DATA    0105310,'O(CM)=',0
MSBZ    DATA    'ABS VAL ',0
MSCB    DATA    'LITTLE T ',0
MSCC    DATA    ', ',0          COMMA SPACE
MSCD    DATA    'BASE LINE',0
MSCE    DATA    'PL TM=',0
MSCF    DATA    'T-1 ',0
```

```
MSCH    DATA    'HERTZ = ',0
MSCM    DATA    'T(CM)=',0
MSCS    DATA    'TRUE SPECTRAL WIDTH = ',0
MSDA    DATA    0105240,'MS>10 MS = ',0
MSDB    DATA    ' MILLI'
MSDC    DATA    'SEC = ',0
MSDD    DATA    'DIFF PLOT MODE ',0
        IFT     KARIN
        GOTO    $A
MSGN    DATA    'GOOD NIGHT',0106612,0
        GOTO    $B
$A      CONT
MSGN    DATA    'GUD NACHT KARIN GIVE ME ET KYS',0106612,0
$B      CONT
        IFT     KARIN
        GOTO    $A
MSGM    DATA    0106612,'GOOD MORNING',0
        GOTO    $B
$A      CONT
MSGM    DATA    0106612,'HEJ KARIN, GUD MOREN DU ER SMUK',0106612,0
$B      CONT
MSPN    DATA    0106612
        DATA    '30319-M'
        DATA    'T-1 RESEARCH SPECIAL',0
        EJEC
* BDTT   FIXED POINT INT BIN TO BCD CONV WITH TT PRIN
* ENTER WITH BINARY VALUE IN A REGISTER
* MAX VALUE = 32767 DECIMAL
*
* COPYRIGHT - VARIAN ASSOCIATES - 1970
BDTT    ENTR
        TAB
        JAP     BDTA
        CPA
        INCR    A$+BD
        LDA     NEGS            PRINT NEGATIVE SIGN
        CALL    OUTA
BDTA    LDX     FOUR
        TZA
        STA     TEMP+12         CLEAR PREVIOUS DIGITS
        DIV     DE10
        STB     TEMP+13         SAVE BIN VALUE
        LDB     TEMP+12         GET PREVIOUS DIGITS
        JXZ     BCDT            JMP IF COMPLETE
        LLSR    4               ATTACHE DIGIT TO RESULT
        DXR                     ELSE COUNT DIGITS
        STB     TEMP+12         SAVE DIGITS ASSEMBLED
        LDB     TEMP+13         GET BIN VALUE
        JMP     *-9
*
* BIN CODED DECIMAL TO TTY PRINT
BCDT    LDX     BCDF            GET FLAG
        JXZ     BCDW
        LDX     FIVE            DO FIVE PLACE
BCDU    ADD     ASCO            CONVERT TO ASCII
        CALL    OUTA
        DXR
        JXZ*    BDTT            FINISHED
BCDV    TZA
        LLRL    04              SET UP BCD NUMBER
        JMP     BCDU            GET NEXT NUMBER
BCDW    LLRL    4
        LDX     THRE            DO 3 PLACE
        STX     BCDF            SET FLAG
        JMP     BCDV
*
* TELA PRINTS A MESSAGE ON THE TELETYPE
* KEYBOARD IS CHECKED FOR INTERRUPT
*
* STORED AS ALPHA CONSTANTS  THE MESSAGE ENDS
* WITH A FULL WORD OF ZERO  THE PARAMETER OF THE
* CALL IS THE FWA OF THE MESSAGE
```

```
* COPYRIGHT - VARIAN ASSOCIATES - 1970
 TELD   CIA     01
        SUB     RBOT
        JAZ     PARL        EXIT THRU PARAMETER LIST
 TELB   LDB     TELA
        LDB     0,2         POINTER
        INR     TELA        CORRECT RETURN ADDRESS
 TELC   LDA     0,2         GET CHARACTERS
        JAZ*    TELA        EXIT
        LRLA    8
        CALL    OUTA        OUTPUT FIRST CHAR
        LSRA    8
        CALL    OUTA        OUTPUT 2ND CHAR
        IBR                 STEP POINTER
        JMP     TELC
 TELA   ENTR
        SEN     0201,TELD   CHECK FOR INTERRUPT
        JMP     TELB
*
*
* INA READS FROM TTY AND PRINTS    ASCII CHAR IN A REG
* IF RUBOUT INTERRUPT           RETURN TO CODE
*
* COPYRIGHT - VARIAN ASSOCIATES - 1970
 INA    ENTR
        NOP                 INTERRUPT
        SEN     0201,*+4    READ READY
        JMP     *-3
        CIA     01          READ CHARACTER
        SUB     RBOT
        JAZ     CODE        RETURN TO MONITOR
        ADD     RBOT        RESTORE CHARACTER
        CALL    OUTA        OUTPUT ASCII CHAR
        RETU*   INA         RETURN
*
* PRINT ONE ASCII CHARACTER ON THE TTY
*
 OUTA   ENTR
        NOP                 INTERRUPT
        SEN     0101,*+4    WRITE READY
        JMP     *-3
        OAR     01          PRINT CHARACTER
        RETU*   OUTA        RETURN
*
* CAR RET LINE FEED
*
 CRLF   ENTR
        CALL    TELA,MSCR
        JMP*    CRLF
        EJEC
 END    END
 L      EQU     1           VDM 620-L COMPUTER
 SC     EQU     1           HR 220/300 NMR SPECTROMETER
 HA     EQU     1           SPECTROMETER CONTROL
 HAT    EQU     1           TIMING CLOCK CONTROL
 FLSW   EQU     1           FIELD SWEEP HR 220/300
 HAD    EQU     1           SPECTROMETER CONTROL        00
 HAR    EQU     1           RECORDER CONTROL
        DATA    +30109-M+
 $                          4767&8#  786 H#7#"H!R 7Y#!I"@
 *                          20803-M  T-1 RESEARCH SPECIAL
        DATA    +20309-M+
 *                          20309-M  T-1 RESEARCH SPECIAL
```

An overlay program in assembly language for the above-cited program and denominated T-1 Tex is as follows:

```
*.         T-1 TEX  OVERLAY
           T-1 QSEX OVERLAY  %
           HEAD    SYNTHESIZED FIRST PULSE T-1
*          DATA OVERLAY TO 30319-M  T-1 RESEARCH SPECIAL
*          TO DO T-1 PULSE SEQUENCES WITH A SYNTHESIZED EXCITATION SEQUENCE
*          IN PLACE OF THE FIRST PULSE
RWRD    EQU     06244
SPWD    EQU     0266
TABL    EQU     0241
VPUL    EQU     0323
TEMP    EQU     044
FTIM    EQU     0231
VTIM    EQU     0352
NPUL    EQU     0322
ASRA    EQU     0174
FTIZ    EQU     03241
VSUB    EQU     03066
TAB1    EQU     0243
TAB2    EQU     0244
SIGN    EQU     0165
PIEE    EQU     0167
PWBF    EQU     0277
BSAC    EQU     01641
FINI    EQU     02200
*
*       LOW CORE ENTRY POINTS
*
*
DLNG    EQU     02701
CLIT    EQU     03021
CODC    EQU     06525
ACAL    EQU     04016
BTFL    EQU     03051
SMFT    EQU     03731
XCOS    EQU     04100
XSIN    EQU     04075
OWRD    EQU     04741
*
*       EQUIPMENT DEFINITIONS
*
REG2    EQU     0150
TIMR    EQU     060
DESA    EQU     0360
EESA    EQU     0260
PLON    EQU     0457
PLOF    EQU     0557
MUXC    EQU     061
MUXS    EQU     0261
PHON    EQU     0450
PHOF    EQU     0550
VADC    EQU     060
PLEN    EQU     0657
PLUN    EQU     0757           RF TO LOCAL CONTROL
OREG    EQU     050            OUTPUT REGISTER ADDRESS
CBSY    EQU     0350           SENSE PULSE TIMING CARD NOT BUSY
ENAB    EQU     0250           ENABLE PULSE
RNAB    EQU     0350           RESET ENABLE L PULSE
SLOW    EQU     0257           ENABLE DIV BY 10 ON PULSE CLOCK
FAST    EQU     0357           ENEABLE DIV BY 1 ON PULSE CLOCK
LOG     EQU     0246
        ORG     034000
PUL1    ENTR                   EXCITE ONE PULSE SEQUENCE
```

```
            EXC    FAST            WITHOUT DATA ACQUISITION
            OME    TIMR,VTIM
            EXC    EESA
            LDX    PATT            POINTER TO FWA OF PATTERN
            LDB    FORK            COUNTER TO LENTGTH OF SEQUENCE
PULL        SEN    VADC,*+5        WASTE TIME UNTIL ADC READY
            NOP
            JMP    *-3
            CIA    VADC            CLEAR ADC AND SENSE
            EXC    MUXS            RESET ADC CHANNEL
            LDA    0,1             GET  TIMMER WORD FORM PATTERN
            ASRA   7
            EXC    0750            SET PHASE ACCORDING TO SIGN OF MODULATION
            JAP    *+5
            CPA
            IAR
            EXC    0650
            ADDI   2
            EXC2   REG2
            OAR    OREG
            EXC    0457            LOAD DATA ONTO CARD
            EXC    0557
            CPA
            IAR
            ADDI   01000           TOTAL RECEIVER BLANKING TIME
            ASRA   1
            ORAI   0100000         SET SIGN BIT
            OAR    OREG
            EXC    0457            LOAD DATA ONTO CARD
            EXC    0557
            NOP
            NOP
            SEN    CBSY,*-2
            EXC    RNAB
            EXC    ENAB
            IXR
            DBR
            JBZ*   PUL1
            JMP    PULL
PUL2        ENTR
            LDA    PWBF
            EXC2   REG2
            OAR    OREG
            EXC    0457            LOAD DATA ONTO CARD
            EXC    0557
            LDAI   0100400         RECEIVER BLANKING TIME
            OAR    OREG
            EXC    0457            LOAD DATA ONTO CARD
            EXC    0557
            EXC    0250            ENABLE CARD
            EXC    0350
            JMP*   PUL2
PATT        DATA   032000
SHIF        EQU    02163           SHIFT WORD LOC
SECT        EQU    03031           TENTH SECOND TIMER ROUTINE ENTRY POINT
QSE         EXC    FAST            SELECT SHORT PULSE TIMING
            LDXI   2               WAIT FOR RELAY TO SWITCH
            CALL   SECT
            EXC    EESA
            LDX    FIAD
            LDB    TABL            SET POINTERS TO PATTERN AND DATA TABLES
            CIA    VADC            CLEAR ADC
            EXC    MUXS            RESET MUXS
QSE1        NOP                    WAIT FOR TIMER CARD NOT BUSY
            NOP
            SEN    CBSY,*-2
            LDA    0,1             GET TIMER VALUE FROM PULSE PATTERN
            ASRA   7               SCALE IT DOWN TO TIMER  SIZE
            EXC    0750            SET PHASE ACCORDING TO SIGN OF  PATTERN VALUE
            JAP    *+5
            CPA                    TAKE ABSOLUTE VALUE  OF VALUE
            IAR
```

```
        EXC     0650
        ADDI    2               ADD MINIMUM PULSE LENGTH
        EXC2    REG2            SELECT DATA OUTPUT REGISTER
        OAR     OREG
        EXC     0457            LOAD DATA IN TO TIMER REGISTER
        EXC     0557
        CPA
        IAR
        ADDI    01000           TOTAL RECEIVER BLANKING TIME
        ASRA    1
        ORAI    0100000         SET SIGN BIT
        OAR     OREG
        EXC     0457            LOAD DATA ONTO TIMER CARD
        EXC     0557
        EXC     0250            ENABLE CARD TO OUTPUT PULSE
        EXC     0350
        SEN     VADC,*+6        V WAIT FOR ADC TO BE TRIGGERED
        NOP
        NOP
        JMP     *-4
        CIA     VADC
        EXC     MUXS            READ ADC AND REINITIALIZE IT
        ADD     TEMP+5          ADD RAMP VALUE
        XEC     SHIF            EXECUTE REQUIRED SHIFT
        ADD     0,2
        STA     0,2             SUM DATA IN DATA TABLE
        IXR                     INCREMENT DATA POINTERS
        IBR
        TBA                     CHECK FOR END OF DATA
        SUB     FIAD
        JAP     FINI            EXIT TO FT EXIT
        JMP     QSE1
*       CODE TO LOAD PULSE 1 PATTERN TABLE
*       USES FIRST AND LAST 1/8 'S OF DATA TABLE
*       WITH THE ORIGIN AT THE CENTER FO THE PATTERN
        LDXI    033000
        LDBI    020000          SET UP POINTERS
        LDA     0,2             TRANSFER DATA
        STA     0,1
        IXR
        IBR
        TBA
        SUBI    021000
        JAN     *-7
        LDXI    032000
        LDBI    027000
        LDA     0,2
        STA     0,1
        IXR
        IBR
        TBA
        SUBI    030000
        JAN     *-7
        JMP     010             EXIT TO START OF PROGRAM
FIRI    ENIR
        LDAI    0140141         GET SUB DE11
        STA     VSUB
        TZX                     SET TO DO INVERSEXE TRANSFORM
        CALL    F120
        CALL    FTRT
        CALL    FT30            DO INVERSE TRANSFORM
        JMP*    FTRI
*       FAST FOURIER TRANSFORM   COOLEY TUKEY METHOD
*       CALCULATE ORDER THAT SINE AND COSINE FUNCTIONS
*       ARE USED AND STORE IN TABLE AT TAB2
FTRT    ENTR
        LDX     TAB2            FWA OF ROOT TABLE
        TZA
        STA     0,1             FIRST ENTRY
        LDA     EX09
        ASRA    1
        STA     TEMP
```

```
            ASRA    1
            STA     TEMP+1
            TXA
            ADD     TEMP
            TAX             MIDDLE ADDRESS OF TABLE
            INCR    01
            STA     0,1     STORE MIDDLE ENTRY
            LDA     TEMP+1
            JAZ     FTRD
*
*       GET FOUR TIMES FIRST OLD ENTRY
FTRF    LDA     TAB2    FWA OF TABLE
            ADD     TEMP
            TAX             ADDRESS OF FIRST NON ZERO
            LDB     0,1
            ASLB    2
            STB     TEMP+2
*
*       GENERATE NEW EVEN ENTRRIES
            TXA
            SUB     TEMP+1
            TAX             ADDRESS OF FIRST NEW ENTRY
LP6     ASRB    1       ADJUST PLOT FOR AVER/ CONV
            STB     0,1
            ADD     TEMP+1
            TAX             ADDRESS OF OLD ENTRY
FTRG    LDA     TEMP+2
            SUB     0,1
            TAB             VALUE OF NEXT NEW ENTRY
            TXA
            ADD     TEMP+1
            TAX             ADDRESS OF NEXT OLD ENTRY
            STB     0,1     STORE NEW ENTRY
            ADD     TEMP+1
            TAX
            SUB     TAB2    FWA OF TABLE
            SUB     EX09    LENGTH OF ROOT TABLE
            JAN     FTRG    FIND MORE NEW ENTRIES
            LDA     TEMP+1  DIVIDE INCREMENTO BY 2
            STA     TEMP
            ASRA    1
            JAZ     FTRD    TABLE COMPLETE, RETURN
            STA     TEMP+1
            JMP     FTRF    DOUBLE TABLE LENGTH AGAIN
*
*       FIND COSINES AND SINES FOR WEIGHTING FUNCTIONS
FTRD    LDA     TAB2
            STA     TEMP+1  FWA OF ROOT TABLE
            LDA     TAB1
            STA     TEMP    FWA OF COS, SIN TABLE
FTRE    LDA     TEMP
            SUB     TEMP+1
            JAZ*    FTRT    SIN/COS TABLE COMPLETE
            TZA
            LDB*    TEMP+1
            MUL     PIEE
            LASL    1
            DIV     EX12    NO OF RAW DATA
            STB     TEMP+2  2*PI*I/N
            LDA     TEMP+2
            CALL    XCOS    FIND COS OF ARG
            ASLA    1
            STA*    TEMP
            INR     TEMP
            LDA     TEMP+2
            CALL    XSIN    FIND SIN OF ARG
LP18    ASLA    1
            CPA
            IAR
LP12    STA*    TEMP
            INR     TEMP
            INR     TEMP+1
```

```
        JMP     FTRE
*
*       COS, SIN TABLE IS COMPLETE
*       DO FAST FOURIER TRANSFORM
FT10    ENTR
FTRX    CALL    SMFT            SET MAX VALUE TO 13 BITS
        LDA     EX10
        STA     TEMP+2          INCREMENT BETWEEN POINTS
        TZA
        STA     TEMP+4          ODD OR EVEN FOR PICKING
        STA     TEMP+3          WHICH CALCULATION BLOCK
        LDA     TABL            FWA OF TABLE
        STA     TEMP            POINT TO FIRST WORD IN CAL
        LDA     TEMP+2
        CPA
        IAR
        STA     TEMP+1          NO OF CLAC GROUP
FTRB    LDA     TEMP            ADR OF FIRST ENTRY
        TAX
        LDB     0,1             LOAD 1ST ENTRY
        STB     TEMP+5          STORE FIRST ENTRY
        ADD     TEMP+2
        TAX                     ADR OF 2ND OR 3RD ENTRY
        LDB     0,1
        LDA     TEMP+3          BLOCK NUMBER
        JAZ     *+5
        STB     TEMP+7          STORE AS THIRD ENTRY
        JMP     *+3
        STB     TEMP+6          STORE AS SECOND ENTRY
        TXA
        ADD     TEMP+2
        TAX                     ADR OF 3RD OR 2ND ENTRY
        LDB     0,1
        LDA     TEMP+3          BLOCK NUMBER
        JAZ     *+5             IS IT ZERO
        STB     TEMP+6          STORE AS SECOND ENTYR
        JMP     *+3
        STB     TEMP+7          STORE AS THIRD ENTRY
        TXA
        ADD     TEMP+2
        TAX                     ADR OF 4TH ENTRY
        LDA     0,1
        STA     TEMP+8          STORE 4TH ENTRY
*
*       INPUTS NOW PROPERLY LOADED
*       DO COMLEX CLACULATION
        LDA     TEMP+3          TWO* GROUP NUMBER
        ASRA    1
        ASLA    1
        ADD     TAB1            FWA OF COS, SIN TABLE
        TAX
        LDA     0,1             LOAD COS, SIN
        LDB     1,1             WEIGHTING FUNCTION
        LDX     TEMP+4          0==EVEN   1==ODD
        JXZ     FTRC            IS GROUP EVEN OR I ODD
        CPA
        IAR
        CPB
LP16    IBR                     UP
        LLRL    16              EXCHANGE A AND B
        LDX     TEMP+3          GROUP NUMBER
        DXR
        JXZ     *+4             IS IT GROUP NUMBER 3ONE
        JMP     FTRC
        LDAI    055202
        COMP    012
        IBR
*
*       SINGLE PRECISION FRACTIONAL COMPLEX MULTIPLY
*       MULTIPLIER IN A AND B REGISTERS
FTRC    CALL    XCMU,TEMP+7
        STA     TEMP+7          CR*W
```

```
        STB     TEMP+8
        ADD     TEMP+5
        LLRL    16
        ADD     TEMP+6
        LLRL    16
        LDX     TEMP
        STA     0,1
        TXA
        ADD     TEMP+2
        TAX                     ADR OF 2ND OUTPUT
        STB     0,1
        ADD     TEMP+2
        TAX                     ADR OF THIRD OUTPUT
        LDA     TEMP+5
        LDB     TEMP+6
        SUB     TEMP+7
        LLRL    16
        SUB     TEMP+8
        LLRL    16
        CPB                     COMPLEX CONJUGATE
        IBR
        STA     0,1
        TXA
        ADD     TEMP+2
        TAX                     ADR FO OF 4TH OUTPUT
        STB     0,1
        INR     TEMP+1          NO. OF CALCS TO BE MADE
        INR     TEMP            ADR OF FIRST ENTRY
        LDA     TEMP+1
        JAZ     *+4
        JMP     FTRB            MOVE CALC 1 PLACE TO THE RIGHT
        INCR    01
        ERA     TEMP+4          CHANGE FROM EVEN TO ODD
        STA     TEMP+4          OR ODD TO EVEN
        INR     TEMP+3
        LDA     TEMP            INCREMENT GROUP NUMBER
        ADD     TEMP+2
        ADD     TEMP+2
        ADD     TEMP+2
        STA     TEMP            NEXT INITIAL GROUP ADDRESS
        SUB     TABL
        SUB     EX12
        JAN     FTRB-4          NEXT GROUP OF CALCULATIONS
*
*       LEVEL IS COMPLETE, DO NEXT LEVEL
        CALL    SMFT            SET MAX VALUE TO 13
        LDA     TEMP+2
        ASRA    1
        JAZ*    FT10
        JMP     FTRX+3          DO NEXT LEVEL OF CLACULATION
*
*       SIGN BITS ARE CARRIED IN BOTH BITS 14 AND 15
*       SET ALL SIGN BITS TO ZERO
*       BIT 15 IS USED AS A FLAG TO SHOW PROPER LOCATION
FT20    ENTR
        LDX     TABL            FWA OF TABLE
        LDA     EX11
        DAR
FTSK    LDB     0,1
        ASLB    1               SHIFT OFF SIGN BIT
        LSRB    1               READ IN ZERO BIT
        STB     0,1
        IXR
        IXR
        DAR
        JAP     FTSK            CONTINUE
*
*       SORT INTO (RE,IM) PAIRS
        TZX
        STX     TEMP+2          CURRENT COUNT
FTSL    INR     TEMP+2
        LDA     TEMP+2
```

```
            SUB     EX11
            JAZ     FTSP        SORT COMPLERTE
            ADD     EX11
            CALL    ACAL        CALCULATE NEXT COUNT
            STA     TEMP+4      NEXT COUNT
            SUB     TEMP+2
            JAZ     FTSL        DON'T MOVE PAIR
            LDA     TEMP+2
            STA     TEMP+3
            ASLA    1
            ADD     TABL
            TAX                 ADR OF CURRENT ENTRY
            LDA     0,1
            JAN     FTSL        ALREADY MOVED
            LDB     1,1
            STA     TEMP+5      TEMPORARY STORAGE
            STB     TEMP+6
    FTSM    LDA     TEMP+4
            ASLA    1
            ADD     TABL
            TAX
            LDB     0,1
            LDA     TEMP+5
            ORA     SIGN
            STB     TEMP+5
            STA     0,1
            LDB     1,1
            LDA     TEMP+6
            STA     1,1
            STB     TEMP+6
            LDA     TEMP+4
            STA     TEMP+3      OLD ADDRESS
            CALL    ACAL
            STA     TEMP+4      NEW ADDRESS
            SUB     TEMP+2
            JAZ     FTSN
            JMP     FTSM
    FTSN    LDA     TEMP+4
            ASLA    1
            ADD     TABL
            TAX
            LDA     TEMP+5
            ORA     SIGN        SET HOME FLAG
            LDB     TEMP+6
            STA     0,1
            STB     1,1
            JMP     FTSL
    *
    *       RESTOE SIGN BITS
    FTSP    LDX     TABL        FWA OF TABLE
            LDA     EX12        LENGTH
            DAR
    FTSQ    LDB     0,1
            LRLB    1           SHIFT HOME FLAG OFF
            ASRB    1
            STB     0,1
            IXR
            DAR
            JAP     FTSQ        CONTINUE
            RETU*   FT20
    FT30    ENTR                INVERSE FOURIER TRANSFORM
            CALL    SMFT        SET MAX VALUE AT 13 BITS
            INCR    01
            STA     TEMP+2
            TZA
            STA     TEMP+4
            STA     TEMP+3
            LDA     TABL
            STA     TEMP
            LDA     TEMP+2
            CPA
            IAR
```

```
        STA     TEMP+1       NUMBER OF CALC/GROUP
FT31    LDA     TEMP         ADR OF 1ST ENTRY
        TAX
        LDB     0,1          LOAD FIRST ENTRY
        STB     TEMP+5       STORE FIRST ENTRY
        ADD     TEMP+2
        TAX                  ADR OF 2ND OR 3RD ENTRY
        LDB     0,1
        STB     TEMP+6       STORE AS SECODN ENTRH
        TXA
        ADD     TEMP+2
        TAX                  ADR OF 3RD ENTRY
        LDB     0,1
        STB     TEMP+7       STORE AS THIRD ENRY
        TXA
        ADD     TEMP+2
        TAX                  ADR OF 4TH ENTRY
        LDA     0,1
        STA     TEMP+8       STORE 4TH ENTRY
        LDX     TEMP
        LDA     TEMP+7       COMPLEX ENTRY ONE
        ADD     TEMP+5
        STA     0,1          PLUS CONJUGATE
        TXA
        ADD     TEMP+2       OF ENTRY TWO
        LDB     TEMP+3       RESTORE ENTRY 2 OR 3
        JBZ     *+3
        ADD     TEMP+2
        TAX
        LDA     TEMP+6
        SUB     TEMP+8
        STA     0,1
        LDA     TEMP+5       COMPLEX ENTRY
        SUB     TEMP+7       ONE MINUS CONJUGAYTE
        STA     TEMP+7       OF ENTRY 2
        LDA     TEMP+6
        ADD     TEMP+8
        STA     TEMP+8
*
*       INPUTS LOADED FOR COMPLEX MULTIPLY
*
        LDA     TEMP+3       TWO* GROUP NUMBER
        ASRA    1
        ASLA    1
        ADD     TAB1         FWA OF SIN,COS TABLES
        TAX
        LDA     0,1          LOAD COS, SIN
        LDB     1,1          WEIGHTING FUNCTION
        LDX     TEMP+4
        JXZ     FT32         0=EVEN, 1=ODD
        CPA
        IAR
        CPB
        IBR
        LLRL    16           EXCHANGE A AND B
        LDX     TEMP+3       GROUP NUMBER
        DXR
        JXZ     *+4          IS IT GROUP NUMBERMONE
        JMP     FT32
        LDAI    055202
        COMP    012
        IBR                  FOR INVERSE TRANSFORM
FT32    CPB
        IBR
        CALL    XCMU,TEMP+7
        STA     TEMP+7
        LDA     TEMP
        ADD     TEMP+2
        ADD     TEMP+2
        ADD     TEMP+2
```

```
          TAX
          STB     0,1
          TXA
          SUB     TEMP+2
          LDB     TEMP+3      RESTORE 3RD OR 2ND ENTRY
          JBZ     *+3
          SUB     TEMP+2
          TAX
          LDA     TEMP+7
          STA     0,1
          INR     TEMP+1
          INR     TEMP        ADR OF FIRST ENTRY
          LDA     TEMP+1
          JAZ     *+4
          JMP     FT31
          INCR    01
          ERA     TEMP+4
          STA     TEMP+4
          INR     TEMP+3
          LDA     TEMP
          ADD     TEMP+2
          ADD     TEMP+2
          ADD     TEMP+2
          STA     TEMP        NEXT INITIAL GROUP ADDRESS
          SUB     TABL
          SUB     EX12        END OF TABLE
          JAN     FT31-4      NEXT GROUP OF CALC
*         LEVEL IS COMPLETE, DO NEXT CLAC LEVEL
          CALL    SMFT        SET MAX VALUE TO 13 BITS
          LDA     TEMP+2
          ASLA    1
          ERA     EX11        TEST FOR END OF TRANSFORM
          JAZ*    FT30
          ERA     EX11
          JMP     FT30+4
*
*         SINGLE PRECISION FRACTIONAL COMPLEX MULTIPLY
*         MULTIPLIER IN A AND B REGISTER
*         MULTIPLICAND IN ADDRESS IN CALL
*         PRODUCT IN A AND B REGISTERS
*
*         COPYRIGHT - VARIAN ASSOCIATES - 1970
XCMA      STX     XCMU+3      SAVE X REGISTER
          ROF
          LDX     XCMU
          LDX     0,1
          STA     XCMU+4      REAL MULTIPLIER
          STB     XCMU+5      IMAGINARY MULTIPLIER
          LDA     0,1
          STA     XCMU+6      REAL MULTIPLICAND
          LDA     1,1
          STA     XCMU+7      IMAGINARY MULTIPLICAND
          MUL     XCMU+6
          STA     XCMU+8
          LDB     XCMU+4      RE(MULT)
          MUL     XCMU+7      RE(MULT)*IM(MULC)
          ADD     XCMU+8      IM(MULT)*RE(MULT)
          LDB     XCMU+5      IM(MULT)
          STA     XCMU+5      IMAGINARY PRODUCT
          MUL     XCMU+7      IM(MULT)*IM(MULC)
          STA     XCMU+8
          LDB     XCMU+6      RE(MULC)
          MUL     XCMU+4      RE(MULC)*RE(MULC)
          SUB     XCMU+8
          LDB     XCMU+5      IMAGINARY PRODUCT
          LDX     XCMU+3      RESTORE X REGISTER
          INR     XCMU
          JMP     0
XCMU      EQU     *-1
          JMP     XCMA
          BSS     1           X REGISTER
          BSS     1           REAL MULTIPLIER
```

```
             BSS     1              IMAGINARY MULTIPLIER
             BSS     1              REAL MULTIPLICAND
             BSS     1              IMAGINARY MULTIPLICAND
             BSS     1              TEMPORARY STORAGE
     RAND    ENTR                   RANDOMIZE PHASES OF PATTERN TABLE
             LDAI    0200
             STA     RNLD
             LDX     TABL           DATA TABLE POINTER
             IXR                    DONT CHANGE SPECIAL CASE
             IXR
             CALL    RNUM           GET RANDOM PHASE
             TAB
             MUL     PIEE
             LDB     LOG
             JBZ     *+4            SET DIRECTION OF CORRECTION
             CPA
             IAR
             STA     *+5
             CALL    XCOS           COMPUTE COSINE
             STA     CPHA
             LDAI    0
             CALL    XSIN           COMPUTE SINE
             STA     CPHA+1
             LDA     0,1
             LDB     1,1
             CALL    XCMU,CPHA      DO COMPLEX MULTIPLY
             STA     0,1            RESTORE NEW PHASED VALUES
             STB     1,1
             TXA                    CHECK FOR END OF TABLE
             SUB     TABL
             SUB     EX12
             IAR
             IAR
             JAN     RAND+5
             JMP*    RAND
     CPHA    DATA    0,0
     RNUM    ENTR
             LDA     RNLD           OLD NUMBER
             ANA     RNMB           GET BIT 7
             ASRA    7              SHIFT 7 TO 0
             ERA     RNLD           FORM NEW RANDOM NUMBER
             LRLA    15             SHIFT ONE PLACE RIGHT
             STA     RNLD           SAVE NEW NUMBER
             RETU*   RNUM           RETURN
     RNMB    DATA    0200
     RNLD    DATA    0307
     SDAT    DATA    020000
     SPAT    DATA    024000
     PHCT    DATA    0
             ORG     02133
             JSS3    QSE            DO QSE EXCITATION IF SS3 IS SET
             CALL    PUL2           DO SINGLE PULSE AND NORMAL FID ACQ OTHERWISE
             ORG     02022
             CALL    PUL1           REPLACE PULSE 1 WITH QSEX SEQUENCE
             NOP
             NOP
             ORG     0153
     EX08    DATA    128
     EX09    DATA    256
     EX10    DATA    512
     EX11    DATA    1024
     EX12    DATA    2048
     EX14    DATA    010000
     THOU    DATA    1000
     TWOK    DATA    02000,02001
     FORK    DATA    04000
             ORG     0244
     TAB2    DATA    031400
             ORG     06676
             DATA    RAND
             DATA    07041
```

```
         ORG    06571
         DATA   'PC'
         ORG    06712
         DATA   FTR1,07041
         ORG    06577
         DATA   'FS'
         ORG    01573
         DATA   PHAV
         ORG    0242
FIAD     DATA   014000
         END
```

What is claimed is:

1. A method of obtaining a RF resonance spectra of a sample of matter comprising the steps of irradiating said sample of matter with RF excitation to excite resonance of a spectrum of resonance line simultaneously within the sample, detecting said excited resonance lines and reading out said detected lines, wherein said irradiation step includes irradiating the sample with a spectrum of RF radiation of nonuniform spectral power density in or near the frequency region of the resonance line spectrum to be excited.

2. A method of obtaining a NMR resonance spectrum of a sample of matter comprising the steps of: irradiating said sample of matter with a spectrum of RF radiation of nonuniform spectral power density in or near the frequency region of the resonance line spectrum to be excited to excite resonance of a spectrum of resonance line simultaneously within the sample; detecting said excited resonance lines and reading out said detected lines; said irradiating step including selecting a desired frequency domain spectra; selecting phases for each frequency in said spectra; and shaping said RF excitation responsive to the linear transform in the time domain of said selected phase scrambled frequency domain spectra.

3. In the method of claim 2, wherein selecting a desired frequency domain spectra includes detecting a physical representation of said desired irradiation spectrum, and converting said detected representation into the form for transformation thereof.

4. A method of operating a radio frequency spectrometer including the steps of:
generating a band of radio frequency energy to be applied to a sample of matter to be analyzed, such band of energy having sufficient bandwidth to cover the spectral lines of the sample to be analyzed, for exciting radio frequency resonance simultaneously of different resonance spectral lines within the sample;
detecting the excited resonance of the sample to obtain a composite resonance signal therefrom for analysis of the sample;
storing a multiplicity of successive time displaced components of the composite resonance signal in a multiplicity of respective channels;
reading out the signal components stored in such channels;
generating said band of radio frequency energy to be applied to the sample by means of modulating a radio frequency carrier signal to produce radio frequency sideband energy for exciting resonance of the sample;
generating a modulation output for modulating the said RF carrier frequency energy in response thereto by synthesizing a time domain signal whose Fourier components have amplitudes and displacements as preselected in the frequency domain and corresponding to a nonuniform spectral power density in or near the frequency region of the resonance line spectrum to be excited.

5. The method of claim 4 wherein the step of generating the modulation output includes the steps of, programming a digital computer with a Fourier transform program for transforming a desired frequency spectrum of sideband energy into a corresponding time variable function in the time domain, such time variable function serving as said modulation output to be employed for modulating the carrier to generate the sideband energy.

6. The method of claim 5 wherein the step of reading out the signal components stored in said storage channels includes the step of, programming said digital computer to read out the signal stored in said respective channels, and to treat such read out signal data with a second Fourier transform program to Fourier transform the read out outputs in the time domain into corresponding Fourier transform outputs in the frequency domain, and displaying said frequency domain outputs to obtain a display of the radio frequency resonance spectrum of the sample under analysis.

7. The method of claim 5 wherein the step of modulating the carrier comprises the step of pulse width modulating the carrier with the pulse width being determined by the modulation output derived from the digital computer.

8. The method of claim 5 wherein the step of modulating the carrier to generate the sideband energy for exciting the sample includes the step of, pulse height modulating the carrier energy with pulses of a height variable in accordance with said modulation output derived from said digital computer.

9. The method of claim 5 wherein the step of programming the digital computer to generate the modulation output includes the step of, introducing into the desired radio frequency spectrum of sideband resonance exciting energy a pseudorandom phase shift component such that the corresponding Fourier transform time variable function in the time domain serving as said modulation output scrambles the phases of the sideband energy of the modulated radio frequency carrier energy employed to excite resonance of the sample.

10. The method of claim 9 including the step of, subtracting the pseudorandom phase shift components from the signal components read out of the storage channels to unscramble the phases of the detected resonance signals.

11. The method of claim 9 wherein the step of reading out the signals stored in the respective storage channels includes the step of, treating the data read out of the respective storage channels with a second Fourier transform program for transforming the spectral data in the time domain into corresponding Fourier transform outputs in the frequency domain, and subtracting the pseudorandom phase shift components from the Fourier transform outputs in the frequency domain to unscramble the phases of the read-out resonance signals, and displaying the unscrambled frequency domain output to obtain a display of the radio frequency resonance spectrum of the sample under analysis.

12. The method of claim 5 wherein the step of programming the digital computer to generate said modulation output includes the step of, programming the digital computer to generate a modulation output which is a complex function of time having both real and imaginary parts, whereby the sideband resonance exciting spectrum is controllable on both sides of carrier frequency separately.

13. The method of claim 5 wherein the step of programming the digital computer to generate said modulation output includes the step of, programming the digital computer to generate the modulation output which when applied to modulate the carrier signal produces a sequence of sideband resonance exciting spectra of different types, each type of said exciting spectra exciting only a selected portion of the expected resonance spectrum of the sample under analysis.

14. A NMR spectrometer having RF excitation means for irradiating a sample of matter to be analyzed with RF excitation for exciting a spectrum of RF resonance lines within the sample simultaneously, means for detecting said excited resonance and means for reading out the resonance line spectrum of said sample, said RF excitation means for irradiating including a broadband RF transmitter, a linear transformation synthesizer and a selection means for establishing a desired irradiation spectrum of nonuniform spectral power density in or near the frequency region of the resonance line spectrum to be excited, said synthesizer being coupled to said selection means for transforming said spectrum of nonuniform spectral power density into the time domain, said broadband transmitter being responsive to the time domain output of said synthesizer.

15. In a spectrometer of claim 14, wherein said selection means comprises a teletype terminal.

16. In a spectrometer of claim 14 wherein said selection means comprises a bank of switches.

17. In a spectrometer of claim 14, wherein said selection means comprises means for converting a physical representation of said desired irradiation spectrum into the form for transformation by said synthesizer.

18. In a radio frequency spectrometer:
means for generating a band of radio frequency energy to be applied to a sample of matter to be analyzed, such band of energy having sufficient bandwidth to cover the spectral lines of the sample to be analyzed for exciting radio frequency resonance simultaneously of different resonance spectral lines within the sample;
means for detecting the excited resonance of the sample to obtain a composite resonant signal therefrom for analysis of the sample;
means for storing a multiplicity of successive time displaced components of the composite resonance signal in a multiplicity of respective channels;
means for reading out the signal components stored in such channels;
said means for generating said band of radio frequency energy to be applied to the sample including, means for supplying radio frequency carrier energy, means for modulating said radio frequency carrier energy to produce radio frequency sideband energy for exciting resonance of the sample, digital computer means, means for storing in said digital computer a table of values representative of the coefficients of the frequencies of the desired radio frequency energy to be applied to the sample, program means for sequencing said digital computer means to generate a modulation output responsive to said table of values which is a function of time such that when said modulation output is employed to modulate said radio frequency carrier signal the resultant sidebands of said modulated carrier will have Fourier frequency components forming said band of radio frequency energy to be applied to the sample for exciting resonance thereof and said sideband being of nonuniform spectral power density in or near the frequency region of the resonance line spectrum to be excited, and means for applying said modulation output to said modulation means for modulating said radio frequency carrier energy to produce the sideband radio frequency energy for exciting resonance of the sample under analysis.

19. The apparatus of claim 18 wherein said programming means includes a Fourier transform program for transforming a desired frequency spectrum of sideband energy for exciting resonance of the sample into a corresponding time variable function in the time domain serving as said modulation output.

20. The apparatus of claim 19 wherein said readout means includes a second Fourier transform program means for programming said digital computer means to read out the signals stored in said respective channels in the time domain into corresponding frequency transformed outputs in the frequency domain, and means for displaying said frequency domain outputs to obtain a display of the radio frequency resonance spectrum of the sample under analysis.

21. The apparatus of claim 18 wherein said modulation means comprises a pulse width modulator for modulating said radio frequency carrier energy with pulses of a width variable in accordance with said modulation output derived from said digital computer means.

22. The apparatus of claim 18 wherein said modulator means comprises a pulse height modulator for modulating said radio frequency carrier energy with pulses of a height variable in accordance with said modulation output derived from said digital computer means.

23. The apparatus of claim 18 wherein said program means for sequencing said digital computer means to generate said modulation output includes, means for introducing into the desired radio frequency spectrum of sideband resonance exciting energy a pseudorandom phase shift component such that the corresponding Fourier transformed time variable function in the time domain, serving as said modulation output, scrambles the phases of the sideband energy of the modulated radio frequency carrier energy.

24. The apparatus of claim 23 including means for subtracting the respective pseudorandom phase shift components from the signal components as read out of said storage channels.

25. The apparatus of claim 23 wherein said readout means includes a second Fourier transform program means for sequencing said digital computer means to read out the signals stored in said respective channels in the time domain into corresponding Fourier transformed outputs in the frequency domain, means for subtracting the pseudorandom phase shift components from the Fourier transform outputs in the frequency domain to unscramble the phases thereof, and means for displaying said unscrambled frequency domain outputs to obtain a display of the radio frequency resonance spectrum of the sample under analysis.

26. The apparatus of claim 18 wherein said program means programs said computer means to generate said modulation output as a complex function of time having both real and imaginary parts, whereby the sideband resonance exciting spectrum is controllable on both sides of the carrier frequency separately.

* * * * *

UNITED STATES PATENT AND TRADEMARK OFFICE
CERTIFICATE OF CORRECTION

PATENT NO. : 4,034,191
DATED : July 5, 1977
INVENTOR(S) : Barrett L. Tomlinson and Howard D. W. Hill It is certified that error appears in the above–identified patent and that said Letters Patent are hereby corrected as shown below:

Column 4, line 48, "to" should be -- of -- ; Column 5, the remaining entries under the headings in Tables I and III should read:

| | | |
|---|---|---|
| 2046 | $A_{1023} \cos(f_{1023})$ | $A_{1023} \cos(f_{1023} + \phi_{1023})$ |
| 2047 | $A_{1023} \sin(f_{1023})$ | $A_{1023} \sin(f_{1023} + \phi_{1023})$ -- |

Column 7, line 60, "pieces" should be -- phases -- ; Column 8, line 32, "of" should be inserted before -- N+1 -- ; Column 10, line 7, "46" should be -- 45 -- ;

Signed and Sealed this

Twenty-fifth Day of September 1979

[SEAL]

Attest:

Attesting Officer

LUTRELLE F. PARKER
Acting Commissioner of Patents and Trademarks